US012593561B2

(12) United States Patent
Mei et al.

(10) Patent No.: US 12,593,561 B2
(45) Date of Patent: Mar. 31, 2026

(54) LIGHT-EMITTING SUBSTRATE AND MANUFACTURING METHOD THEREOF, AND LIGHT-EMITTING APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Wenhai Mei, Beijing (CN); Jingwen Feng, Beijing (CN)

(73) Assignees: BEIJING BOE TECHNOLOGY DEVELOPMENT CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 581 days.

(21) Appl. No.: 17/913,474

(22) PCT Filed: Sep. 14, 2021

(86) PCT No.: PCT/CN2021/118275

§ 371 (c)(1),
(2) Date: Sep. 22, 2022

(87) PCT Pub. No.: WO2023/039719

PCT Pub. Date: Mar. 23, 2023

(65) Prior Publication Data

US 2024/0237380 A1 Jul. 11, 2024

(51) Int. Cl.
*H10K 50/115* (2023.01)
*H10K 59/35* (2023.01)
(Continued)

(52) U.S. Cl.
CPC ........... *H10K 50/115* (2023.02); *H10K 59/35* (2023.02); *H10K 71/231* (2023.02); *H10K 85/111* (2023.02); *H10K 50/16* (2023.02)

(58) Field of Classification Search
CPC ...... H10K 50/115; H10K 50/16; H10K 50/13; H10K 50/15; H10K 50/18; H10K 50/19;
(Continued)

(56) References Cited

U.S. PATENT DOCUMENTS

2007/0046185 A1 3/2007 Kim
2009/0026929 A1 1/2009 Song et al.
(Continued)

FOREIGN PATENT DOCUMENTS

CN 110335953 A 10/2019
CN 111509145 A 8/2020
(Continued)

OTHER PUBLICATIONS

Extended European Search Report for corresponding EP Application No. 21957010.8, dated Jul. 9, 2024, 9 pages.

*Primary Examiner* — Steven B Gauthier
*Assistant Examiner* — Rhys Poniente Sheker
(74) *Attorney, Agent, or Firm* — Dority & Manning, P.A.

(57) ABSTRACT

A light-emitting substrate includes a plurality of light-emitting devices including at least one first light-emitting device and at least one second light-emitting device. A first light-emitting device in the at least one first light-emitting device includes a first color light-emitting layer. A second light-emitting device in the at least one second light-emitting device includes another first color light-emitting layer, and a first material layer and a second color light-emitting layer that are sequentially stacked on the another first color light-emitting layer. The first material layer is configured to transport holes transported from the first color light-emitting layer to the second color light-emitting layer, and to block electrons transported from the second color light-emitting layer; or the first material layer is configured to transport electrons transported from the first color light-emitting layer to the second color light-emitting layer, and to block holes transported from the second color light-emitting layer.

18 Claims, 17 Drawing Sheets

(51) Int. Cl.

| | |
|---|---|
| ***H10K 71/20*** | (2023.01) |
| ***H10K 85/10*** | (2023.01) |
| *H10K 50/16* | (2023.01) |

(58) Field of Classification Search

CPC .. H10K 50/11; H10K 50/00–88; H10K 59/35; H10K 59/10–221; H10K 71/231; H10K 71/40; H10K 71/00

See application file for complete search history.

(56) References Cited

U.S. PATENT DOCUMENTS

| | | | | |
|---|---|---|---|---|
| 2013/0187132 | A1* | 7/2013 | Ando | H10K 59/876 101/35 |
| 2014/0054556 | A1* | 2/2014 | Park | H10K 50/156 257/40 |
| 2015/0090977 | A1* | 4/2015 | Imai | H10K 50/13 438/35 |
| 2015/0108456 | A1 | 4/2015 | Shin et al. | |
| 2018/0083226 | A1* | 3/2018 | Ichikawa | H10K 50/852 |
| 2018/0138435 | A1 | 5/2018 | Kim et al. | |
| 2019/0372060 | A1 | 12/2019 | Li et al. | |
| 2021/0066629 | A1* | 3/2021 | Li | H10K 50/115 |
| 2021/0351244 | A1* | 11/2021 | Asaoka | H10K 50/13 |

FOREIGN PATENT DOCUMENTS

| | | | |
|---|---|---|---|
| CN | 112952014 | A | 6/2021 |
| CN | 113066936 | A | 7/2021 |
| WO | WO2020059143 | A1 | 3/2020 |

* cited by examiner

LIGHT-EMITTING SUBSTRATE AND MANUFACTURING METHOD THEREOF, AND LIGHT-EMITTING APPARATUS

CROSS-REFERENCE TO RELATED APPLICATION

This application is a national phase entry under 35 USC 371 of International Patent Application No. PCT/CN 2021/118275 filed on Sep. 14, 2021, which is incorporated herein by reference in its entirety.

TECHNICAL FIELD

The present disclosure relates to the field of lighting and display technologies, and in particular, to a light-emitting substrate and a manufacturing method thereof, and a light-emitting apparatus.

BACKGROUND

Compared with organic light-emitting diode (OLED) light-emitting devices, quantum dot light-emitting diode (QLED) light-emitting devices have the advantages of higher theoretical luminous efficiency, adjustable color, wider color gamut, better color saturation and vividness, and lower energy costs.

SUMMARY

In an aspect, a light-emitting substrate is provided. The light-emitting substrate includes a substrate and a plurality of light-emitting devices disposed on the substrate. The plurality of light-emitting devices include at least one first light-emitting device and at least one second light-emitting device. A first light-emitting device in the at least one first light-emitting device includes a first color light-emitting layer with a first thickness. A second light-emitting device in the at least one second light-emitting device includes a first color light-emitting layer with a second thickness, and a first material layer and a second color light-emitting layer that are sequentially stacked on the first color light-emitting layer included in the second light-emitting device in a direction away from the substrate. The second thickness is less than the first thickness. In the second light-emitting device, the first material layer is configured to transport holes transported from the first color light-emitting layer to the second color light-emitting layer, and to block electrons transported from the second color light-emitting layer; or the first material layer is configured to transport electrons transported from the first color light-emitting layer to the second color light-emitting layer, and to block holes transported from the second color light-emitting layer.

In some embodiments, in a case where the first material layer is configured to transport the electrons transported from the first color light-emitting layer to the second color light-emitting layer, and to block the holes transported from the second color light-emitting layer, the second light-emitting device further includes an electron transport layer disposed on a side, proximate to the substrate, of the first color light-emitting layer included in the second light-emitting device, and a material of the first material layer includes a material with an electron transport function. Alternatively, in a case where the first material layer is configured to transport the holes transported from the first color light-emitting layer to the second color light-emitting layer, and to block the electrons transported from the second color light-emitting layer, the second light-emitting device further includes a hole transport layer disposed on the side, proximate to the substrate, of the first color light-emitting layer included in the second light-emitting device, and the material of the first material layer includes a material with a hole transport function.

In some embodiments, in a case where the second light-emitting device further includes the electron transport layer, the material of the first material layer is different from a material of the electron transport layer. Alternatively, in a case where the second light-emitting device further includes the hole transport layer, the material of the first material layer is different from a material of the hole transport layer.

In some embodiments, the second color light-emitting layer is disposed only in a region where the second light-emitting device is located. Alternatively, the second color light-emitting layer includes a first portion disposed in the region where the second light-emitting device is located and a second portion disposed in a region where the first light-emitting device is located. The second portion is located on and in contact with the first color light-emitting layer included in the first light-emitting device. The first portion has a third thickness, the second portion has a fourth thickness, and the fourth thickness is less than the third thickness.

In some embodiments, the fourth thickness is less than the second thickness.

In some embodiments, a material of the first color light-emitting layer included in the first light-emitting device, a material of the first color light-emitting layer included in the second light-emitting device, and a material of the second color light-emitting layer each include a quantum dot light-emitting material.

In some embodiments, the plurality of light-emitting devices further include at least one third light-emitting device. A third light-emitting device in the at least one third light-emitting device includes a first color light-emitting layer with a fifth thickness, and a second material layer and a third color light-emitting layer that are sequentially stacked on the first color light-emitting layer included in the third light-emitting device in the direction away from the substrate. The fifth thickness is less than the first thickness. In the third light-emitting device, the second material layer is configured to transport holes transported from the first color light-emitting layer to the third color light-emitting layer, and to block electrons transported from the third color light-emitting layer; or the second material layer is configured to transport electrons transported from the first color light-emitting layer to the third color light-emitting layer, and to block holes transported from the third color light-emitting layer.

In some embodiments, the second material layer and the first material layer are connected into a continuous structure.

In some embodiments, in a case where the second color light-emitting layer includes the first portion, the second color light-emitting layer further includes a third portion disposed in a region where the third light-emitting device is located, and the third portion is located between the second material layer and the third color light-emitting layer.

In some embodiments, the third light-emitting device further includes a third material layer located between the third portion and the third color light-emitting layer. The third material layer is configured to transport holes transported from the third portion to the third color light-emitting layer, and to block the electrons transported from the third color light-emitting layer; or the third material layer is configured to transport electrons transported from the third portion to the third color light-emitting layer, and to block the holes transported from the third color light-emitting layer.

In some embodiments, a material of the second material layer is different from a material of the first material layer.

In some embodiments, the third color light-emitting layer is disposed only in a region where the third light-emitting device is located. Alternatively, the third color light-emitting layer includes a fourth portion disposed in the region where the third light-emitting device is located, a fifth portion disposed in a region where the first light-emitting device is located and a sixth portion disposed in a region where the second light-emitting device is located. The second color light-emitting layer is disposed only in a region where the second light-emitting device is located; the fifth portion is located on and in contact with the first color light-emitting layer included in the first light-emitting device, and the sixth portion is located on and in contact with the second color light-emitting layer; or the second color light-emitting layer includes the first portion and the second portion, the fifth portion is located on and in contact with the second portion, and the sixth portion is located on and in contact with the first portion. The fourth portion has a sixth thickness, the fifth portion and the sixth portion each have a seventh thickness, and the seventh thickness is less than the sixth thickness.

In some embodiments, a material of the third color light-emitting layer includes a quantum dot light-emitting material.

In some embodiments, the first material layer is manufactured by at least one electron transport material under electromagnetic radiation. A general structural formula of the electron transport material is shown in following Formula (I):

(I)

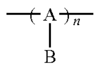

Here, A is selected from any one of trivalent substituted or unsubstituted electron-withdrawing groups, B is selected from groups capable of changing solubility under the electromagnetic radiation, and n is an integer greater than or equal to 1. In A, a substituted substituent is selected from any one of a nitro group, a hydroxyl group and an alkyl group.

Alternatively, the first material layer is manufactured by at least one hole transport material under the electromagnetic radiation. A general structural formula of the hole transport material is shown in following Formula (II):

(II)

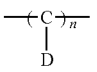

Here, C is selected from any one of trivalent substituted or unsubstituted electron-donating groups, D is selected from groups capable of changing solubility under electromagnetic radiation, and n is an integer greater than or equal to 1. In C, a substituted substituent is selected from any one of a nitro group, a hydroxy group and an alkyl group.

In another aspect, a light-emitting apparatus is provided. The light-emitting apparatus includes the above light-emitting device.

In yet another aspect, a manufacturing method of light-emitting substrate is provided. The manufacturing method includes a following step.

A plurality of light-emitting devices are formed on a substrate. The plurality of light-emitting devices include at least one first light-emitting device and at least one second light-emitting device. A first light-emitting device in the at least one first light-emitting device includes a first color light-emitting layer with a first thickness. A second light-emitting device in the at least one second light-emitting device includes a first color light-emitting layer with a second thickness, and a first material layer and a second color light-emitting layer that are sequentially stacked on the first color light-emitting layer included in the second light-emitting device in a direction away from the substrate. The second thickness is less than the first thickness. In the second light-emitting device, the first material layer is configured to transport holes transported from the first color light-emitting layer to the second color light-emitting layer, and to block electrons transported from the second color light-emitting layer; or the first material layer is configured to transport electrons transported from the first color light-emitting layer to the second color light-emitting layer, and to block holes transported from the second color light-emitting layer.

In some embodiments, forming the plurality of light-emitting devices on the substrate includes: forming the first material layer; and forming the first material layer includes following steps.

A first film is formed on the substrate on which the first color light-emitting layers respectively included in the first light-emitting device and the second light-emitting device are formed. The first film is patterned to form the first material layer in a region where the second light-emitting device is located.

In some embodiments, patterning the first film includes following steps.

Electromagnetic radiation is performed on a portion of the first film located in the region where the second light-emitting device is located, so as to change a solubility of the portion of the first film located in the region where the second light-emitting device is located. A portion of the first film located outside the region where the second light-emitting device is located is dissolved, so as to remove the portion of the first film located outside the region where the second light-emitting device is located.

In some embodiments, the first film is made of an electron transport material. A general structural formula of the electron transport material is shown in following Formula (I):

(I)

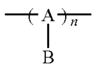

Here, A is selected from any one of trivalent substituted or unsubstituted electron-withdrawing groups, B is selected from groups capable of changing solubility under electromagnetic radiation, and n is an integer greater than or equal to 1. In A, a substituted substituent is selected from any one of a nitro group, a hydroxyl group and an alkyl group Alternatively, the first film is made of a hole transport material. A general structural formula of the hole transport material is shown in following Formula (II):

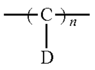

(II)

Here, C is selected from any one of trivalent substituted or unsubstituted electron-donating groups, D is selected from groups capable of changing solubility under the electromagnetic radiation, and n is an integer greater than or equal to 1. In C, a substituted substituent is selected from any one of a nitro group, a hydroxy group and an alkyl group.

In some embodiments, forming the plurality of light-emitting devices on the substrate includes: forming the first color light-emitting layers respectively included in the first light-emitting device and the second light-emitting device; and forming the first color light-emitting layers includes following steps.

A second film is formed on the substrate, the second film including a first quantum dot light-emitting material. Electromagnetic radiation is performed on a portion of the second film located in a region where the first light-emitting device is located, so as to change a solubility of the portion of the second film located in the region where the first light-emitting device is located. A portion of the second film located outside the region where the first light-emitting device is located is dissolved, so as to obtain the first color light-emitting layer with the first thickness included in the first light-emitting device and the first color light-emitting layer with the second thickness included in the second light-emitting device.

In some embodiments, forming the plurality of light-emitting devices on the substrate includes: forming the second color light-emitting layer; and forming the second color light-emitting layer includes following steps.

A third film is formed on the substrate on which the first material layer is formed, the third film including a second quantum dot light-emitting material. Electromagnetic radiation is performed on a portion of the third film located in a region where the second light-emitting device is located, so as to change a solubility of the portion of the third film located in the region where the second light-emitting device is located. A portion of the third film located outside the region where the second light-emitting device is located is dissolved, so that the third film is non-overlapping with a region outside the region where the second light-emitting device is located, or the third film forms a second portion with a thickness of less than 5 nm in the region outside the region where the second light-emitting device is located.

In some embodiments, the plurality of light-emitting devices further includes at least one third light-emitting device. A third light-emitting device in the at least one third light-emitting device includes a first color light-emitting layer with a fifth thickness, and a second material layer and a third color light-emitting layer that are sequentially staked on the first color light-emitting layer included in the third light-emitting device in the direction away from the substrate. Forming the plurality of light-emitting devices on the substrate includes: sequentially forming the second material layer and the third color light-emitting layer on the substrate.

In some embodiments, a material of the second material layer is different from a material of the first material layer. Forming the second material layer on the substrate includes following steps.

A fourth film is formed on the substrate on which the second color light-emitting layer is formed. The fourth film is patterned to form the second material layer in a region where the third light-emitting device is located.

In some embodiments, patterning the fourth film includes following steps.

Electromagnetic radiation is performed on a portion of the fourth film located in the region where the third light-emitting device is located, so as to change a solubility of the portion of the fourth film located in the region where the third light-emitting device is located. A portion of the fourth film located outside the region where the third light-emitting device is located is dissolved, so as to remove the portion of the fourth film located outside the region where the third light-emitting device is located.

In some embodiments, the second material layer and the first material layer are connected into a continuous structure. Forming the second material layer on the substrate includes following steps.

A first film is formed on the substrate on which the first color light-emitting layers respectively included in the first light-emitting device, the second light-emitting device and the third light-emitting device are formed. Electromagnetic radiation is performed on a portion of the first film located in a region where the third light-emitting device is located while performing the electromagnetic radiation on a portion of the first film located in a region where the second light-emitting device is located, so as to change a solubility of the portion of the first film located in the region where the third light-emitting device is located.

In some embodiments, forming the third color light-emitting layer on the substrate includes following steps.

A fifth film is formed on the substrate on which the second material layer is formed, the fifth film including a third quantum dot light-emitting material. Electromagnetic radiation is performed on a portion of the fifth film located in a region where the third light-emitting device is located, so as to change a solubility of the portion of the fifth film located in the region where the third light-emitting device is located. A portion of the fifth film located outside the region where the third light-emitting device is located is dissolved, so that the fifth film is non-overlapping with a region outside the region where the third light-emitting device is located, or the fifth film forms a fifth portion and a sixth portion with a thickness of less than 5 nm in the region outside the region where the third light-emitting device is located.

In some embodiments, in a case where the second color light-emitting layer includes a third portion formed in a region where the third light-emitting device is located, and the third portion is located between the second material layer and the third color light-emitting layer, the third light-emitting device further includes a third material layer disposed between the third portion and the third color light-emitting layer. Forming the plurality of light-emitting devices on the substrate includes a following step.

The third material layer is formed before the third color light-emitting layer is formed.

In some embodiments, forming the third material layer includes following steps.

A sixth film is formed on the substrate on which the second color light-emitting layer is formed. The sixth film is patterned to form the third material layer in the region where the third light-emitting device is located.

In some embodiments, patterning the sixth film includes following steps.

Electromagnetic radiation is performed on a portion of the sixth film located in the region where the third light-emitting device is located, so as to change a solubility of the portion of the sixth film located in the region where the third light-emitting device is located. A portion of the sixth film located outside the region where the third light-emitting device is located is dissolved, so as to remove the portion of the sixth film located outside the region where the third light-emitting device is located.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1A:
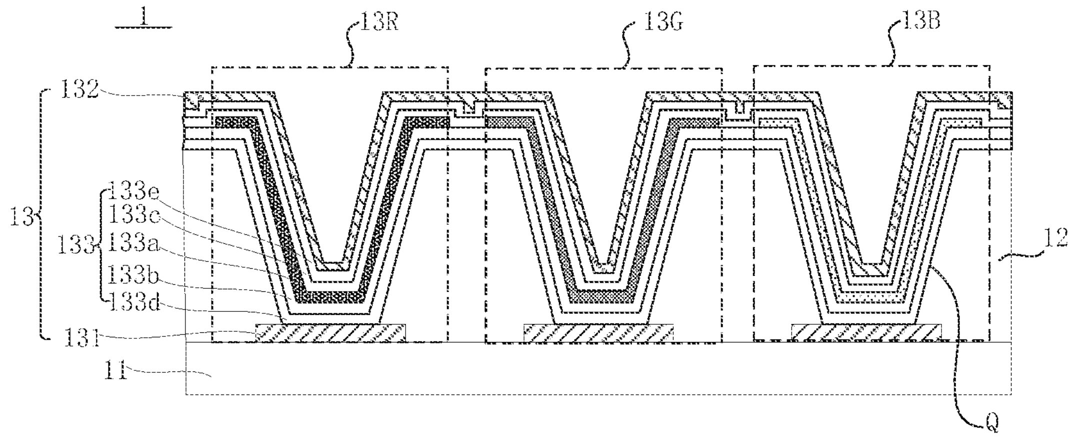
FIG. 1A is a sectional view of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes a light-emitting substrate. Of course, the light-emitting apparatus may further include other components, such as a circuit for providing electrical signals to the light-emitting substrate to drive the light-emitting substrate to emit light. The circuit may be referred to as a control circuit, and may include a circuit board and/or an integrated circuit (IC) electrically connected to the light-emitting substrate.

In some embodiments, the light-emitting apparatus may be a lighting apparatus, and in this case, the light-emitting apparatus serves as a light source to realize a lighting function. For example, the light-emitting apparatus may be a backlight module in a liquid crystal display apparatus, a lamp for internal or external lighting, or a signal lamp.

In some other embodiments, the light-emitting apparatus may be a display apparatus, and in this case, the light-emitting substrate is a display substrate for realizing a function of displaying an image (i.e., screen). The light-emitting apparatus may include a display or a product including a display. The display may be a flat panel display (FPD), or a microdisplay. The display may be a transparent display or an opaque display, depending on whether a user can see a scene behind the display. The display may be a flexible display or a normal display (which may be referred to as a rigid display), depending on whether the display is bendable or rollable. For example, the product including the display may be a computer display, a television, a billboard, a laser printer with a display function, a telephone, a mobile phone, a personal digital assistant (PDA), a laptop computer, a digital camera, a camcorder, a viewfinder, a vehicle, a large area wall, a theater screen, or a stadium sign.

Figure 1B:
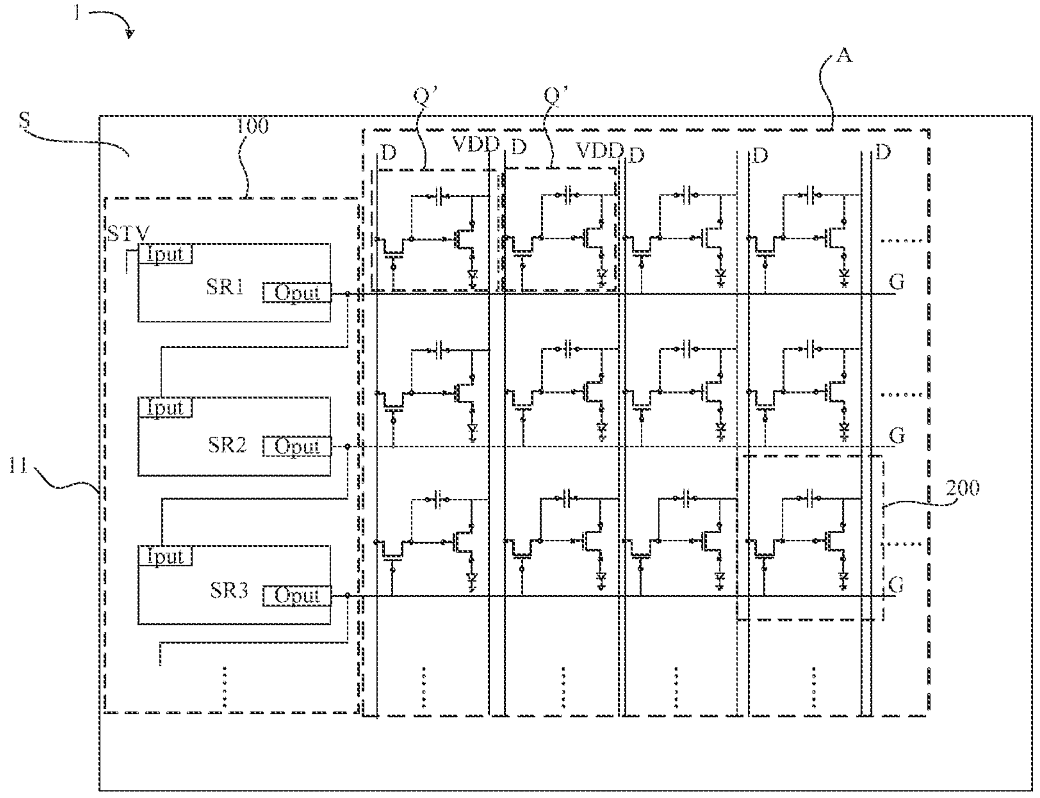
FIG. 1B is a top view of a light-emitting substrate, in accordance with some embodiments.

Some embodiments of the present disclosure provide the light-emitting substrate 1. As shown in FIGS. 1A and 1B, the light-emitting substrate 1 includes a substrate 11, a pixel defining layer 12 disposed on the substrate 11, and a plurality of light-emitting devices 13. The pixel defining layer 12 has a plurality of openings Q, and the plurality of light-emitting devices 13 are arranged in one-to-one correspondence with the plurality of openings Q. Here, the plurality of light-emitting devices 13 may be all or part of the light-emitting devices 13 included in the light-emitting substrate 1, and the plurality of openings Q may be all or part of the openings in the pixel defining layer 12.

Each light-emitting device 13 may include a first electrode 131, a second electrode 132, and a light-emitting functional layer 133 disposed between the first electrode 131 and the second electrode 132. The light-emitting functional layer 133 includes a light-emitting layer 133*a*.

In some embodiments, the first electrode 131 may be an anode, and in this case, the second electrode 132 may be a cathode. In some other embodiments, the first electrode 131 may be a cathode, and in this case, the second electrode 132 may be an anode.

The light-emitting principle of the light-emitting device 13 is as follows. Through a circuit connected by the anode and the cathode, the anode injects holes into the light-emitting functional layer 133, and the cathode injects electrons into the light-emitting functional layer 133. The formed electrons and holes form excitons in the light-emitting layer, and the excitons transition back to a ground state by radiation to emit photons.

As shown in FIG. 1A, in order to improve an efficiency of injecting the electrons and the holes into the light-emitting layer, the light-emitting functional layer 133 may further include at least one of a hole transport layer (HTL) 133*b*, an electron transport layer (ETL) 133*c*, a hole injection layer (HIL) 133*d* and an electron injection layer (EIL) 133*e*. For example, the light-emitting functional layer 133 may include the hole transport layer (HTL) 133*b* disposed between the anode and the light-emitting layer 133*a*, and the electron transport layer (ETL) 133*c* disposed between the cathode and the light-emitting layer 133*a*. In order to further improve the efficiency of injecting the electrons and the holes into the light-emitting layer 133*a*, the light-emitting functional layer 133 may further include the hole injection layer (HIL) 133*d* disposed between the anode and the hole transport layer 133*b*, and the electron injection layer (EIL) 133*e* disposed between the cathode and the electron transport layer 133*c*.

Driving circuits connecting the light-emitting devices 13 may further be provided in the light-emitting substrate 1. The driving circuits may be connected to the control circuit, so as to drive the light-emitting devices 13 to emit light according to the inputted electrical signals by the control circuit. The driving circuits may be active driving circuits or passive driving circuits.

The light-emitting substrate 1 may emit white light, monochromatic light (i.e., light of a single color), or color-adjustable light.

In a first example, the light-emitting substrate 1 may emit white light. In a first case, the plurality of light-emitting devices 13 (e.g., all of the light-emitting devices 13) included in the light-emitting substrate 1 each emit white light. In this case, a material of the light-emitting layer 133*a* in each light-emitting device 13 may include a mixed material of a red light-emitting material, a green light-emitting material and a blue light-emitting material. In this case, each light-emitting device 13 may be drived to emit light, so as to emit white light. In a second case, as shown in FIG. 1A, the plurality of light-emitting devices 13 include light-emitting devices 13R that emit red light, light-emitting devices 13G that emit green light and light-emitting devices 13B that emit blue light. The material of the light-emitting layer 133*a* in the light-emitting device 13R may include a red light-emitting material, the material of the light-emitting layer 133*a* in the light-emitting device 13G may include a green light-emitting material, and the material of the light-emitting layer 133*a* in the light-emitting device 13B may include a blue light-emitting material. In this case, by controlling light-emitting brightnesses of the light-emitting device 13R, the light-emitting device 13G and the light-emitting device 13B, the light-emitting device 13R, the light-emitting device 13G and the light-emitting device 13B may realize light mixing, so that the light-emitting substrate 1 emits white light.

In this example, the light-emitting substrate 1 can be used for lighting, i.e., may be applied to a lighting apparatus.

In a second example, the light-emitting substrate 1 may emit monochromatic light. In a first case, the plurality of light-emitting devices 13 (e.g., all of the light-emitting devices 13) included in the light-emitting substrate 1 each emit monochromatic light (e.g., red light), and in this case, the material of the light-emitting layer in each light-emitting device 13 includes a red light-emitting material. In this case, red light emission may be realized by driving each light-emitting device 13 to emit light. In a second case, the light-emitting substrate 1 has similar structures as the plurality of light-emitting devices in the second case of the first example. In this case, the light-emitting device 13R, the light-emitting device 13G or the light-emitting device 13B may be driven individually to emit monochromatic light.

In this example, the light-emitting substrate 1 may be used for lighting, i.e., may be applied to a lighting apparatus. The light-emitting substrate 1 may also be used for displaying an image or screen of a single color, i.e., may be applied to a display apparatus.

In a third example, the light-emitting substrate 1 may emit color-adjustable light (i.e., colored light), and the light-emitting substrate 1 has similar structures as the plurality of light-emitting devices in the second case of the first example. By controlling the brightnesses of the light-emitting devices 13, the color and brightness of the mixed light emitted from the light-emitting substrate 1 may be controlled to realize colored light emission.

In this example, the light-emitting substrate may be used for displaying an image or screen, i.e., may be applied to a display apparatus. Of course, the light-emitting substrate may also be applied to a lighting apparatus.

In the third example, in an example where the light-emitting substrate 1 is the display substrate, such as a full-color display panel, as shown in FIGS. 1A and 1B, the light-emitting substrate 1 has a display area A and a peripheral area S disposed on a periphery of the display area A. The display area A includes a plurality of sub-pixel regions Q', each sub-pixel area Q' corresponds to an opening Q, and an opening Q corresponds to a light-emitting device 13. Each sub-pixel region Q' is provided with a pixel driving circuit 200 therein for driving a corresponding light-emitting device 13 to emit light. The peripheral area S is used for wiring, such as gate driving circuit(s) 100 connected to pixel driving circuits 200 in the plurality of sub-pixel regions Q'.

Figure 1C:
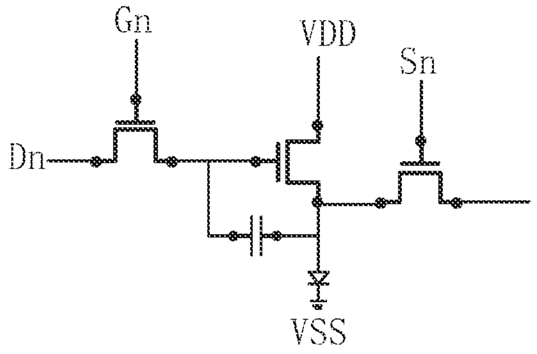
FIG. 1C is an equivalent circuit diagram of 3T1C, in accordance with some embodiments.

Of course, as shown in FIG. 1C, the pixel driving circuit 200 in the light-emitting substrate 1 may have a 3T1C structure.

Figure 2A:
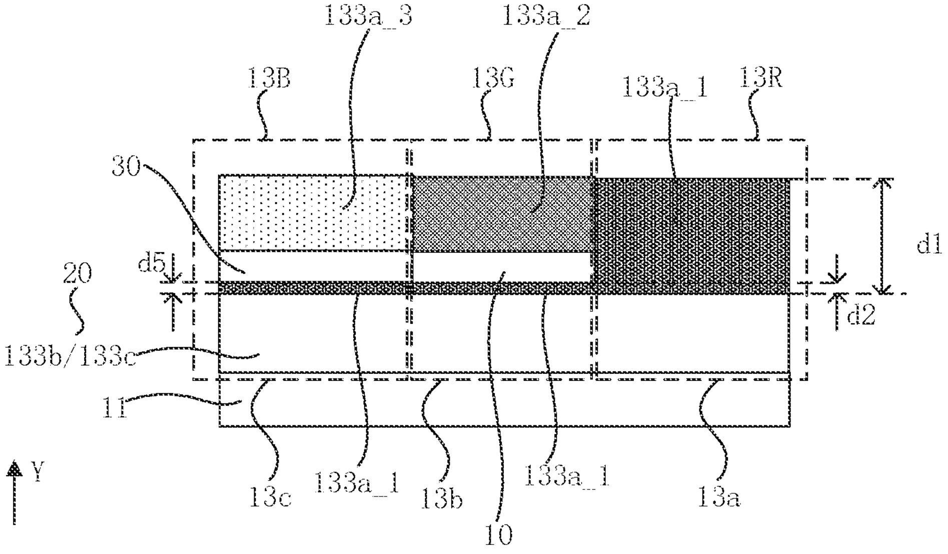
FIG. 2A is a sectional view of another light-emitting substrate, in accordance with some embodiments.

In some embodiments, as shown in FIG. 2A, the plurality of light-emitting devices include at least one first light-emitting device 13*a* and at least one second light-emitting device 13*b*. The at least one first light-emitting device 13*a* may be light-emitting device(s) 13R that emit red light, and the at least one second light-emitting device 13*b* may be light-emitting device(s) 13G that emit green light.

The at least one first light-emitting device 13*a* includes a first color light-emitting layer 133*a*_1 with a first thickness d1. The at least one second light-emitting device 13*b* includes a first color light-emitting layer 133*a*_1 with a second thickness d2, and a first material layer 10 and a second color light-emitting layer 133*a*_2 that are sequentially staked on the first color light-emitting layer 133*a*_1 included in the second light-emitting device 13*b* in a direction Y away from the substrate 11. That is, the first color light-emitting layer 133*a*_1 is made of a red light-emitting material, and the second color light-emitting layer 133*a*_2 is made of a green light-emitting material.

The second thickness d2 is less than the first thickness d1. Moreover, in the second light-emitting device 13*b*, the first material layer 10 is configured to transport holes transported from the first color light-emitting layer 133*a*_1 to the second color light-emitting layer 133*a*_2, and to block electrons transported from the second color light-emitting layer 133*a*_2; or the first material layer 10 is configured to transport electrons transported from the first color light-emitting layer 133*a*_1 to the second color light-emitting layer 133*a*_2, and to block holes transported from the second color light-emitting layer 133*a*_2.

That is, in these embodiments, the thickness of the first color light-emitting layer 133*a*_1 included in the second light-emitting device 13*b* is less than the thickness of the first color light-emitting layer 133*a*_1 included in the first light-emitting device 13*a*. The first material layer 10 may serve as an electron blocking layer or a hole blocking layer.

In some embodiments, as shown in FIG. 2A, the at least one second light-emitting device 13*b* further includes the electron transport layer 133*c* disposed on a side, proximate to the substrate 11, of the first color light-emitting layer 133*a*_1 included in the second light-emitting device 13*b*. A material of the first material layer 10 includes a material with an electron transport function. That is, the light-emitting substrate is an "inverted" light-emitting substrate.

In some other embodiments, as shown in FIG. 2A, the at least one second light-emitting device 13*b* further includes the hole transport layer 133*b* disposed on the side, proximate to the substrate 11, of the first color light-emitting layer 133*a*_1 included in the second light-emitting device 13*b*. The material of the first material layer 10 includes a material with a hole transport function. That is, the light-emitting substrate is an "upright" light-emitting substrate.

The electron transport layer 133*c* or the hole transport layer 133*b* may be a pattern formed in a region where the second light-emitting device is located. Alternatively, the electron transport layers 133*c* or the hole transport layers 133*b* may be arranged as a whole layer.

In addition, the electron transport layer 133*c* or the hole transport layer 133*b* may be in contact with the first color light-emitting layer 133*a*_1 included in the second light-emitting device 13*b*, or spaced apart from the first color light-emitting layer 133*a*_1 included in the second light-emitting device 13*b* by other pattern (e.g., by a hole blocking layer in a case where the second light-emitting device 13*b* includes the electron transport layer 133*c*, or by an electron blocking layer in a case where the second light-emitting device 13*b* includes the hole transport layer 133*b*). Here, in an example where the electron transport layer 133*c* or the hole transport layer 133*b* is in contact with the first color light-emitting layer 133*a*_1 included in the light-emitting device, in the case where the second light-emitting device 13*b* includes the electron transport layer 133*c*, and the electron transport layers 133*c* are arranged as a whole layer, a previous film layer 20 of the first color light-emitting layer 133*a*_1 is the electron transport layer 133*c*; in the case where the second light-emitting device 13*b* includes the hole transport layer 133*b*, and the hole transport layers 133*b* are arranged as a whole layer, the previous film layer 20 of the first color light-emitting layer 133*a*_1 is the hole transport layer 133*b*.

Here, in an example where the first light-emitting device 13*a* and the second light-emitting device 13*b* are quantum dot light-emitting devices, the material of the first color light-emitting layer 133*a*_1 may include a first quantum dot light-emitting material, such as a red quantum dot light-emitting material, and the material of the second color light-emitting layer 133*a*_2 may include a second quantum dot light-emitting material, such as a green quantum dot light-emitting material. When the light-emitting substrate is manufactured, if the quantum dot light-emitting material is patterned by directly exposing and developing the quantum dot light-emitting material, the quantum dot light-emitting material is likely to remain on the previous film layer 20 such as the electron transport layer 133*c* or the hole transport layer 133*b* during the developing process, which may be caused by a difference in properties between the quantum dot light-emitting material and the material of the electron transport layer 133*c* or the hole transport layer 133*b* already formed on the substrate 11.

Of course, only the case that the previous film layer 20 of the quantum dot light-emitting material is the electron transport layer 133*c* or the hole transport layer 133*b* is shown herein, it will be understood by those skilled in the art that the previous film layer 20 of the quantum dot light-emitting material may be the electron injection layer 133*d* or the hole injection layer 133*e*.

Here, in an example where the previous film layer 20 of the quantum dot light-emitting material is the electron transport layer 133*c*, during manufacturing, a plurality of cathodes, the electron injection layers, and the electron transport layers are sequentially formed on the substrate 11 first. The plurality of cathodes may be arranged at intervals, and are each located in an opening. The electron injection layers are arranged as a whole layer, and the electron transport layers are arranged as a whole layer. Next, a liquid film of the red quantum dot light-emitting material is formed on the substrate 11 on which the electron transport layer 133*c* is formed by spin coating. That is, the red quantum dot light-emitting material is dispersed or dissolved in a solvent and then spin-coated on the substrate 11. In this case, the liquid film of the red quantum dot light-emitting material is located on all the electron transport layers. Then, the liquid film of the red quantum dot light-emitting material is patterned. In an example where a solubility of the red quantum dot light-emitting material is changed under an irradiation of ultraviolet light, a portion, located in a region where the first light-emitting device 13*a* is located, of the liquid film of the red quantum dot light-emitting material is irradiated by ultraviolet light, so that the portion, located in the region where first light-emitting device 13*a* is located, of the liquid film of the red quantum dot light-emitting material is undissolved. Thus, a portion, located outside the region where the first light-emitting device 13*a* is located, of the red quantum dot light-emitting material is dissolved. However, in an actual dissolution process, the portion, located outside the region where the first light-emitting device 13*a* is located, of the red quantum dot light-emitting material cannot be completely dissolved, but remains in a region outside the region where the first light-emitting device 13*a* is located.

In some embodiments, as shown in FIG. 2A, the first thickness d1 is in a range of 20 nm to 50 nm, and the second thickness d2 is in a range of 5 nm to 15 nm. That is, FIG. 2A shows that the thickness of the portion, located in the region where the first light-emitting device is located, of the red quantum dot light-emitting material is in the range of 20 nm to 50 nm, and the thickness of the residual red quantum dot light-emitting material is in the range of 5 nm to 15 nm.

In this way, in a case where the first material layer 10 is not disposed, when the green quantum dot light-emitting material included in the second light-emitting device 13*b* is manufactured subsequently, a structure in which the residual red quantum dot light-emitting material and the green quantum dot light-emitting material are stacked is formed in a region where the second light-emitting device 13*b* is located. Therefore, during light emission, a combination region of the electrons and the holes partially falls in a region where the residual red quantum dot light-emitting material is located, so that the residual red quantum dot light-emitting material emits light, which results in color mixing, and thus is not conducive to improving a color purity of the light-emitting device.

The residual red quantum dot light-emitting material emits light mainly by two possible light-emitting mechanisms. A first one is that the electrons and the holes are directly combined to emit light in the residual red quantum dot light-emitting material. A second one is that the electrons and the holes are combined in the green quantum dot light-emitting material, and then the electrons and the holes in the residual red quantum dot light-emitting material are combined to emit light through energy transfer.

Here, the light-emitting device 13 may be classified into an "upright" light-emitting device or an "inverted" light-emitting device according to positions of the anode and cathode of the light-emitting device. For the "upright" light-emitting device, the anode is closer to the substrate 11 than the cathode, and for the "inverted" light-emitting device, the cathode is closer to the substrate 11 than the anode.

In a case where the light-emitting device is the "upright" light-emitting device, there may be two possible distributions of the combination region of the electrons and the holes, depending on whether the electrons and the holes are transported evenly. In a first distribution, the electrons and the holes are transported evenly, and the combination region of the electrons and the holes may fall into the structure in which the residual red quantum dot light-emitting material and the green quantum dot light-emitting material are stacked, so that part of the electrons and the holes are combined to emit light in the residual red quantum dot light-emitting material, and another part of the electrons and the holes are combined to emit light in the green quantum dot light-emitting material. In a second distribution, the electrons and the holes are transported unevenly. In this case, there are two possible cases. In a first case, a transport speed of the electrons is greater than a transport speed of the holes, and the combination region of the electrons and the holes shifts to the residual red quantum dot light-emitting material, so that a large part of the electrons and the holes are combined to emit light in the residual red quantum dot light-emitting material, and a small part of the electrons and the holes are combined to emit light in the green quantum dot light-emitting material. In a second case, the transport speed of the holes is greater than the transport speed of the electrons, and the combination region of the electrons and the holes shifts to the green quantum dot light-emitting material, so that a large part of the electrons and the holes are combined to emit light in the green quantum dot light-emitting material, and a small part of the electrons and the holes are combined to emit light in the residual red quantum dot light-emitting material.

In a case where the light-emitting device is the "inverted" light-emitting device, the distribution of the combination region of the electrons and the holes may be analyzed by referring to a similar analysis process for the "upright" light-emitting device. A difference is that, compared with the "upright" light-emitting device, the electrons in the "inverted" light-emitting device are transported from bottom to top, and the holes are transported from top to bottom. In this case, in the case where the transport speed of the electrons is greater than the transport speed of the holes, the combination region of the electrons and the holes shifts to the green quantum dot light-emitting material, so that a large part of the electrons and the holes are combined to emit light in the green quantum dot light-emitting material, and a small part of the electrons and the holes are combined to emit light in the residual red quantum dot light-emitting material. In the case where the transport speed of the holes is greater than the transport speed of the electrons, the combination region of the electrons and the holes shifts to the residual red quantum dot light-emitting material, so that a large part of the electrons and the holes are combined to emit light in the residual red quantum dot light-emitting material, and a small part of the electrons and the holes are combined to emit light in the green quantum dot light-emitting material.

It can be seen from this that in the case where the first material layer 10 is not disposed in the light-emitting device, whether the light-emitting device is the "upright" light-emitting device or the "inverted" light-emitting device, the holes and the electrons are more or less combined to emit light in the residual red quantum dot light-emitting material, thereby resulting in the color mixing.

In the embodiments of the present disclosure, in the case where the light-emitting device is the "upright" light-emitting device, the first material layer 10 is inserted between the residual red quantum dot light-emitting material and the green quantum dot light-emitting material, and the first material layer 10 may be configured to transport the holes transported from the residual red quantum dot light-emitting material to the green quantum dot light-emitting material, and to block the electrons transported from the green quantum dot light-emitting material. Therefore, on one hand, the first material layer 10 may transport the holes in the second light-emitting device 13*b*, and block the electrons in the second light-emitting device 13*b*, so that the combination region of the holes and the electrons in the second light-emitting device 13*b* may be changed. For example, the combined holes and electrons in the residual red quantum dot light-emitting material are transferred to the green quantum dot light-emitting material for combination, so that the residual red quantum dot light-emitting material may be prevented from emitting light. On another hand, by blocking the electrons in the second light-emitting device 13*b*, the electrons may be limited in the green quantum dot light-emitting material, so that the electrons are prevented from being directly transported to the residual red quantum dot light-emitting material to be combined with the holes for light emission, so as to improve a luminous efficiency of the green quantum dot light-emitting material. In addition, the first material layer 10 is disposed, so that energy transfer between the green quantum dot light-emitting material and the residual red quantum dot light-emitting material is able to be avoided, and thus a luminous probability of the residual red quantum dot light-emitting material is able to be reduced as a whole, thereby reducing poor display caused by the color mixing.

Conversely, in the case where the light-emitting device is the "inverted" light-emitting device, the first material layer 10 is inserted between the residual red quantum dot light-emitting material and the green quantum dot light-emitting material, and the first material layer may be configured to transport the electrons transported from the residual red quantum dot light-emitting material to the green quantum dot light-emitting material, and to block the holes transported from the green quantum dot light-emitting material. Therefore, the electrons and the holes may be limited in the green quantum dot light-emitting material similarly. Compared with the related art in which the electrons and the holes are combined to emit light in the residual red quantum dot light-emitting material, a combination probability of the electrons and the holes in the residual red quantum dot light-emitting material may be reduced, so that a luminous efficiency of the residual red quantum dot light-emitting material may be reduced, and the luminous efficiency of the green quantum dot light-emitting material may be improved, thereby reducing the poor display caused by the color mixing.

In some embodiments, as shown in FIG. 2A, in a case where the at least one second light-emitting device 13*b* further includes the electron transport layer 133*c*, the material of the first material layer 10 is different from the material of the electron transport layer 133*c*. That is, an energy level of the material of the first material layer 10 is different from an energy level of the material of the electron transport layer 133*c*. The material of the first material layer 10 may be selected to obtain the first material layer 10 with a suitable energy level, so that the first material layer 10 may better function to transport the electrons and block the holes.

In some other embodiments, in a case where the at least one second light-emitting device 13*b* further includes the hole transport layer 133*b*, the material of the first material layer 10 is different from the material of the hole transport layer 133*b*. That is, the energy level of the material of the first material layer 10 is different from an energy level of the material of the hole transport layer 133*b*. The material of the first material layer 10 may be selected to obtain the first material layer 10 with a suitable energy level, so that the first material layer 10 may better function to transport the holes and block the electrons.

In some embodiments, the first material layer 10 may be manufactured by at least one electron transport material under electromagnetic radiation. A general structural formula of the electron transport material is shown in following Formula (I):

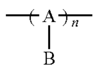

(I)

Here, A is selected from any one of trivalent substituted or unsubstituted electron-withdrawing groups, B is selected from groups capable of changing solubility under electromagnetic radiation, and n is an integer greater than or equal to 1. In A, a substituted substituent is selected from any one of a nitro group, a hydroxyl group and an alkyl group.

That is, in these embodiments, the first material layer 10 serves as a hole blocking layer.

The electron-withdrawing groups are relative to electron-donating groups. In semiconductor materials, for example, quinoline groups, pyrimidine groups, imidazole groups and triazine groups belong to the electron-withdrawing groups, and arylamine groups, carbazole groups and fluorene groups belong to the electron-donating groups. For example, in some embodiments, the electron-withdrawing group is selected from substituted or unsubstituted benzimidazolyl.

B is selected from the groups capable of changing the solubility under the electromagnetic radiation, which means that B may be any group that is capable of undergoing a physical or chemical change under the electromagnetic radiation, so that the solubility of the electron transport material is changed.

The phenomenon that electromagnetic waves are emitted or leaked into the air is referred to as the electromagnetic radiation. Electromagnetic waves are classified into different types according to frequency or wavelength, and include radio waves, microwaves, terahertz radiation, infrared radiation, visible light, ultraviolet light, X-rays, and gamma rays, etc. The electromagnetic radiation herein means that the electron transport material is irradiated by electromagnetic waves (which may be electromagnetic waves of any wavelength band).

In some embodiments, B may be any one of an alkenyl group, an alkynyl group, an acrylate ester group and an epoxy group. That is, B is a group that may undergo a cross-linking reaction under the electromagnetic radiation. In this way, molecules of the electron transport material may be cross-linked into a mesh under the electromagnetic radiation, so that the solubility of the electron transport material may be changed.

Structures of the alkenyl group, the alkynyl group, the epoxy group and the acrylate ester group are shown as follows:

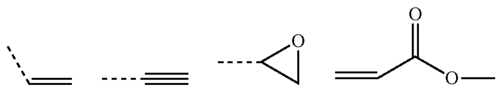

Alkenyl group    Alkynyl group    Epoxy group    Acrylate ester group

The dotted line shown in the structure of the alkenyl group, the alkynyl group, the epoxy group or the acrylate ester group indicates a bond connected to A.

For example, the electron transport material may have a structure shown in following formula:

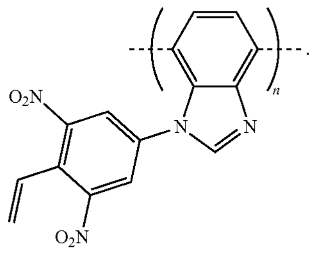

Here, it will be noted that in a case where the first material layer 10 serves as the hole blocking layer, the first material layer 10 not only needs to satisfy the above structural formula, but also needs to satisfy certain energy level requirements, so as to better function to transport the electrons and block the holes.

That is, in some embodiments, energy levels of the first material layer 10, the first color light-emitting layer 133*a*_1 and the second color light-emitting layer 133*a*_2 satisfy that: a difference between a lowest unoccupied molecular orbital (LUMO) energy level of the first material layer 10 and an LUMO energy level of the first color light-emitting layer 133*a*_1, and a difference between an LUMO energy level of the second color light-emitting layer 133*a*_2 and the LUMO energy level of the first material layer 10 are each less than or equal to a first preset threshold value, such as 0.3 eV; and a difference between a highest occupied molecular orbital (HOMO) energy level of the second color light-emitting layer 133*a*_2 and an HOMO energy level of the first material layer 10 is greater than a second preset threshold value, such as 0.3 eV.

In some other embodiments, the first material layer 10 may be manufactured by at least one hole transport material under the electromagnetic radiation. A general structural formula of the hole transport material is shown in following Formula (II):

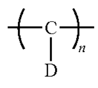

(II)

Here, C is selected from any one of trivalent substituted or unsubstituted electron-donating groups, D is selected from groups capable of changing solubility under the electromagnetic radiation, and n is an integer greater than or equal to 1. In C, a substituted substituent is selected from any one of a nitro group, a hydroxy group and an alkyl group.

That is, in these embodiments, the first material layer 10 serves as an electron blocking layer.

The electron-donating groups may refer to the above description, and will not be repeated here.

In some embodiments, the electron-donating group may be any one of a triphenylamine group, a diphenylamine group, a carbazolyl group and a fluorenyl group that are substituted or unsubstituted.

Similar to the above description, D is selected from the groups capable of changing the solubility under the electromagnetic radiation, which means that D may be any group that is capable of undergoing a physical or chemical change under the electromagnetic radiation, so that the solubility of the hole transport material is changed.

The phenomenon that electromagnetic waves are emitted or leaked into the air is referred to as the electromagnetic radiation. Electromagnetic waves are classified into different types according to frequency or wavelength, and include radio waves, microwaves, terahertz radiation, infrared radiation, visible light, ultraviolet light, X-rays, and gamma rays, etc. The electromagnetic radiation herein means that the hole transport material is irradiated by electromagnetic waves (which may be electromagnetic waves of any wavelength band).

For example, D may be selected from any one of an alkenyl group, an alkynyl group, an acrylate ester group and an epoxy group. That is, D is a group that may undergo a cross-linking reaction under the electromagnetic radiation. In this way, molecules of the hole transport material may be cross-linked into a mesh under the electromagnetic radiation, so that the solubility of the hole transport material may be changed.

Structures of triphenylamine, diphenylamine, carbazole and fluorene are shown as follows:

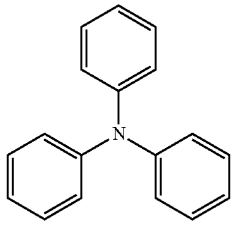

Triphenylamine

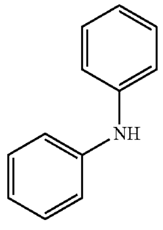

Diphenylamine

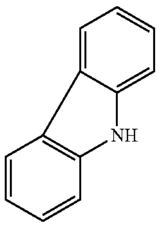

Carbazole

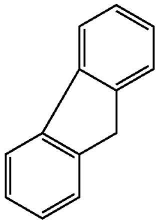

Fluorene

For example, the hole transport material may have a structure shown in a following formula:

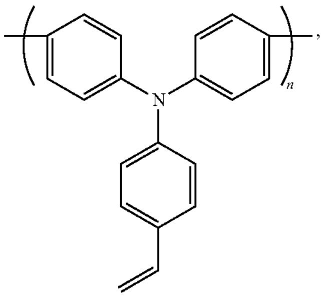

,

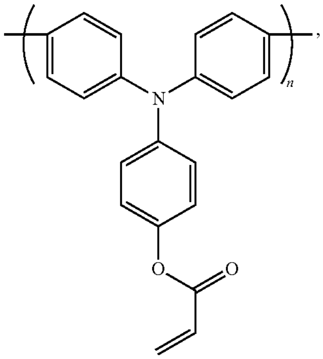

,

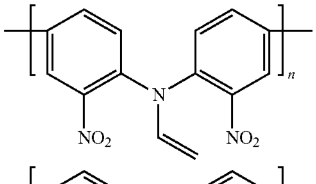

,

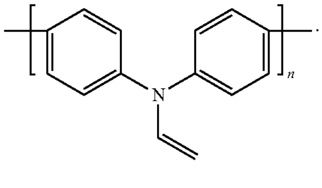

.

Here, it will be noted that in a case where the first material layer 10 serves as the electron blocking layer, in addition to the above conditions, the first material layer 10 may further satisfy certain energy level requirements, so as to better function to transport the holes and block the electrons.

For example, in the case where the first material layer 10 serves as the electron blocking layer, the energy levels of the first material layer 10, the first color light-emitting layer **133*a*_1 and the second color light-emitting layer 133*a*_2 satisfy that: a difference between the HOMO energy level of the first material layer 10 and an HOMO energy level of the first color light-emitting layer 133*a*_1 and the difference between the HOMO energy level of the second color light-emitting layer 133*a*_2 and the HOMO energy level of the first material layer 10 are each less than or equal to a third preset threshold value, such as 0.3 eV; and a difference between the LUMO energy level of the first material layer 10 and the LUMO energy level of the second color light-emitting layer 133*a*_2** is greater than a fourth preset threshold value, such as 0.3 eV.

In addition, it will be noted that in order to fully describe the structural formulae listed above, methods of manufacturing the above structural formulae can be seen in examples shown at the end of the text.

Figure 2B:
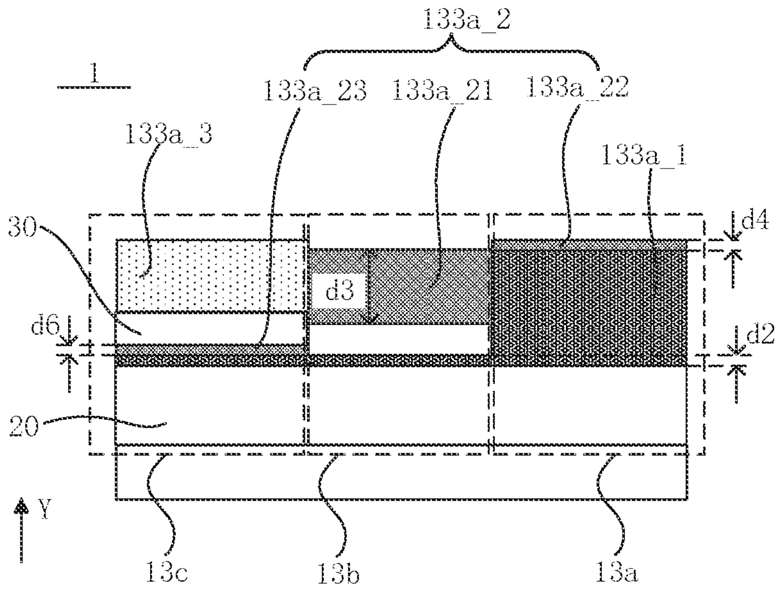
FIG. 2B is a sectional view of yet another light-emitting substrate, in accordance with some embodiments.

In some embodiments, as shown in FIG. 2A, the second color light-emitting layer **133*a*_2 is disposed only in the region where the second light-emitting device 13*b* is located. Alternatively, as shown in FIG. 2B, the second color light-emitting layer 133*a*_2 includes a first portion 133*a*_21 disposed in the region where the second light-emitting device 13*b* is located and a second portion 133*a*_22 disposed in the region where the first light-emitting device 13*a* is located. Moreover, the second portion 133*a*_22 is located on the first color light-emitting layer 133*a*_1 included in the first light-emitting device, and is in contact with the first color light-emitting layer 133*a*_1. The first portion 133*a*_21 has a third thickness d3, the second portion 133*a*_22** has a fourth thickness d4, and the fourth thickness d4 is less than the third thickness d3.

In these embodiments, in a case where the second color light-emitting layer **133*a*_2 is disposed only in the region where the second light-emitting device 13*b* is located, the second color light-emitting layer 133*a*_2 is non-overlapping with the region where the first light-emitting device 13*a* is located, which may be caused by similar properties of the material of the second color light-emitting layer 133*a*_2 and the material of the first color light-emitting layer 133*a*_1. For example, the material of the first color light-emitting layer 133*a*_1 and the material of the second color light-emitting layer 133*a*_2 may each be a quantum dot light-emitting material. During manufacturing, a manufacturing method of the second color light-emitting layer 133*a*_2 is similar to the manufacturing method of the first color light-emitting layer 133*a*_1. A difference is that in a case where a portion of the quantum dot light-emitting material of the second color light-emitting layer 133*a*_2 located in the region where the first light-emitting device 13*a* is located is removed by dissolving, compared with the first color light-emitting layer 133*a*_1, due to similar properties of materials of the second color light-emitting layer 133*a*_2 and a previous film layer (i.e., the first color light-emitting layer 133*a*_1), the portion of the quantum dot light-emitting material of the second color light-emitting layer 133*a*_2 located in the region where the first light-emitting device 13*a* is located may be completely resolved by selecting a suitable solvent, so that the second color light-emitting layer 133*a*_2 is non-overlapping with the region where the first light-emitting device 13*a*** is located.

Similarly, the thickness of the portion (i.e., the second portion **133*a*_22**) of the second color light-emitting layer 133*a*_2 located in the region where the first light-emitting device 13*a* is located may be controlled by selecting a solvent, so that the second portion 133*a*_22 has the fourth thickness d4, and the fourth thickness d4 is less than the third thickness d3. It will be understood by those skilled in the art can that in a case where the second color light-emitting layer 133*a*_2 remains in the region where the first light-emitting device 13*a* is located, in order to prevent the second color light-emitting layer 133*a*_2 from emitting light in the region where the first light-emitting device 13*a* is located, the fourth thickness d4 is a thickness that does not have an influence on the display.

For example, in some embodiments, the fourth thickness d4 is less than the second thickness d2.

As shown in FIG. 2B, the third thickness d3 is in a range of 20 nm to 50 nm, and the fourth thickness d4 is less than 5 nm.

In addition, in the case where the second color light-emitting layer 133*a*_2 is disposed only in the region where the second light-emitting device 13*b* is located, the thickness of the second color light-emitting layer 133*a*_2 may be in a range of 20 nm to 50 nm.

In some embodiments, as shown in FIGS. 2A and 2B, the plurality of light-emitting devices 13 further include at least one third light-emitting device 13*c*. The at least one third light-emitting device 13*c* includes a first color light-emitting layer 133*a*_1 with a fifth thickness d5, and a second material layer 30 and a third color light-emitting layer 133*a*_3 that are sequentially staked on the first color light-emitting layer 133*a*_1 included in the third light-emitting device 13*c* in the direction Y away from the substrate 11. The fifth thickness d5 is less than the first thickness d1. Moreover, the second material layer 30 in the third light-emitting device 13*c* is configured to transport holes transported from the first color light-emitting layer 133*a*_1 to the third color light-emitting layer 133*a*_3, and to block electrons transported from the third color light-emitting layer 133*a*_3; or the second material layer 30 is configured to transport electrons transported from the first color light-emitting layer 133*a*_1 to the third color light-emitting layer 133*a*_3, and to block holes transported from the third color light-emitting layer 133*a*_3.

In these embodiments, in a case where the at least one first light-emitting device 13*a* is a light-emitting device 13R that emits red light, and the at least one second light-emitting device 13*b* is a light-emitting device 13G that emits green light, the at least one third light-emitting device 13*c* may be a light-emitting device 13B that emits blue light, which is only an example here. It will be understood by those skilled in the art that the first light-emitting device 13*a*, the second light-emitting device 13*b* and the third light-emitting device 13*c* may be light-emitting devices that emit light of arbitrary colors. For example, the first light-emitting device 13*a* may be a light-emitting device that emits blue light, the second light-emitting device 13*b* may be a light-emitting device that emits yellow light, and the third light-emitting device 13*c* may be a light-emitting device that emits red light.

In addition, the thickness of the first color light-emitting layer 133*a*_1 included in the third light-emitting device 13*c* is less than the thickness of the first color light-emitting layer 133*a*_1 included in the first light-emitting device 13*a*. The second material layer 30 may serve as an electron blocking layer or a hole blocking layer.

Here, in an example where the first light-emitting device 13*a*, the second light-emitting device 13*b* and the third light-emitting device 13*c* are quantum dot light-emitting devices, the material of the first color light-emitting layer 133*a*_1 may include the first quantum dot light-emitting material, such as the red quantum dot light-emitting material; the material of the second color light-emitting layer 133*a*_2 may include the second quantum dot light-emitting material, such as the green quantum dot light-emitting material; and a material of the third color light-emitting layer 133*a*_3 may include a third quantum dot light-emitting material, such as a blue quantum dot light-emitting material.

That is, in these embodiments, similar to the first material layer 10, the second material layer 30 is inserted between the first color light-emitting layer 133*a*_1 and the third color light-emitting layer 133*a*_3. The second material layer 30 may have the same function as the first material layer 10, which may refer to the description of the first material layer 10 for details, and will not be repeated here.

Figure 2C:
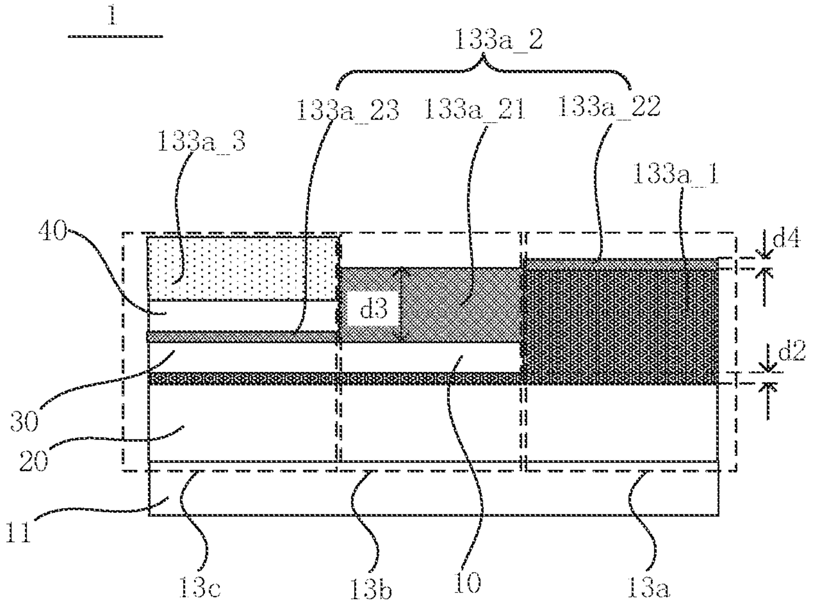
FIG. 2C is a sectional view of yet another light-emitting substrate, in accordance with some embodiments.

In some embodiments, as shown in FIG. 2C, the second material layer 30 and the first material layer 10 are connected into a continuous structure. That is, the second material layer 30 and the first material layer 10 are made of the same material, and are connected into an integral structure. In this case, the first material layer 10 and the second material layer 30 may be formed through one patterning process. That is, before the first color light-emitting layer 133*a*_1 is formed, the first material layer 10 and the second material layer 30 are formed, so that the manufacturing process may be reduced, and the use of a mask may be reduced.

Here, it will be noted that in a case where the first material layer 10 and the second material layer 30 are made of the same material, the first material layer 10 satisfies energy level relationships not only with the first color light-emitting layer 133*a*_1 and the second color light-emitting layer 133*a*_2, but also with the third color light-emitting layer 133*a*_3.

In the case where the first material layer 10 serves as the hole blocking layer, the difference between the LUMO energy level of the first material layer and the LUMO energy level of the first color light-emitting layer and the difference between the LUMO energy level of the second color light-emitting layer and the LUMO energy level of the first material layer are each less than or equal to the first preset threshold value, such as 0.3 eV; the difference between the HOMO energy level of the second color light-emitting layer and the HOMO energy level of the first material layer is greater than the second preset threshold value, such as 0.3 eV; moreover, a difference between an LUMO energy level of the third color light-emitting layer and the LUMO energy level of the first material layer is less than or equal to a fifth preset threshold value, such as 0.3 eV; and a difference between an HOMO energy level of the third color light-emitting layer and the HOMO energy level of the first material layer is greater than a sixth preset threshold value, such as 0.3 eV.

In the case where the first material layer 10 serves as the electron blocking layer, the difference between the HOMO energy level of the first material layer and the HOMO energy level of the first color light-emitting layer and the difference between the HOMO energy level of the second color light-emitting layer and the HOMO energy level of the first material layer are each less than or equal to the third preset threshold value, such as 0.3 eV; the difference between the LUMO energy level of the first material layer and the LUMO energy level of the second color light-emitting layer is greater than the fourth preset threshold value, such as 0.3 eV; moreover, the difference between the HOMO energy level of the third color light-emitting layer and the HOMO energy level of the first material layer is less than or equal to a seventh preset threshold value, such as 0.3 eV; and a difference between the LUMO energy level of the first material layer and the LUMO energy level of the third color light-emitting layer is greater than an eighth preset threshold value, such as 0.3 eV.

In some other embodiments, the first material layer 10 and the second material layer 30 are made of different materials. That is, the first material layer 10 and the second material layer 30 may be formed through different patterning processes.

In this case, the material of the second material layer 30 may include at least one electron transport material, or the material of the second material layer 30 may include at least one hole transport material.

A general structural formula of the electron transport material may be shown in Formula (I), and a general structural formula of the hole transport material may be shown in Formula (II), which may refer to the above descriptions of Formula (I) and Formula (II) for details. Different from the material of the first material layer 10, the material of the second material layer 30 may be obtained by changing the substituent in Formula (I) or Formula (II), so that the energy level of the second material layer 30 is different from the energy level of the first material layer 10.

In some embodiments, as shown in FIG. 2B, in a case where the second color light-emitting layer **133*a*_2 includes the first portion 133*a*_21 and the second portion 133*a*_22, the second color light-emitting layer 133*a*_2 further includes a third portion 133*a*_23 disposed in a region where the third light-emitting device 13*c* is located, and a specific manufacturing method may refer to the manufacturing method of the second color light-emitting layer 133*a*_2. A difference is that the second color light-emitting layer 133*a*_2 remains in the region where the third light-emitting device 13*c* is located in addition to the region where the first light-emitting device 13*a*** is located.

In this case, there are two cases for a position of the third portion **133*a*_23 in the region where the third light-emitting device 13*c* is located. In a first case, as shown in FIG. 2B, the material of the second material layer 30 is different from the material of the first material layer 10. That is, the second material layer 30 may be formed after the second color light-emitting layer 133*a*_2 is formed. In this case, a portion (i.e., the third portion 133*a*_23) of the second color light-emitting layer 133*a*_2 disposed in the region where the third light-emitting device 13*c* is located may be located between the second material layer 30 and the first color light-emitting layer 133*a*_1. In this case, the thickness d6 of the third portion 133*a*_23 is less than the second thickness d2. Similar to the reason why the fourth thickness d4 is less than the second thickness d2, i.e., due to similar properties of the material of the second color light-emitting layer 133*a*_2 and the material of the first color light-emitting layer 133*a*_1, the portion of the second color light-emitting layer 133*a*2 disposed in the region where the third light-emitting device 13*c* is located may be dissolved to only a small residual amount by selecting a suitable solvent, so that the thickness of the third portion 133*a*_23** is less than the second thickness d2.

Figure 2D:
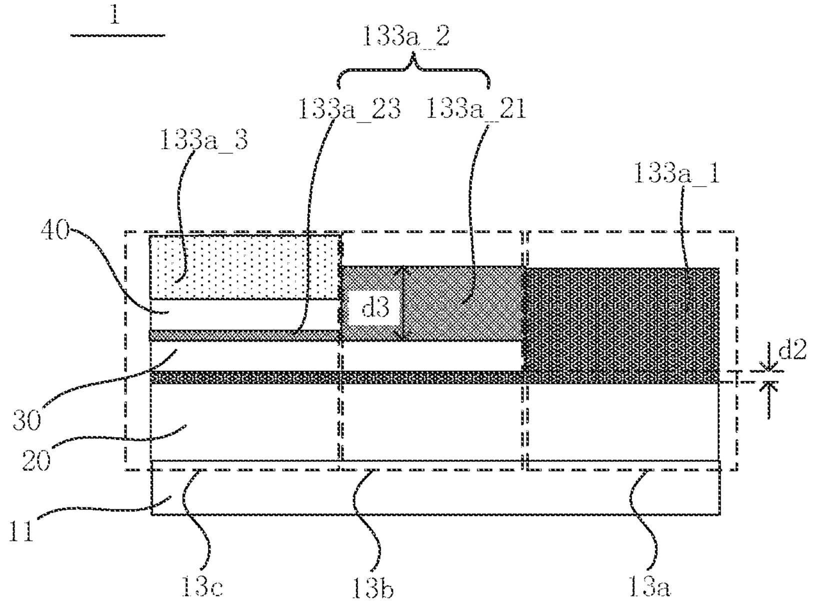
FIG. 2D is a sectional view of yet another light-emitting substrate, in accordance with some embodiments.

In a second case, as shown in FIGS. 2C and 2D, the second material layer 30 and the first material layer 10 are connected into the continuous structure. That is, before the second color light-emitting layer **133*a*_2 is formed, the first material layer 10 and the second material layer 30 are formed through one patterning process. In this case, as shown in FIG. 2C, the portion (i.e., the third portion 133*a*_23) of the second color light-emitting layer 133*a*_2 disposed in the region where the third light-emitting device 13*c* is located is located between the second material layer 30 and the third color light-emitting layer 133*a*_3. In this case, the thickness of the third portion 133*a*_23 may be substantially the same as the thickness (i.e., the second thickness d2) of the first color light-emitting layer 133*a*_1 disposed in the second light-emitting device 13*b*. That is, compared with the case that materials of two adjacent light-emitting layers are quantum dot light-emitting materials, due to a large difference between properties of the material of the second color light-emitting layer 133*a*_2 and the material of the second material layer 30, the second color light-emitting layer 133*a*_2 remains a large amount on the second material layer 30. That is, the thickness of the third portion 133*a*_23 is greater than the thickness of the second portion 133*a*_22**.

Of course, this is the case that the second color light-emitting layer **133*a*_2 remains in the region where the first light-emitting device 13*a* is located. It will be noted that according to the fact that the second color light-emitting layer 133*a*_2 may be non-overlapping with the region where the first light-emitting device 13*a* is located, it can be known that the light-emitting substrate may have a structure shown in FIG. 2D. In this case, the second color light-emitting layer 133*a*_2 includes only the first portion 133*a*_21 disposed in the region where the second light-emitting device 13*b* is located and the third portion 133*a*_23 disposed in the region where the third light-emitting device 13*c*** is located.

In some embodiments, as shown in FIGS. 2C and 2D, in a case where the third portion **133*a*_23 is located between the second material layer 30 and the third color light-emitting layer 133*a*_3, the third light-emitting device 13*c* further includes a third material layer 40. The third material layer 40 is located between the third portion 133*a*_23 and the third color light-emitting layer 133*a*_3. The third material layer 40 is configured to transport holes transported from the third portion 133*a*_23 to the third color light-emitting layer 133*a*_3, and to block the electrons transported from the third color light-emitting layer 133*a*_3; or the third material layer 40 is configured to transport electrons transported from the third portion 133*a*_23 to the third color light-emitting layer 133*a*_3, and to block the holes transported from the third color light-emitting layer 133*a*_3**.

In these embodiments, the third material layer 40 is inserted between the third portion **133*a*_23 and the third color light-emitting layer 133*a*_3, so that the third material layer 40 may also serve as an electron blocking layer or a hole blocking layer. The third material layer 40 may have a similar function as the first material layer 10 and the second material layer 30, which may refer to the description of the first material layer 10** for details, and will not be repeated here.

Figure 2E:
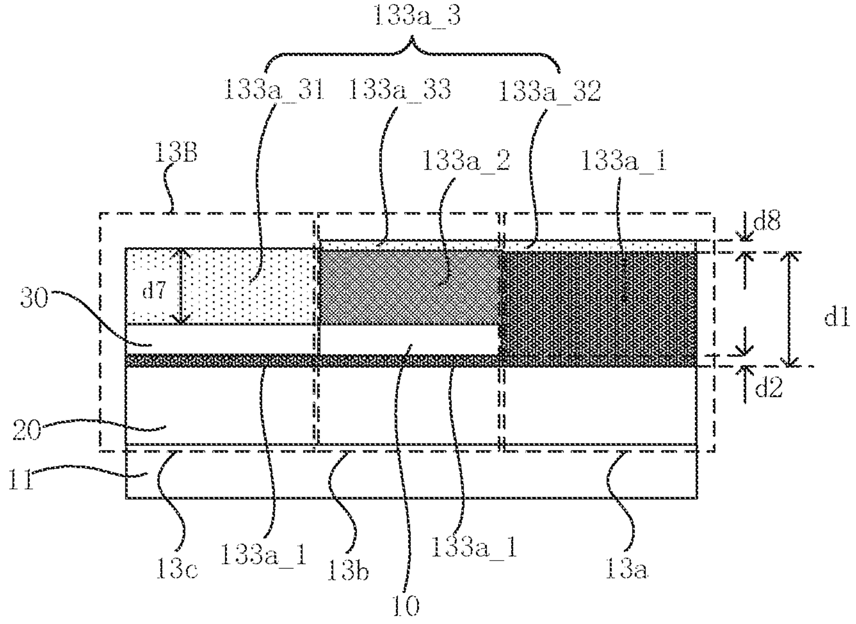
FIG. 2E is a sectional view of yet another light-emitting substrate, in accordance with some embodiments.
Figure 2F:
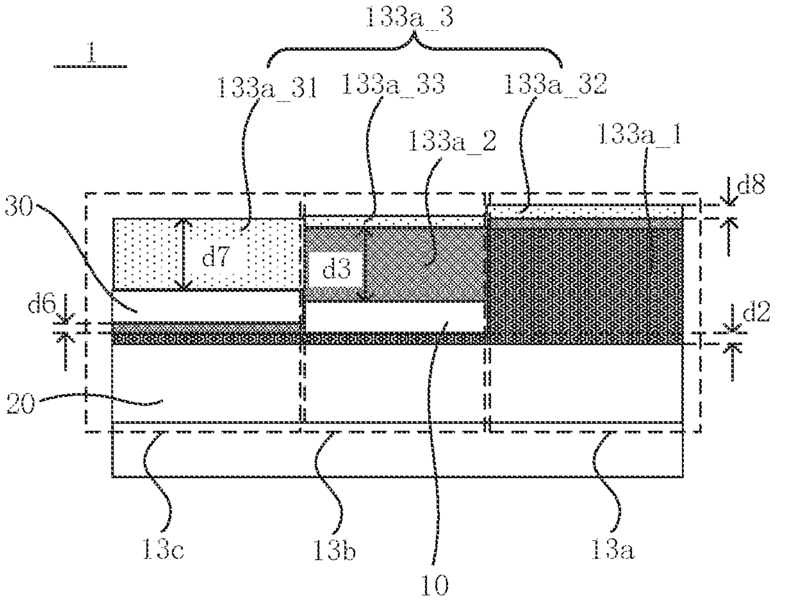
FIG. 2F is a sectional view of yet another light-emitting substrate, in accordance with some embodiments.

In some embodiments, as shown in FIGS. 2A to 2D, the third color light-emitting layer **133*a*_3 is disposed only in the region where the third light-emitting device 13*c* is located. Alternatively, as shown in FIGS. 2E and 2F, the third color light-emitting layer 133*a*_3 includes a fourth portion 133*a*_31 disposed in the region where the third light-emitting device 13*c* is located, a fifth portion 133*a*_32 disposed in the region where the first light-emitting device 13*a* is located, and a sixth portion 133*a*_33 disposed in the region where the second light-emitting device 13*b* is located. In the case where the second color light-emitting layer 133*a*_2 is disposed only in the region where the second light-emitting device 13*b* is located, the fifth portion 133*a*_32 is located on and in contact with the first color light-emitting layer 133*a*_1 included in the first light-emitting device 13*a*, and the sixth portion 133*a*_33** is located on and in contact with the second color light-emitting layer

133*a*_2; or in the case where the second color light-emitting layer 133*a*_2 includes the first portion 133*a*_21 and the second portion 133*a*_22, the fifth portion 133*a*_32 is located on and in contact with the second portion 133*a*_22, and the sixth portion 133*a*_33 is located on and in contact with the first portion 133*a*_21 included in the second light-emitting device 13*b*. The fourth portion 133*a*_31 has a sixth thickness d7, the fifth portion 133*a*_32 and the sixth portion 133*a*_33 each have a seventh thickness d8, and the seventh thickness d8 is less than the sixth thickness d7.

In these embodiments, in a case where the third color light-emitting layer 133*a*_3 is disposed only in the region where the third light-emitting device 13*c* is located, the third color light-emitting layer 133*a*3 is non-overlapping with the region where the first light-emitting device 13*a* is located and the region where the second light-emitting device 13*b* is located, which may be caused by similar properties of the material of the third color light-emitting layer 133*a*_3 and the materials of the first color light-emitting layer 133*a*_1 and the second color light-emitting layer 133*a*_2. For example, the material of the third color light-emitting layer 133*a*_3, the material of the first color light-emitting layer 133*a*_1 and the material of the second color light-emitting layer 133*a*_2 may each be a quantum dot light-emitting material. During manufacturing, solubilities of portions, undergoing the electromagnetic radiation, of respective quantum dot light-emitting materials are equivalent, and solubilities of portions, not undergoing the electromagnetic radiation, of respective quantum dot light-emitting materials are equivalent in a solvent with the same property. In this way, the portion, not undergoing the electromagnetic radiation, of the quantum dot light-emitting material of the third color light-emitting layer 133*a*_3 is dissolved by selecting a suitable solvent, so that the seventh thickness d8 may be controlled, and thus the third color light-emitting layer 133*a*_3 is non-overlapping with the region where the first light-emitting device 13*a* is located and the region where the second light-emitting device 13*b* is located, or has a small amount of residue in the region where the first light-emitting device 13*a* is located and the region where the second light-emitting device 13*b* is located.

It will be understood by those skilled in the art that in a case where the third color light-emitting layer 133*a*_3 remains in the region where the first light-emitting device 13*a* is located and the region where the second light-emitting device 13*b* is located, in order to prevent the third color light-emitting layer 133*a*_3 from emitting light in the region where the first light-emitting device 13*a* is located and the region where the second light-emitting device 13*b* is located, the seventh thickness d8 is a thickness that does not have an influence on the display.

In some examples, as shown in FIGS. 2E and 2F, the sixth thickness d7 is in a range of 20 nm to 50 nm, and the seventh thickness d8 is less than 5 nm.

In summary, the first material layer 10 is disposed between the first color light-emitting layer 133*a*_1 located in the second light-emitting device 13*b* and the second color light-emitting layer 133*a*_2 included in the second light-emitting device 13*b*, and the second material layer 30 is disposed between the first color light-emitting layer 133*a*_1 located in the third light-emitting device 13*c* and the third color light-emitting layer 133*a*_3 included in the third light-emitting device 13*c*, so that a first isolation layer is formed between the residual first color light-emitting layer 133*a*_1 and the second color light-emitting layer 133*a*_2 in the region where the second light-emitting device 13*b* is located, and a second isolation layer is formed between the residual first color light-emitting layer 133*a*_1 and the third color light-emitting layer 133*a*_3 in the region where the third light-emitting device 13*c* is located. The first isolation layer may serve as an electron blocking layer or a hole blocking layer of the second light-emitting device 13*b* to adjust the combination region of the electrons and the holes in the second light-emitting device 13*b*, so that the electrons and the holes are prevented from being combined to emit light in the residual first color light-emitting layer 133*a*_1, and thus the first isolation layer may function to avoid the color mixing. The second isolation layer may also serve as an electron blocking layer or a hole blocking layer of the third light-emitting device 13*c* to adjust the combination region of the electrons and the holes in the third light-emitting device 13*c*, so that the electrons and the holes are prevented from being combined to emit light in the residual first color light-emitting layer 133*a*_1, and thus the second isolation layer may also function to avoid the color mixing. In this way, in a case where the first color light-emitting layer 133*a*_1 is made of the red quantum dot light-emitting material, the second color light-emitting layer 133*a*_2 is made of the green quantum dot light-emitting material, and the third color light-emitting layer 133*a*_3 is made of the blue quantum dot light-emitting material, full-color light emission may be realized while ensuring that each light-emitting device 13 has a high color purity, thereby improving the color gamut.

Figure 3:
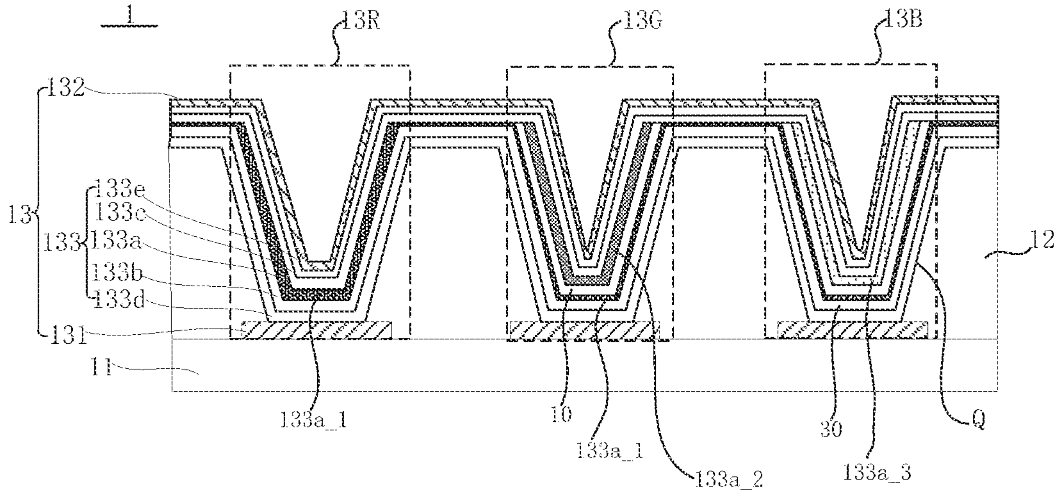
FIG. 3 is a sectional view of yet another light-emitting substrate, in accordance with some embodiments.

It will be noted that only sectional views showing respective arrangement regions of the first color light-emitting layer 133*a*_1, the first material layer 10, the second material layer 30, the second color light-emitting layer 133*a*_2, and the third color light-emitting layer 133*a*_3 are shown in the above. It will be understood by those skilled in the art that in an actual product, the light-emitting substrate further includes the pixel defining layer. Therefore, a sectional view of the actual product may be as shown in FIG. 3. FIG. 3 illustrates only a structure in which the first material layer 10, the second material layer 30, the second color light-emitting layer 133*a*_2 and the third color light-emitting layer 133*a*_3 are formed only in the openings Q. It will be understood by those skilled in the art that as shown in the first color light-emitting layer 133*a*_1, the second color light-emitting layer 133*a*_2 and the third color light-emitting layer 133*a*_3 in FIG. 1A, the first material layer 10, the second material layer 30, the second color light-emitting layer 133*a*_2 and the third color light-emitting layer 133*a*_3 each further include a portion formed outside the opening Q. In this case, a region where the first material layer 10 and the second color light-emitting layer 133*a*_2 are disposed is the region where the second light-emitting device 13*b* is located, and a region where the second material layer 30 and the third color light-emitting layer 133*a*_3 are disposed is the region where the third light-emitting device 13*c* is located.

Some embodiments of the present disclosure provide a manufacturing method of a light-emitting substrate. The manufacturing method of the light-emitting substrate includes a following step.

A plurality of light-emitting devices 13 are formed on a substrate 11. The plurality of light-emitting devices include at least one first light-emitting device 13*a* and at least one second light-emitting device 13*b*. The at least one first light-emitting device 13*a* includes a first color light-emitting layer 133*a*_1 with a first thickness d1. The at least one second light-emitting device 13*b* includes a first color light-emitting layer 133*a*_1 with a second thickness d2, and a first material layer 10 and a second color light-emitting layer

133*a*_2 that are sequentially stacked on the first color light-emitting layer 133*a*_1 included in the second light-emitting device 13*b* in a direction away Y from the substrate 11. The second thickness d2 is less than the first thickness d1. Moreover, in the second light-emitting device 13*b*, the first material layer 10 is configured to transport holes transported from the first color light-emitting layer 133*a*_1 to the second color light-emitting layer 133*a*_2, and to block electrons transported from the second color light-emitting layer 133*a*_2; or the first material layer 10 is configured to transport electrons transported from the first color light-emitting layer 133*a*_1 to the second color light-emitting layer 133*a*_2, and to block holes transported from the second color light-emitting layer 133*a*_2.

The substrate 11 may be a substrate on which pixel driving circuits 200, a pixel defining layer 12, and a plurality of first electrodes 131 are formed.

The first electrode 131 may be an anode or a cathode. In a case where the first electrode 131 is the anode, the first electrode 131 may be made of a transparent oxide semiconductor material, such as ITO, ZnO or other high work function material. In a case where the first electrode 131 is the cathode, the first electrode 131 may be made of a low work function material, such as Al or Ag.

As shown in FIGS. 4A to 4K, forming the plurality of light-emitting devices 13 on the substrate 11 may include S10 to S40.

In S10, hole injection layers 133*d* or electron injection layers 133*e* are formed on the substrate 11 on which the pixel definition layer is formed. The hole injection layers 133*d* or the electron injection layers 133*e* are arranged as a whole layer.

In the case where the first electrode 131 is the anode, the hole injection layers 133*d* are formed on the substrate 11 on which the plurality of first electrodes 131 are formed. In the case where the first electrode 131 is the cathode, the electron injection layers 133*e* are formed on the substrate 11 on which the plurality of first electrodes 131 are formed.

The hole injection layer 133*d* or the electron injection layer 133*e* may be formed by evaporation or spin coating. A material of the hole injection layer 133*d* may include nickel oxide nanoparticles. A material of the electron injection layer 133*e* may include zinc oxide nanoparticles.

In S20, the first color light-emitting layers 133*a*_1 are formed on the substrate 11 on which the hole injection layers 133*d* or the electron injection layers 133*e* are formed.

Figure 4A:
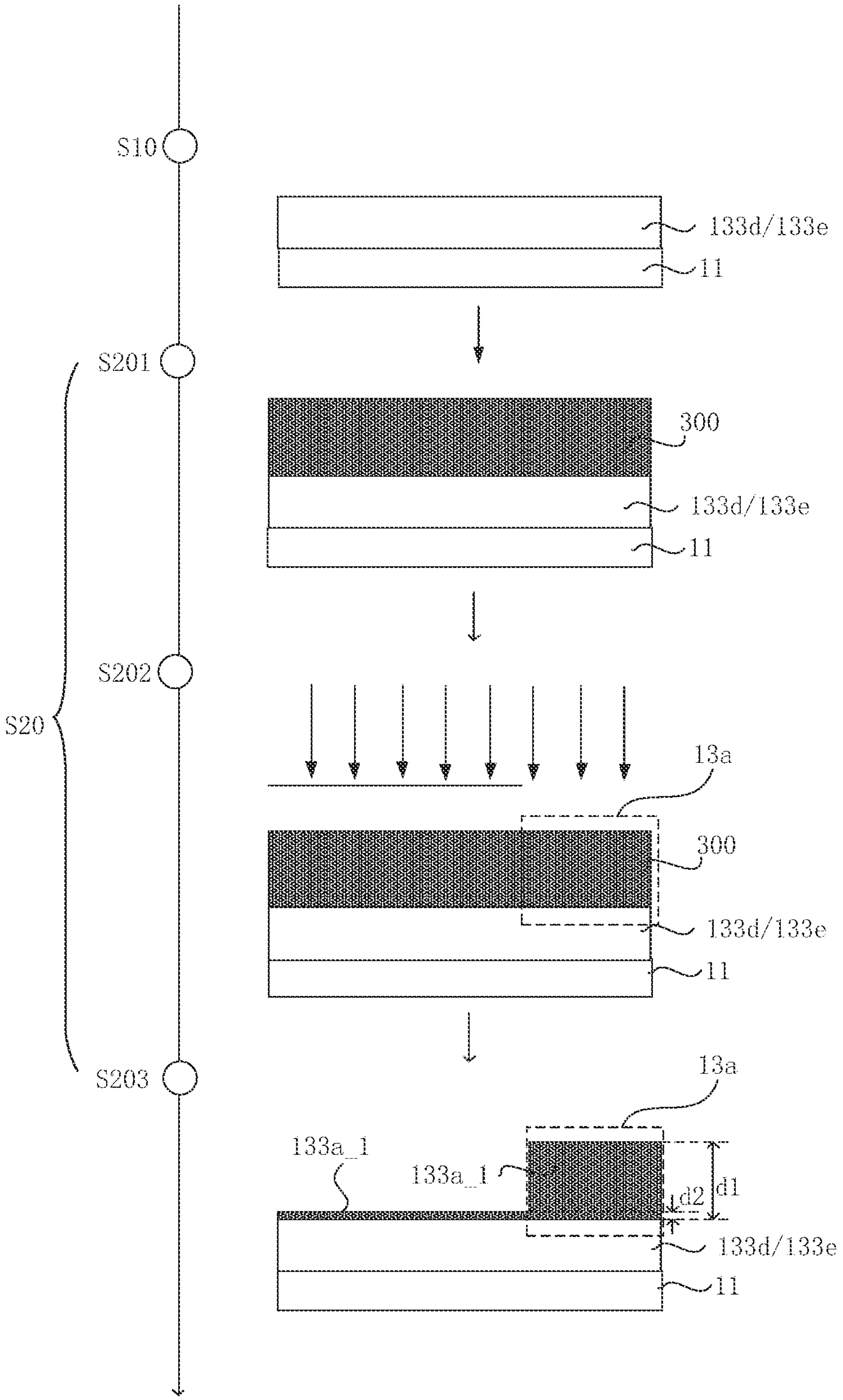
FIG. 4A is a flow diagram of a portion of a manufacturing method of a light-emitting substrate, in accordance with some embodiments.

As shown in FIG. 4A, the step of forming the first color light-emitting layers 133*a*_1 may include S201 to S203.

In S201, a second film 300 is formed on the substrate 11 on which the hole injection layer 133*d* or the electron injection layer 133*e* is formed. A material of the second film 300 includes a first quantum dot light-emitting material.

The first quantum dot light-emitting material may be a quantum dot light-emitting material having a crosslinkable ligand (e.g., A ligand: R-2-amino-3-(S-T-butylthio)propanoic acid). The A ligand coordinated quantum dot light-emitting material may be manufactured by an oleic acid coordinated quantum dot light-emitting material through a ligand exchange reaction. For example, the first quantum dot light-emitting material may be a red quantum dot light-emitting material.

In S202, electromagnetic radiation is performed on a portion of the second film 300 located in a region where the first light-emitting device 13*a* is located, so as to change a solubility of the portion of the second film 300 located in the region where the first light-emitting device 13*a* is located.

For example, under the electromagnetic radiation, the first quantum dot light-emitting material included in the portion of the second film 300 located in the region where the first light-emitting device 13*a* is located is cross-linked into a mesh, thereby changing the solubility of the portion of the second film 300 located in the region where the first light-emitting device 13*a* is located.

The electromagnetic radiation here means that the portion of the second film 300 located in the region where the first light-emitting device 13*a* is located is irradiated by electromagnetic waves. For example, the portion of the second film 300 located in the region where the first light-emitting device 13*a* is located may be irradiated by ultraviolet light, so that the first quantum dot light-emitting material included in the portion of the second film 300 located in the region where the first light-emitting device 13*a* is located undergos a cross-linking reaction to form a mesh. However, the first quantum dot light-emitting material included in a portion of the second film 300 unirradiated by ultraviolet light is not cross-linked, or is slightly cross-linked.

In S203, a portion of the second film 300 located outside the region where the first light-emitting device 13*a* is located is dissolved, so as to obtain the first color light-emitting layer 133*a*_1 with the first thickness d1 included in the first light-emitting device 13*a* and the first color light-emitting layer 133*a*_1 with the second thickness d2 included in the second light-emitting device 13*b*.

Here, according to a solubility difference between the first quantum dot light-emitting material undergoing the cross-linking reaction and the first quantum dot light-emitting material not undergoing the cross-linking reaction in a solvent, the portion of the second film 300 located outside the region where the first light-emitting device 13*a* is located is dissolved by selecting a suitable solvent. However, it was found through experiments that during this process, the portion of the second film 300 located outside the region where the first light-emitting device 13*a* is located cannot be completely dissolved, but remains in a region outside the region where the first light-emitting device 13*a* is located. That is, the first color light-emitting layer 133*a*_1 with the second thickness d2 is formed.

In S30, the first material layer 10 is formed on the substrate 11 on which the first color light-emitting layers 133*a*_1 are formed.

Figure 4B:
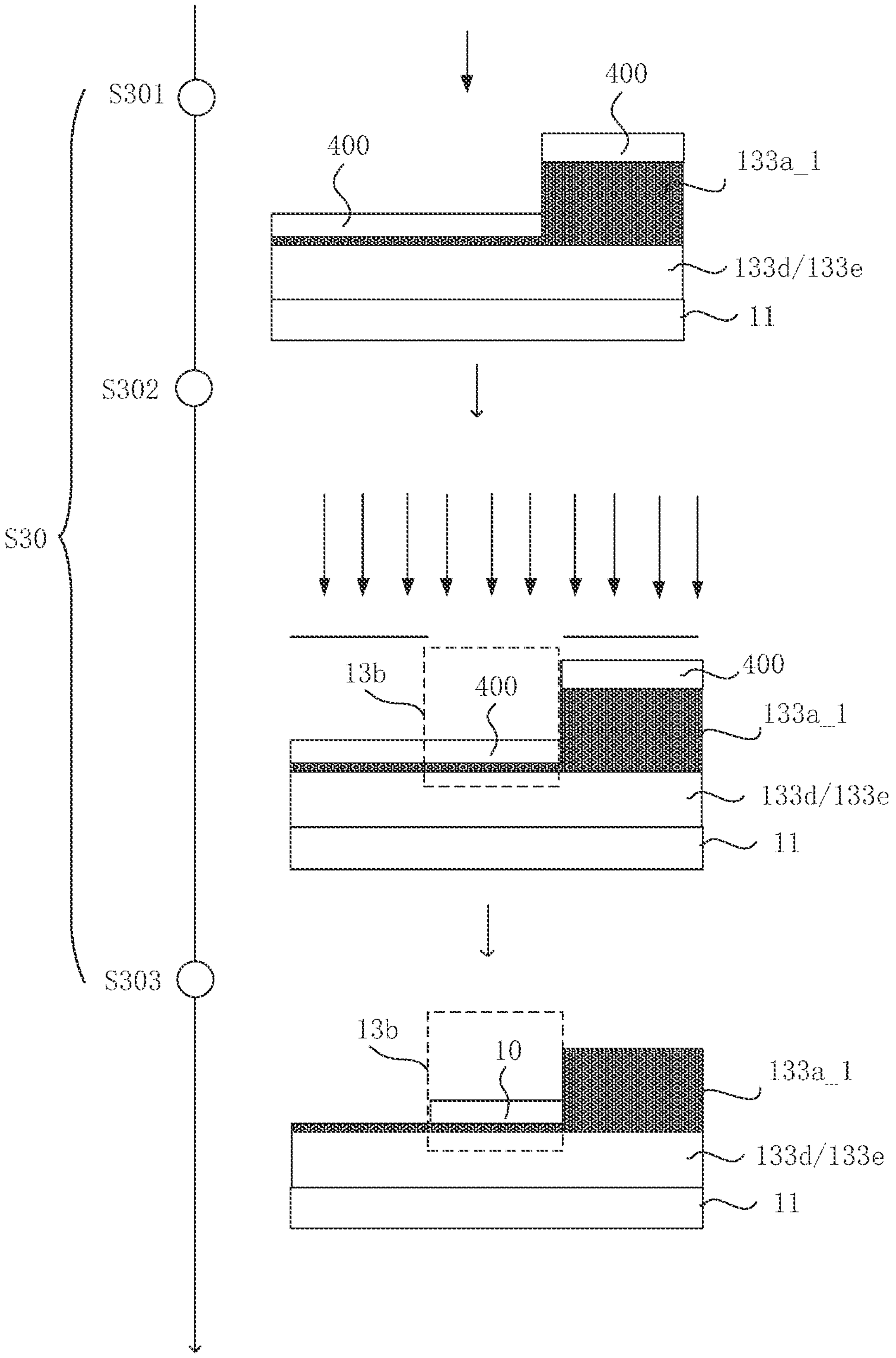
FIG. 4B is a flow diagram of another portion of a manufacturing method of a light-emitting substrate, in accordance with some embodiments.

As shown in FIG. 4B, the step of forming the first material layer 10 includes S301 to S303.

In S301, a first film 400 is formed on the substrate on which the first color light-emitting layers 133*a*_1 are formed.

A material of the first film 400 may include an electron transport material or a hole transport material.

In the case where the first electrode is the anode, the material of the first film 400 includes the hole transport material. In the case where the first electrode is the cathode, the material of the first film 400 includes the electron transport material.

Since the first material layer 10 is disposed only in a region where the second light-emitting device 13*b* is located, the electron transport material or the hole transport material may be a material whose solubility may be changed under the electromagnetic radiation. In this way, according to a solubility difference between a portion with a changed solubility subsequently and a portion with an unchanged solubility, the portion with the unchanged solubility may be completely removed.

In some embodiments, a general structural formula of the electron transport material is shown in following Formula (I):

(I)

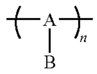

Here, A is selected from any one of trivalent substituted or unsubstituted electron-withdrawing groups, B is selected from groups capable of changing solubility under the electromagnetic radiation, and n is an integer greater than or equal to 1. In A, a substituted substituent is selected from any one of a nitro group, a hydroxyl group and an alkyl group.

A specific structure of the electron transport material may refer to the above description of Formula (I), and will not be repeated here.

In some other embodiments, a general structural formula of the hole transport material is shown in following Formula (II):

(II)

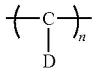

Here, C is selected from any one of trivalent substituted or unsubstituted electron-donating groups, D is selected from groups capable of changing solubility under the electromagnetic radiation, and n is an integer greater than or equal to 1. In C, a substituted substituent is selected from any one of a nitro group, a hydroxy group and an alkyl group.

A specific structure of the hole transport material may refer to the above description of Formula (II), and will not be repeated here.

In S302, electromagnetic radiation is performed on a portion of the first film 400 located in the region where the second light-emitting device 13*b* is located, so as to change a solubility of the portion of the first film 400 located in the region where the second light-emitting device 13*b* is located.

For example, under the electromagnetic radiation, the electron transport material or the hole transport material included in the portion of the first film 400 located in the region where the second light-emitting device 13*b* is located is cross-linked into a mesh.

The definition of the electromagnetic radiation may refer to the above description, and will not be repeated here.

In some embodiments, in a case where the first film 400 includes the hole transport material, the portion of the first film 400 located in the region where the second light-emitting device 13*b* is located may be irradiated by ultraviolet light, so that the hole transport material included in the portion of the first film 400 located in the region where the second light-emitting device 13*b* is located undergos a cross-linking reaction to form a mesh. However, the hole transport material included in a portion of the first film 400 unirradiated by ultraviolet light is not cross-linked, or is slightly cross-linked.

In some other embodiments, in a case where the first film 400 includes the electron transport material, the portion of the first film 400 located in the region where the second light-emitting device 13*b* is located may be irradiated by ultraviolet light, so that the electron transport material included in the portion of the first film 400 located in the region where the second light-emitting device 13*b* is located undergos a cross-linking reaction to form a mesh. However, the electron transport material included in the portion of the first film 400 unirradiated by ultraviolet light is not cross-linked, or is slightly cross-linked.

Here, only the case that the electron transport material or hole transport material is cross-linked under the irradiation of ultraviolet light is shown. It will be understood by those skilled in the art that a case that the electron transport material or hole transport material is cross-linked under irradiation of light of other wavelength bands shall be included in the protection scope of the present disclosure.

In S303, a portion of the first film 400 located outside the region where the second light-emitting device 13*b* is located is dissolved, so as to remove the portion of the first film 400 located outside the region where the second light-emitting device 13*b* is located to obtain the first material layer 10.

In the case where the first film 400 includes the hole transport material, the portion of the first film 400 located outside the region where the second light-emitting device 13*b* is located may be dissolved by using a first solvent, so that the portion of the first film 400 located outside the region where the second light-emitting device 13*b* is located is completely removed, so as to obtain the first material layer 10.

In the case where the first film 400 includes the electron transport material, the portion of the first film 400 located outside the region where the second light-emitting device 13*b* is located may be dissolved by using a second solvent, so that the portion of the first film 400 located outside the region where the second light-emitting device 13*b* is located is completely removed, so as to obtain the first material layer 10.

In S40, a second color light-emitting layer 133*a*_2 is formed on the substrate 11 on which the first material layer 10 is formed.

Figure 4C:
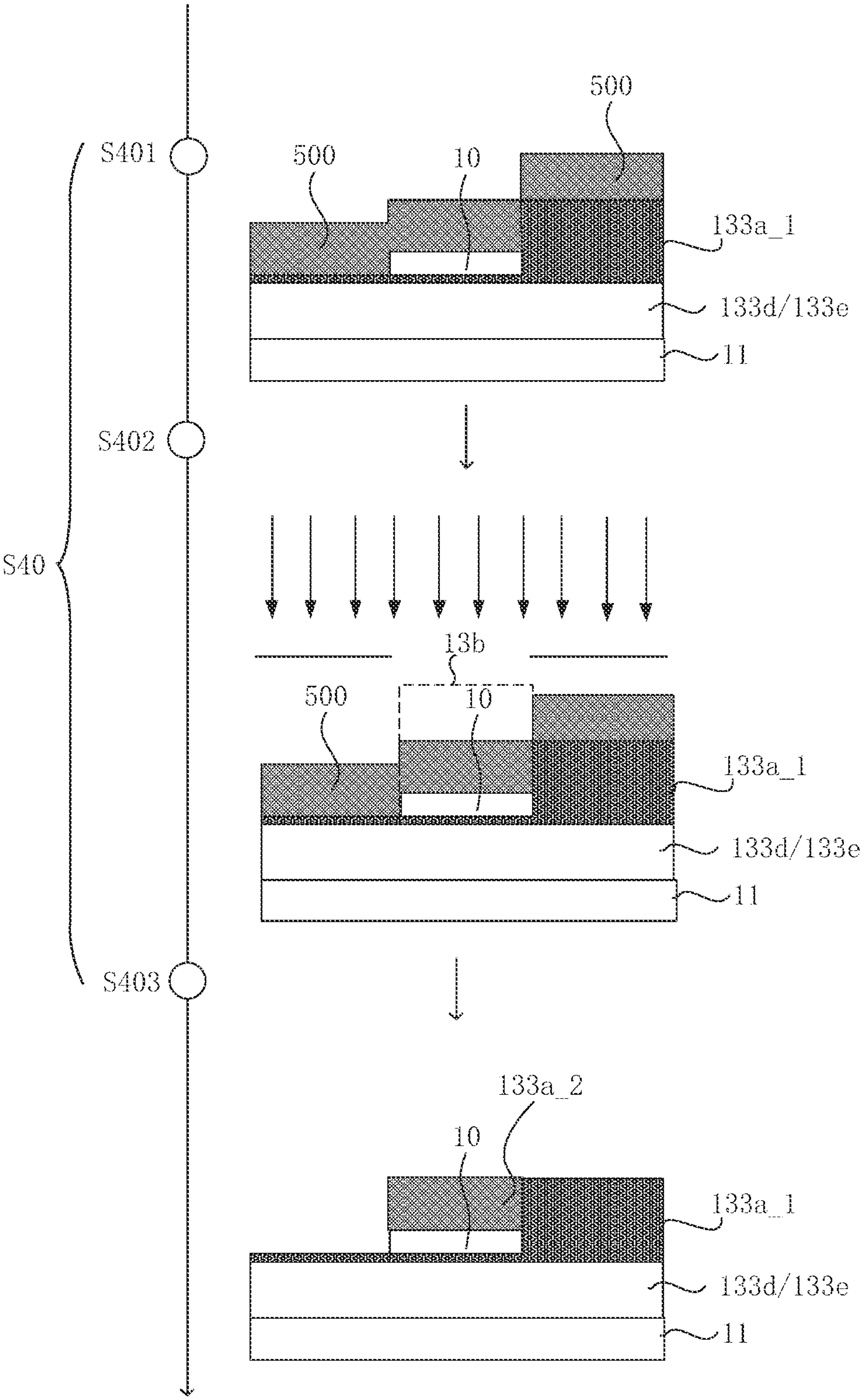
FIG. 4C is a flow diagram of yet another portion of a manufacturing method of a light-emitting substrate, in accordance with some embodiments.
Figure 4D:
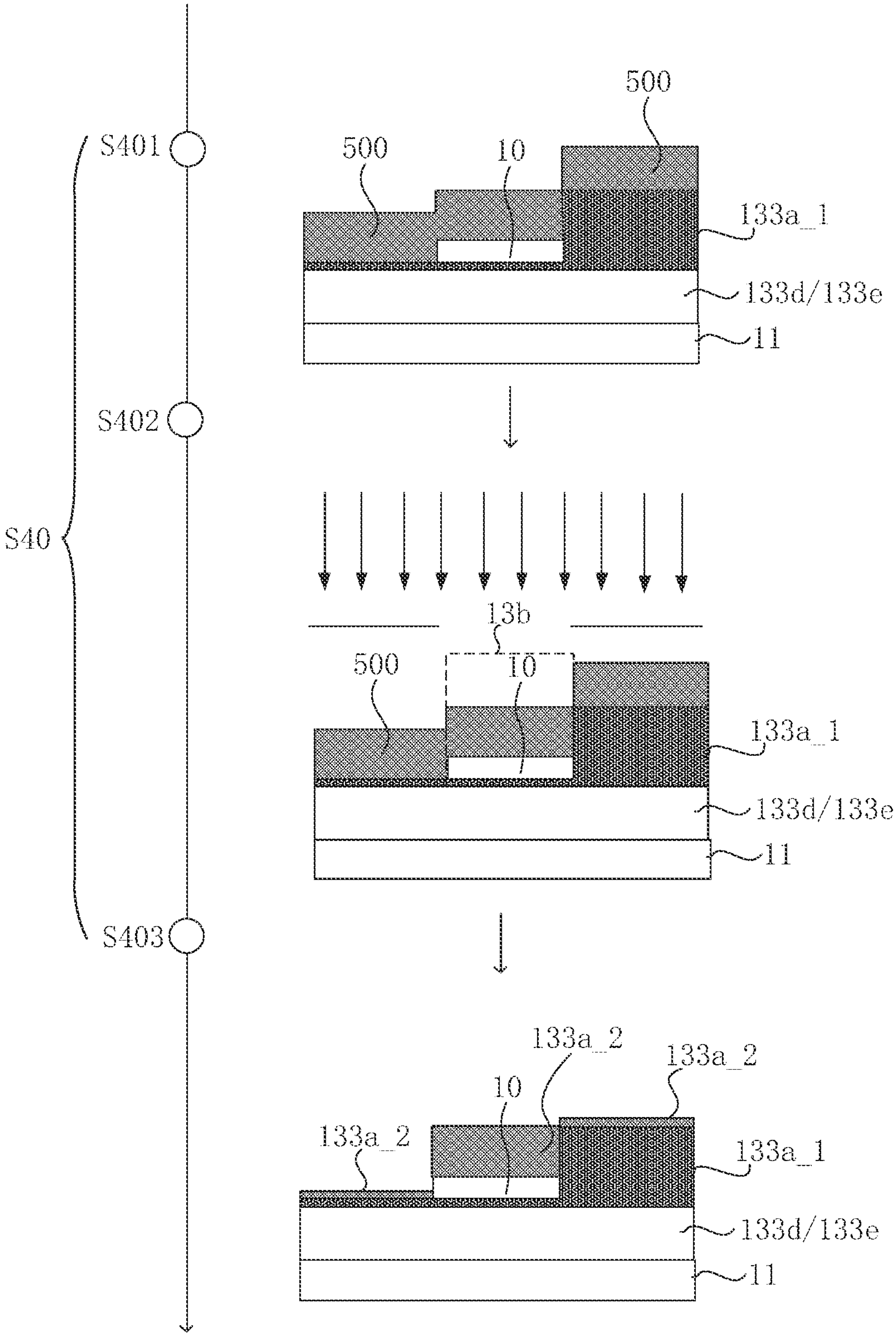
FIG. 4D is a flow diagram of yet another portion of a manufacturing method of a light-emitting substrate, in accordance with some embodiments.

As shown in FIGS. 4C and 4D, the step of forming the second color light-emitting layer 133*a*_2 may include S401 to S403.

In S401, a third film 500 is formed on the substrate on which the first material layer 10 is formed. The third film 500 includes a second quantum dot light-emitting material.

The second quantum dot light-emitting material may be a quantum dot light-emitting material having a crosslinkable ligand (e.g., A ligand: R-2-amino-3-(S-T-butylthio)propanoic acid). The A ligand coordinated quantum dot light-emitting material may be manufactured by an oleic acid coordinated quantum dot light-emitting material through a ligand exchange reaction. For example, the second quantum dot light-emitting material may be a green quantum dot light-emitting material.

In S402, electromagnetic radiation is performed on a portion of the third film 500 located in the region where the second light-emitting device 13*b* is located, so as to change a solubility of the portion of the third film 500 located in the region where the second light-emitting device 13*b* is located.

For example, under the electromagnetic radiation, the second quantum dot light-emitting material included in the portion of the third film 500 located in the region where the second light-emitting device 13*b* is located is cross-linked into a mesh.

The definition of the electromagnetic radiation may refer to the above description, and will not be repeated here.

In an example where the second quantum dot light-emitting material is the A ligand coordinated green quantum dot light-emitting material, the portion of the third film 500 located in the region where the second light-emitting device 13*b* is located may be irradiated by ultraviolet light, so that the second quantum dot light-emitting material included in the portion of the third film 500 located in the region where the second light-emitting device 13*b* is located undergos a cross-linking reaction to form a mesh. However, the second quantum dot light-emitting material included in a portion of the third film 500 unirradiated by ultraviolet light is not cross-linked, or is slightly cross-linked.

In S403, a portion of the third film 500 located outside the region where the second light-emitting device 13*b* is located is dissolved, so that the third film 500 is non-overlapping with a region outside the region where the second light-emitting device 13*b* is located, or the third film 500 forms a second portion 133*a*_22 with a thickness of less than 5 nm in the region outside the region where the second light-emitting device 13*b* is located.

That is, after the cross-linking is completed, according to a solubility difference between the second quantum dot light-emitting material undergoing the cross-linking reaction and the second quantum dot light-emitting material not undergoing the cross-linking reaction in a solvent, the portion of the third film 500 located outside the region where the second light-emitting device 13*b* is located is dissolved by selecting a suitable solvent. In this case, during dissolution, it was found that probably due to similar properties of the material of the second color light-emitting layer 133*a*_2 and the material of the first color light-emitting layer 133*a*_1, when the portion of the second light-emitting layer 133*a*_2 disposed outside the region where the second light-emitting device 13*b* is located is dissolved by using an organic solvent, it is more favorable to remove the portion of the second light-emitting layer 133*a*_2 disposed outside the region where the second light-emitting device 13*b* is located. Thus, the second color light-emitting layer 133*a*_2 is non-overlapping with the region outside the region where the second light emitting device 13*b* is located (as shown in the structure in FIG. 4C), or has only a small amount of residue in the region outside the region where the second light emitting device 13*b* is located (as shown in the structure in FIG. 4D). The residue does not have an influence on the display.

Figure 4E:
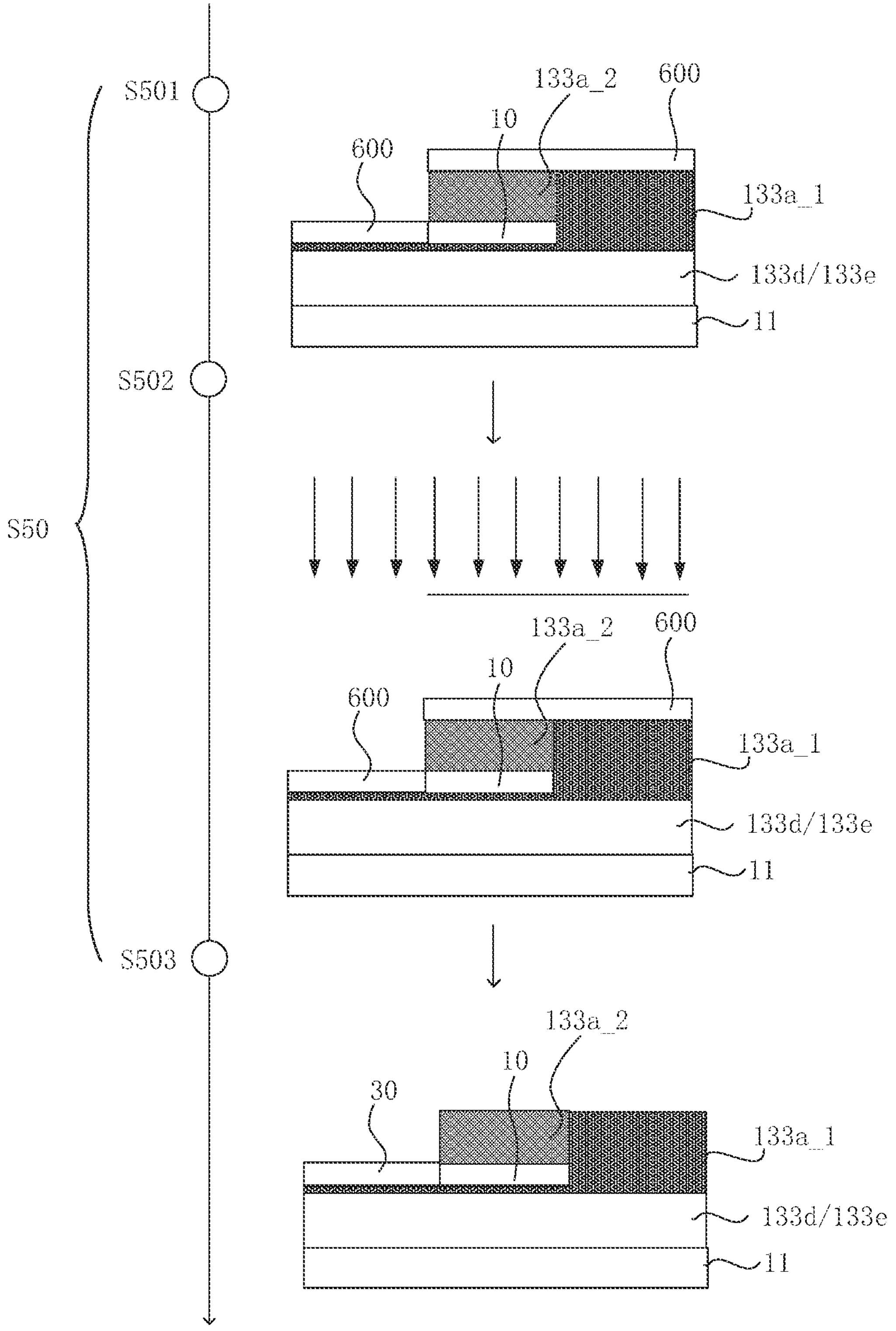
FIG. 4E is a flow diagram of yet another portion of a manufacturing method of a light-emitting substrate, in accordance with some embodiments.
Figure 4F:
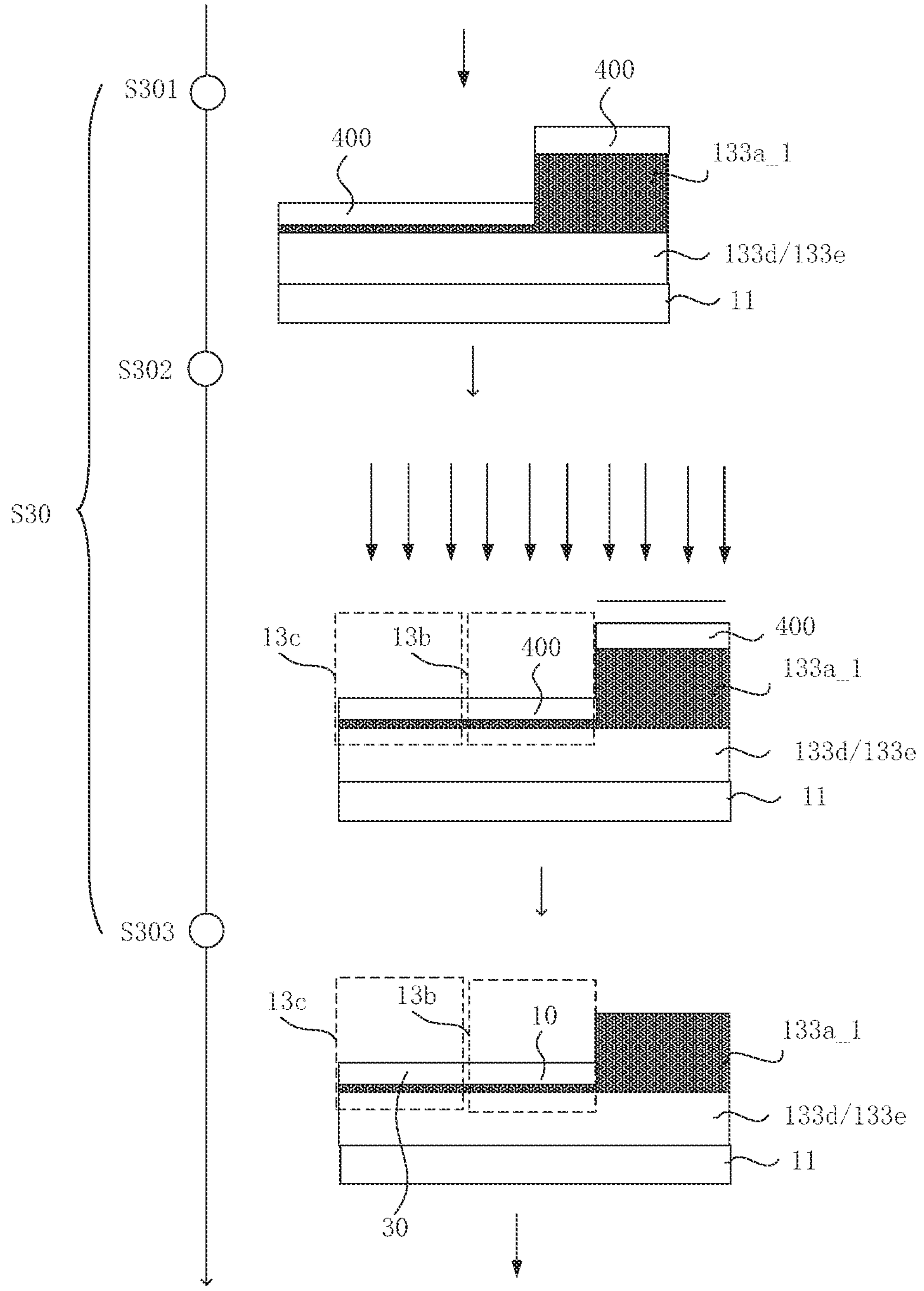
FIG. 4F is a flow diagram of yet another portion of a manufacturing method of a light-emitting substrate, in accordance with some embodiments.
Figure 4G:
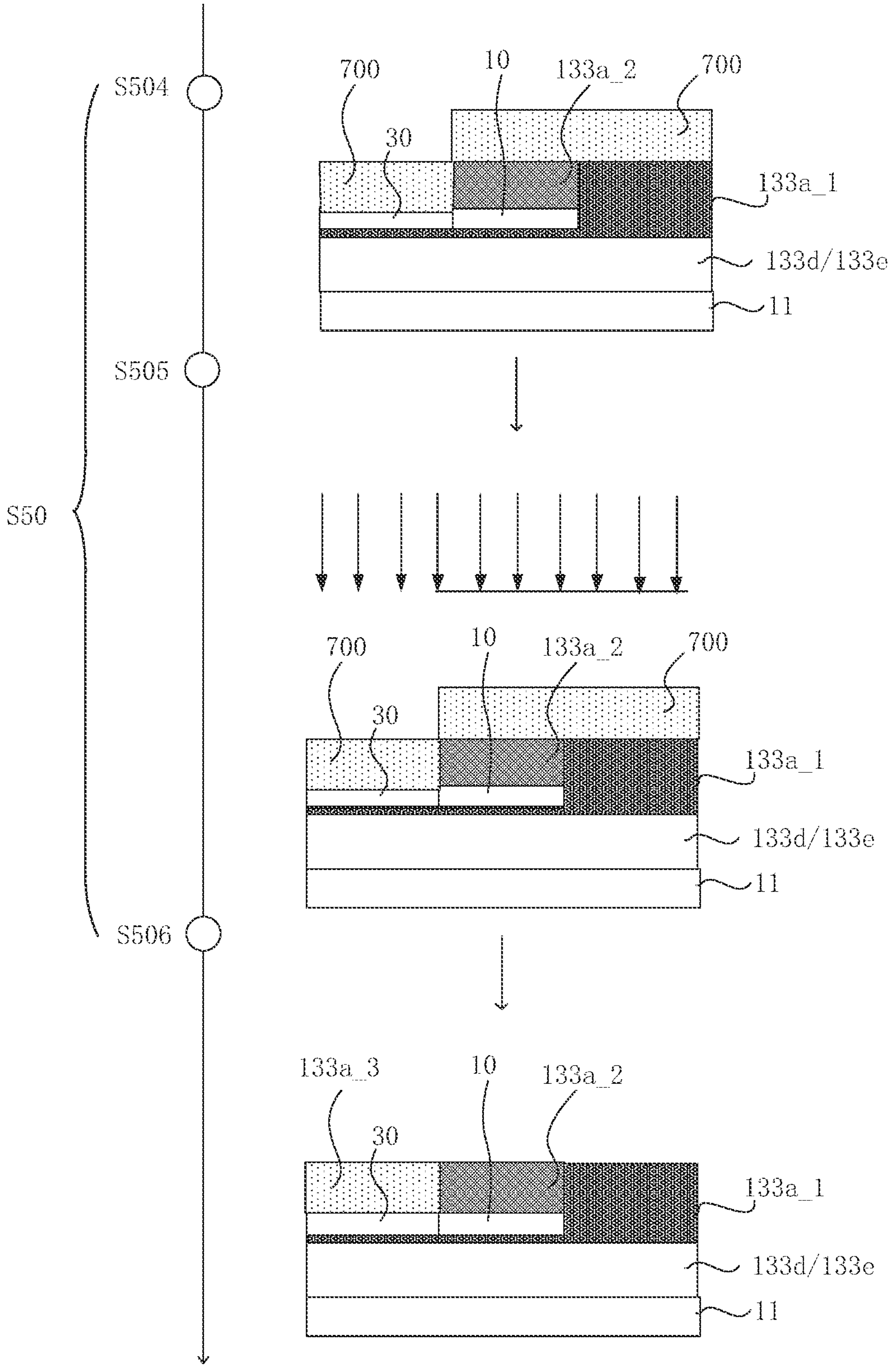
FIG. 4G is a flow diagram of yet another portion of a manufacturing method of a light-emitting substrate, in accordance with some embodiments.

In some embodiments, the plurality of light-emitting devices 13 further include at least one third light-emitting device 13*c*. The at least one third light-emitting device 13*c* includes a first color light-emitting layer 133*a*_1 with a fifth thickness d5, and a second material layer 30 and a third color light-emitting layer 133*a*_3 that are sequentially staked on the first color light-emitting layer 133*a*_1 in the third light-emitting device 13*c* in the direction Y away from the substrate 11. As shown in FIGS. 4E, 4F and 4G, forming the plurality of light-emitting devices 13 on the substrate 11 further includes S50.

In S50, the second material layer 30 and the third color light-emitting layer 133*a*_3 are sequentially formed on the substrate 11.

In some embodiments, a material of the second material layer 30 is different from the material of the first material layer 10. As shown in FIG. 4E, the step of forming the second material layer 30 on the substrate 11 includes S501 to S503.

In S501, a fourth film 600 is formed on the substrate 11 on which the second color light-emitting layer 133*a*_2 is formed.

A material of the fourth film 600 may include an electron transport material or a hole transport material.

In the case where the first electrode 131 is the anode, the material of the fourth film 600 includes the hole transport material. In the case where the first electrode 131 is the cathode, the material of the fourth film 600 includes the electron transport material.

Since the second material layer 30 is disposed only in a region where the third light-emitting device 13*c* is located, the electron transport material or the hole transport material may be a material whose solubility may be changed under the electromagnetic radiation. In this way, according to a solubility difference between a portion with a changed solubility subsequently and a portion with an unchanged solubility, the portion with the unchanged solubility may be completely removed.

In some embodiments, a general structural formula of the electron transport material is shown in following Formula (I):

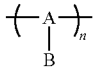

(I)

Here, A is selected from any one of trivalent substituted or unsubstituted electron-withdrawing groups, B is selected from groups capable of changing solubility under the electromagnetic radiation, and n is an integer greater than or equal to 1. In A, a substituted substituent is selected from any one of a nitro group, a hydroxyl group and an alkyl group.

A specific structure of the electron transport material may refer to the above description of Formula (I), and will not be repeated here.

In some other embodiments, a general structural formula of the hole transport material is shown in following Formula (II):

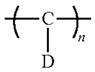

(II)

Here, C is selected from any one of trivalent substituted or unsubstituted electron-donating groups, D is selected from groups capable of changing solubility under the electromagnetic radiation, and n is an integer greater than or equal to 1. In C, a substituted substituent is selected from any one of a nitro group, a hydroxy group and an alkyl group.

A specific structure of the hole transport material may refer to the above description of Formula (II), and will not be repeated here.

In S502, electromagnetic radiation is performed on a portion of the fourth film 600 located in the region where the third light-emitting device 13*c* is located, so as to change a solubility of the portion of the fourth film 600 located in the region where the third light-emitting device 13*c* is located.

For example, under the electromagnetic radiation, the electron transport material or the hole transport material included in the portion of the fourth film 600 located in the region where the third light-emitting device 13*c* is located is cross-linked into a mesh.

In a case where the fourth film 600 includes the hole transport material, the portion of the fourth film 600 located in the region where the third light-emitting device 13*c* is located may be irradiated by ultraviolet light, so that the hole transport material included in the portion of the fourth film 600 located in the region where the third light-emitting device 13*c* is located undergos a cross-linking reaction to form a mesh. However, the hole transport material included in a portion of the fourth film 600 unirradiated by ultraviolet light is not cross-linked, or is slightly cross-linked.

In some other embodiments, in a case where the fourth film 600 includes the electron transport material, the portion of the fourth film 600 located in the region where the third light-emitting device 13*c* is located may be irradiated by ultraviolet light, so that the electron transport material included in the portion of the fourth film 600 located in the region where the third light-emitting device 13*c* is located undergos a cross-linking reaction to form a mesh. However, the electron transport material included in the portion of the fourth film 600 unirradiated by ultraviolet light is not cross-linked, or is slightly cross-linked.

In S503, a portion of the fourth film 600 located outside the region where the third light-emitting device 13*c* is located is dissolved, so as to remove the portion of the fourth film 600 located outside the region where the third light-emitting device 13*c* is located to obtain the second material layer 30.

In the case where the fourth film 600 includes the hole transport material, the portion of the fourth film 600 located outside the region where the third light-emitting device 13*c* is located may be dissolved by using a third solvent, so that the portion of the fourth film 600 located outside the region where the third light-emitting device 13*c* is located is completely removed, so as to obtain the second material layer 30.

In the case where the fourth film 600 includes the electron transport material, the portion of the fourth film 600 located outside the region where the third light-emitting device 13*c* is located may be dissolved by using a fourth solvent, so that the portion of the fourth film 600 located outside the region where the third light-emitting device 13*c* is located is completely removed, so as to obtain the second material layer 30.

In some other embodiments, the second material layer 30 and the first material layer 10 are connected into a continuous structure. As shown in FIG. 4F, the step of forming the second material layer 30 on the substrate 11 following steps.

In S302 of performing the electromagnetic radiation on the portion of the first film 400 located in the region where the second light-emitting device 13*b* is located, the electromagnetic radiation is also performed on a portion of the first film 400 located in the region where the third light-emitting device 13*c* is located, so as to change a solubility of the portion of the first film 400 located in the region where the third light-emitting device 13*c* is located. Thus, in S303, the portion of the first film 400 located outside the region where the second light-emitting device 13*b* is located is dissolved and removed, so as to obtain the first material layer 10 and the second material layer 30.

In these embodiments, the second material layer 30 and the first material layer 10 are formed through one patterning process, which may save the number of masks.

Figure 4H:
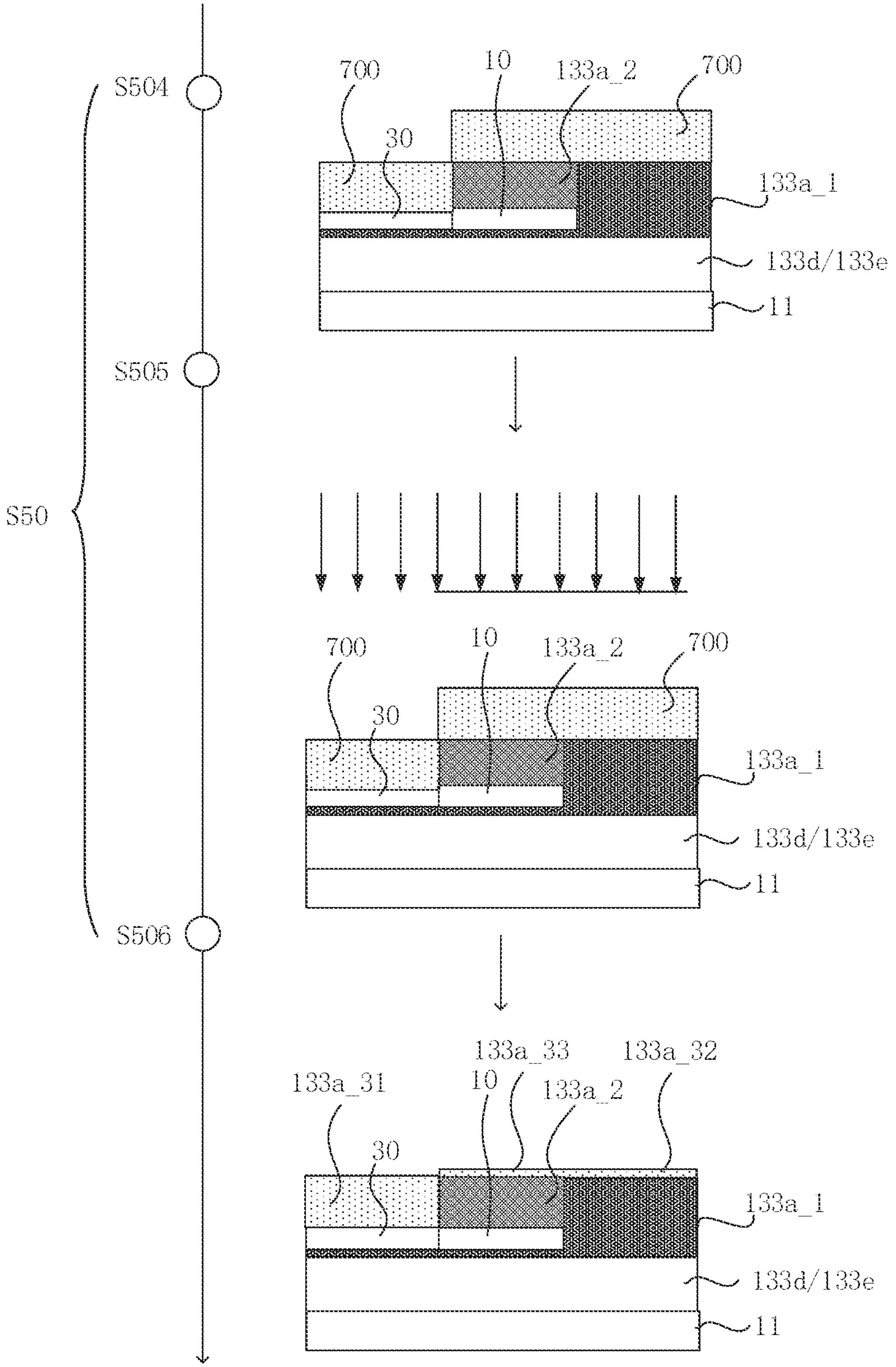
FIG. 4H is a flow diagram of yet another portion of a manufacturing method of a light-emitting substrate, in accordance with some embodiments.

Based on the above structures, in some embodiments, as shown in FIGS. 4G and 4H, the step of forming the third color light-emitting layer 133*a*_3 on the substrate 11 includes S504 to S506.

In S504, a fifth film 700 is formed on the substrate on which the second material layer 30 is formed. The fifth film 700 includes a third quantum dot light-emitting material.

The third quantum dot light-emitting material may be a quantum dot light-emitting material having a crosslinkable ligand (e.g., A ligand: R-2-amino-3-(S-T-butylthio)propanoic acid). The A ligand coordinated quantum dot light-emitting material may be manufactured by an oleic acid coordinated quantum dot light-emitting material through a ligand exchange reaction. For example, the third quantum dot light-emitting material may be a blue quantum dot light-emitting material.

In S505, electromagnetic radiation is performed on a portion of the fifth film 700 located in the region where the third light-emitting device 13*c* is located, so as to change a solubility of the portion of the fifth film 700 located in the region where the third light-emitting device 13*c* is located.

For example, under the electromagnetic radiation, the third quantum dot light-emitting material included in the portion of the fifth film 700 located in the region where the third light-emitting device 13*c* is located is cross-linked into a mesh.

The definition of the electromagnetic radiation may refer to the above description, and will not be repeated here.

In an example where the third quantum dot light-emitting material is the A ligand coordinated blue quantum dot light-emitting material, the portion of the fifth film 700 located in the region where the third light-emitting device 13*c* is located may be irradiated by ultraviolet light, so that the third quantum dot light-emitting material included in the portion of the fifth film 700 located in the region where the third light-emitting device 13*c* is located undergos a cross-linking reaction to form a mesh. However, the third quantum dot light-emitting material included in a portion of the fifth film 700 unirradiated by ultraviolet light is not cross-linked, or is slightly cross-linked.

In S506, a portion of the fifth film 700 located outside the region where the third light-emitting device 13*c* is located is dissolved, so that the fifth film 700 is non-overlapping with a region outside the region where the third light-emitting device 13*c* is located (as shown in the structure in FIG. 4G), or the fifth film 700 forms a fifth portion 133*a*_32 and a sixth portion 133*a*_33 with a thickness of less than 5 nm in the region outside the region where the third light-emitting device 13*c* is located (as shown in the structure in FIG. 4H).

That is, after the cross-linking reaction is completed, according to a solubility difference between the third quantum dot light-emitting material undergoing the cross-linking reaction and the third quantum dot light-emitting material not undergoing the cross-linking reaction in a solvent, the portion of the fifth film 700 located outside the region where the third light-emitting device 13*b* is located is dissolved by selecting a suitable solvent. In this case, probably due to similar properties of the material of the third color light-emitting layer 133*a*_3 and the materials of the first color light-emitting layer 133*a*_1 and the second color light-emitting layer 133*a*_2, when the portion of the third light-emitting layer 133*a*_3 formed outside the region where the third light-emitting device 13*b* is located is dissolved by using an organic solvent, it is more favorable to remove the portion of the third color light-emitting layer 133*a*_3 formed outside the region where the third light-emitting device 13*c* is located. Thus, the third color light-emitting layer 133*a*_3 is non-overlapping with the region outside the region where the third light emitting device 13*c* is located, or has only a small amount of residue in the region outside the region where the third light emitting device 13*c* is located. The residue does not have an influence on the display.

Figure 4I:
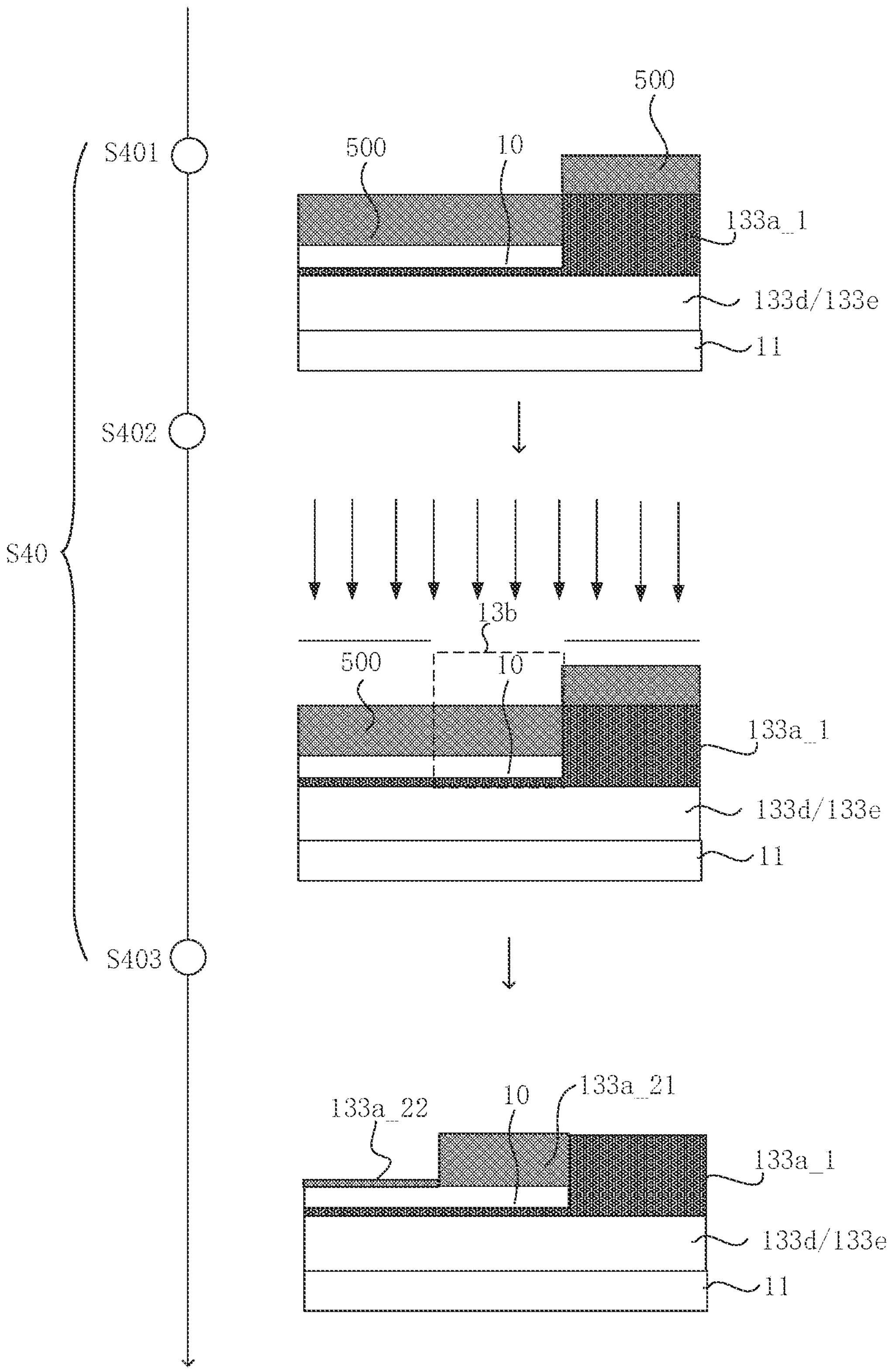
FIG. 4I is a flow diagram of yet another portion of a manufacturing method of a light-emitting substrate, in accordance with some embodiments.
Figure 4J:
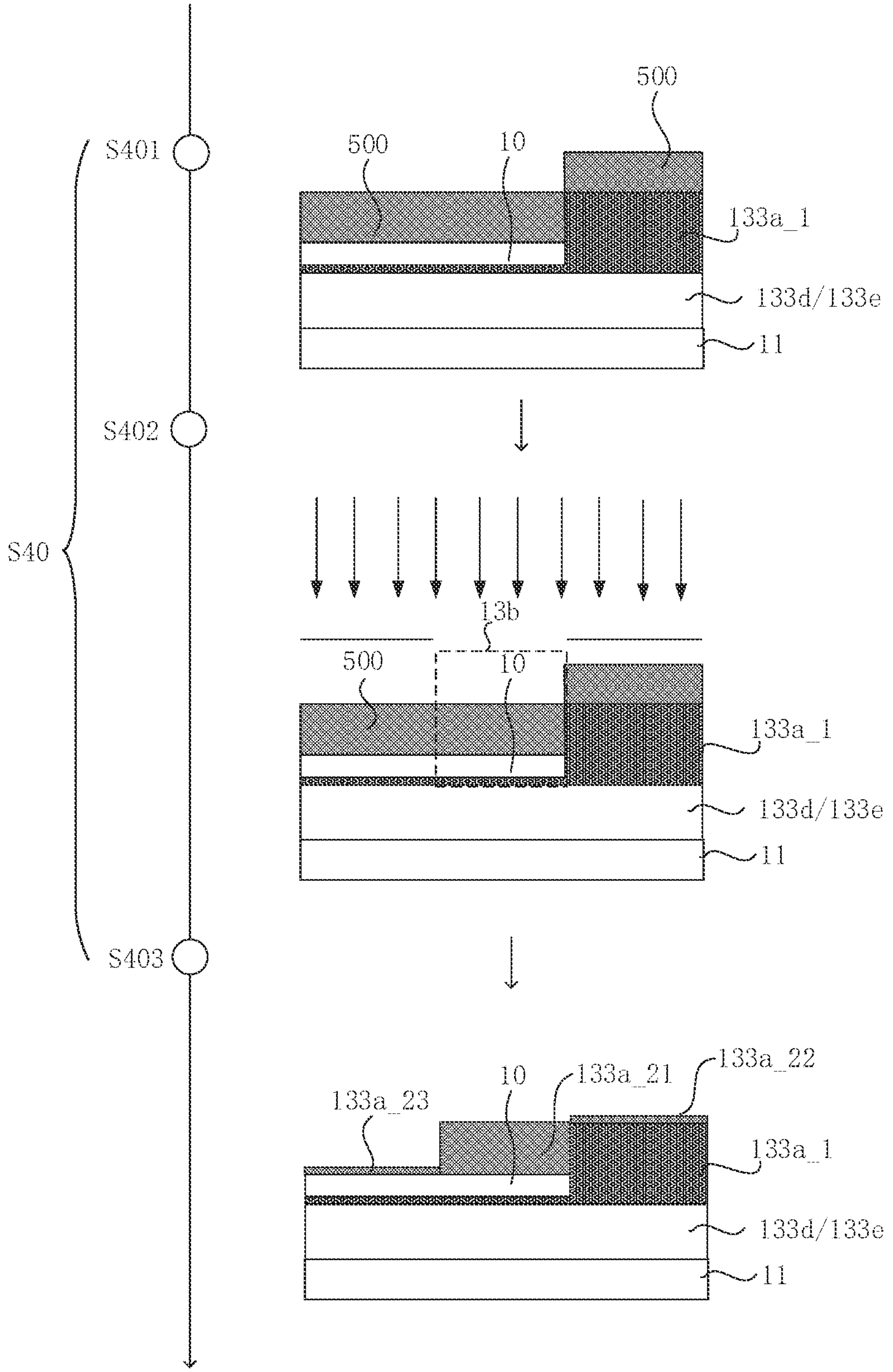
FIG. 4J is a flow diagram of yet another portion of a manufacturing method of a light-emitting substrate, in accordance with some embodiments.

Here, it will be noted that if the second material layer 30 and the first material layer 10 are connected into the continuous structure, in S403, due to a difference between properties of the material of the second color light-emitting layer 133*a*_2 and the material of the second material layer 30, the second color light-emitting layer 133*a*_2 remains on the second material layer 30, thereby obtaining the structure shown in the S403 in FIG. 4I. Different from the second material layer 30, due to the similar properties of the material of the second color light-emitting layer 133*a*_2 and the material of the first color light-emitting layer 133*a*_1, as shown in S403 in FIG. 4I, the second color light-emitting layer 133*a*_2 is non-overlapping with the region where the first light-emitting device 13*a* is located; or as shown in S403 in FIG. 4J, the second color light-emitting layer 133*a*_2 remains in the region where the first light-emitting device 13*a* is located, and a thickness of the second portion 133*a*_22 of the second color light-emitting layer 133*a*_2 located in the region where the first light-emitting device 13*a* is located is less than a thickness of a third portion 133*a*_23 of the second light-emitting layer 133*a*_2 located in the region where the third light-emitting device 13*c* is located.

There are two possible cases. In a first case, as shown in the structure obtained by S506 in FIG. 4H, the second color light-emitting layer 133*a*_2 is disposed only in the region where the second light-emitting device 13*b* is located. In this case, if the third light-emitting layer 133*a*_3 is directly disposed on the second material layer 30, the color mixing may be avoided due to the light emission of the first color light-emitting layer 133*a*_1 disposed in the third light-emitting device 13*c*. In a second case, as shown in the structure obtained by S403 in FIG. 4J, the second color light-emitting layer 133*a*_2 is further disposed in the region where the third light-emitting device 13*c* is located. In this case, if the third light-emitting layer 133*a*_3 is directly formed on the portion of the second color light-emitting layer 133*a*_2 disposed in the region where the third light-emitting device 13*c* is located, the third color light-emitting layer 133*a*_3 is in direct contact with the portion of the second color light-emitting layer 133*a*_2 disposed in the region where the third light-emitting 13*c* is located. Although the color mixing caused by the light emission of the first color light-emitting layer 133*a*_1 disposed in the third light-emitting device 13*c* is able to be avoided, if the portion of the second color light-emitting layer 133*a*_2 disposed in the region where the third light-emitting device 13*c* is located emits light, the color mixing still occurs.

Based on this, in some embodiments, in a case where the second color light-emitting layer 133*a*_2 further includes the third portion 133*a*_23 formed in the region where the third light-emitting device 13*c* is located (i.e., the portion of the second color light-emitting layer 133*a*_2 disposed in the region where the third light-emitting device 13*c* is located), and the third portion 133*a*_23 of the second color light-emitting layer 133*a*_2 formed in the region where the third light-emitting device 13*c* is located is located between the second material layer 30 and the third color light-emitting layer 133*a*_3, the third light-emitting device 13*c* further includes a third material layer 40 disposed between the second material layer 30 and the third color light-emitting layer 133*a*_3. In this case, forming the plurality of light-emitting devices 13 on the substrate 11 further includes S60.

Before the step of forming the third color light-emitting layer 133*a*_3, in S60, the third material layer 40 is formed.

Figure 4K:
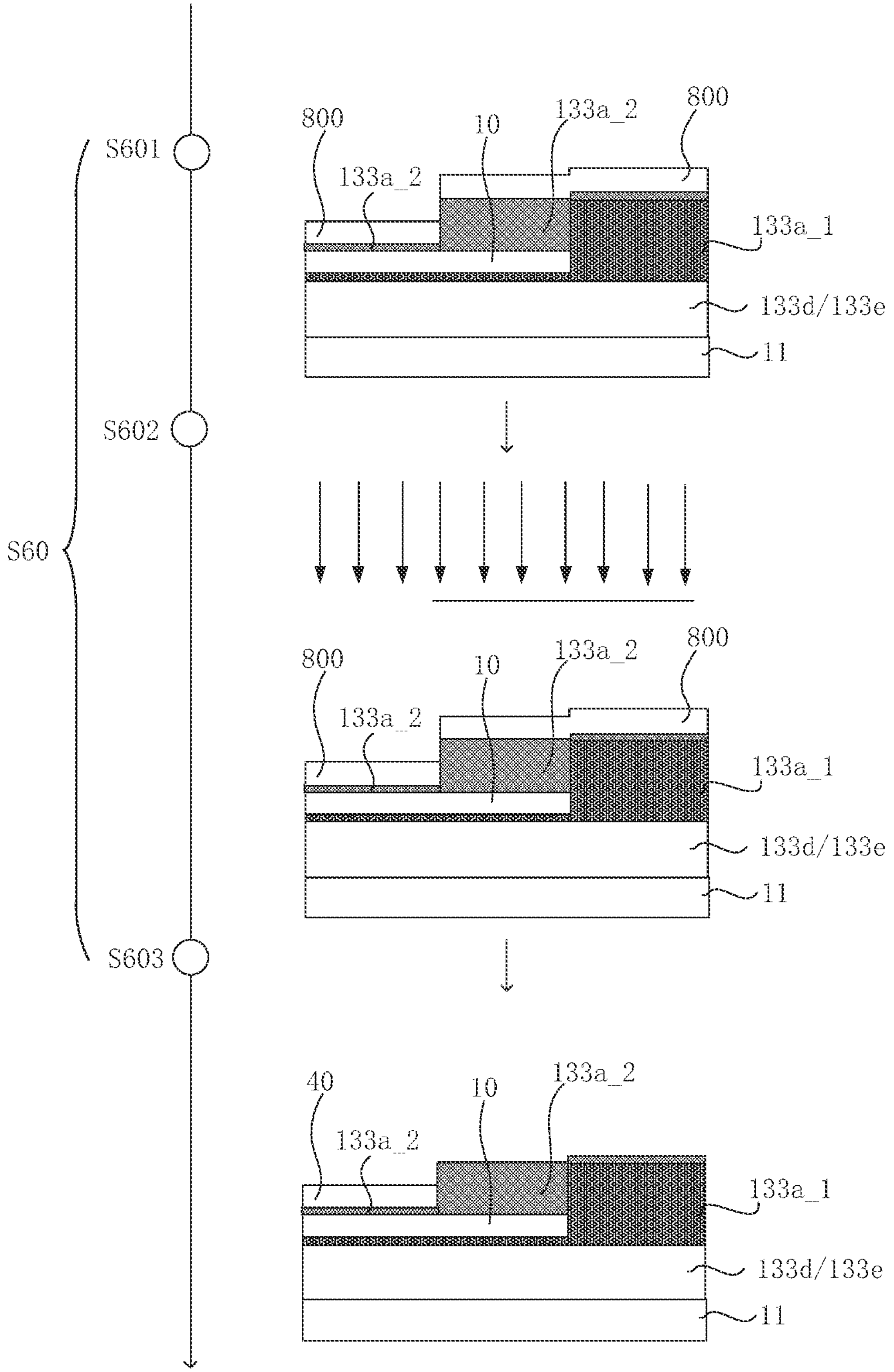
FIG. 4K is a flow diagram of yet another portion of a manufacturing method of a light-emitting substrate, in accordance with some embodiments.

As shown in FIG. 4K, the step of forming the third material layer 40 includes S601 to S603.

In S601, a sixth film 800 is formed on the substrate on which the second color light-emitting layer 133*a*_2 is formed.

A material of the sixth film 800 includes an electron transport material or a hole transport material.

Similar to the above, in the case where the first electrode 131 is the anode, the material of the sixth film 800 includes the hole transport material. In the case where the first electrode 131 is the cathode, the material of the sixth film 800 includes the electron transport material.

Since the third material layer 40 is disposed only in the region where the third light-emitting device 13*c* is located, the electron transport material or the hole transport material may be a material whose solubility may be changed under the electromagnetic radiation. In this way, according to a solubility difference between a portion with a changed solubility subsequently and a portion with an unchanged solubility, the portion with the unchanged solubility may be completely removed.

In some embodiments, a general structural formula of the electron transport material is shown in following Formula (I):

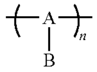

(I)

Here, A is selected from any one of trivalent substituted or unsubstituted electron-withdrawing groups, B is selected from groups capable of changing solubility under the electromagnetic radiation, and n is an integer greater than or equal to 1. In A, a substituted substituent is selected from any one of a nitro group, a hydroxyl group and an alkyl group.

A specific structure of the electron transport material may refer to the above description of Formula (I), and will not be repeated here.

In some other embodiments, a general structural formula of the hole transport material is shown in following Formula (II):

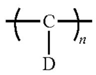

(II)

Here, C is selected from any one of trivalent substituted or unsubstituted electron-donating groups, D is selected from groups capable of changing solubility under the electromagnetic radiation, and n is an integer greater than or equal to 1. In C, a substituted substituent is selected from any one of a nitro group, a hydroxy group and an alkyl group.

A specific structure of the hole transport material may refer to the above description of Formula (II), and will not be repeated here.

In S602, electromagnetic radiation is performed on a portion of the sixth film 800 located in the region where the third light-emitting device 13*c* is located, so as to change a solubility of the portion of the sixth film 800 located in the region where the third light-emitting device 13*c* is located.

For example, under the electromagnetic radiation, the electron transport material or the hole transport material included in the portion of the sixth film 800 located in the region where the third light-emitting device 13*c* is located is cross-linked into a mesh.

Here, it will be noted that since the material included in the sixth film 800 is basically the same as the material included in the first film 400, performing the electromagnetic radiation on the portion of the sixth film 800 located in the region where the third light-emitting device 13*c* is located may refer to the above description of performing the electromagnetic radiation on the portion of the first film 400 located in the region where the second light-emitting device 13*b* is located, and will not be repeated here.

In S603, a portion of the sixth film 800 located outside the region where the third light-emitting device 13*c* is located is dissolved, so as to remove the portion of the sixth film 800 located outside the region where the third light-emitting device 13*c* is located to obtain the third material layer 40.

For details, reference may be made to the above description of dissolving the portion of the first film 400 located outside the region where the second light-emitting device 13*b* is located, which will not be repeated here.

Figure 4L:
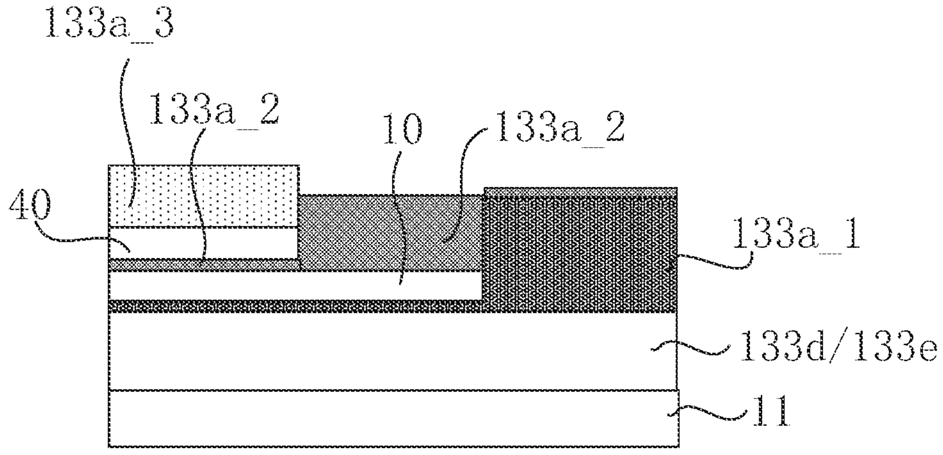
FIG. 4L is a sectional view of yet another light-emitting substrate, in accordance with some embodiments.
Figure 4M:
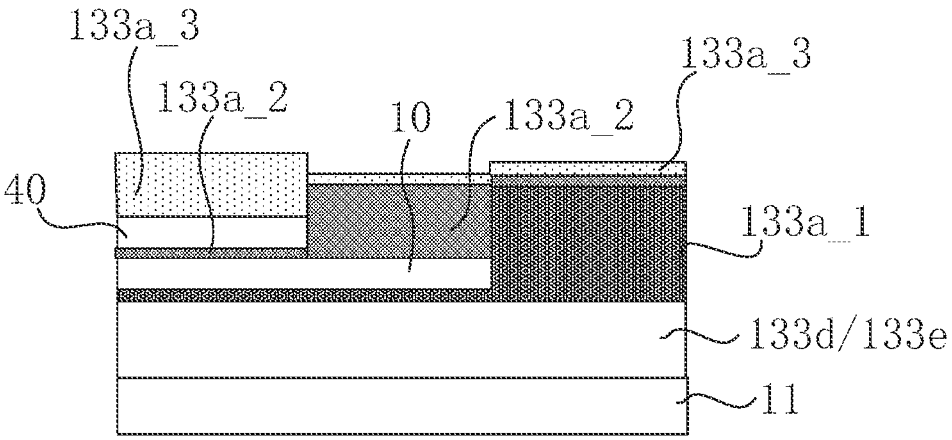
FIG. 4M is a sectional view of yet another light-emitting substrate, in accordance with some embodiments.
Figure 4N:
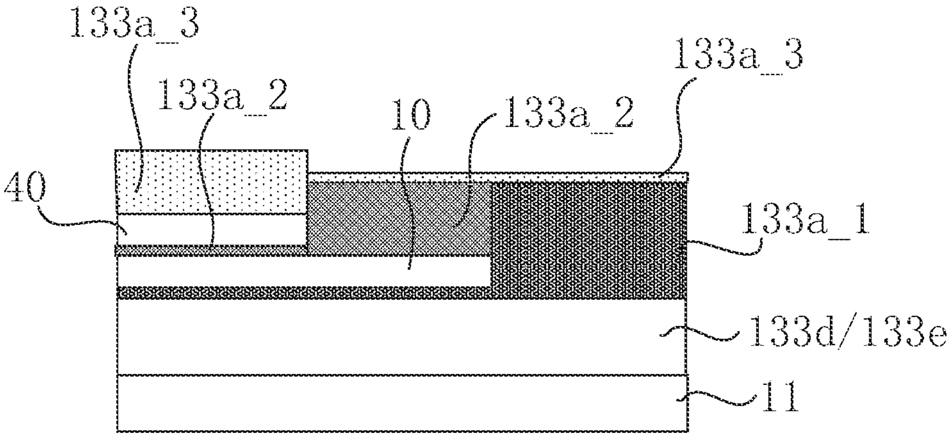
FIG. 4N is a sectional view of yet another light-emitting substrate, in accordance with some embodiments.

In addition, after the third material layer 40 is manufactured, the third color light-emitting layer 133*a*_3 is formed to obtain the structure as shown in FIG. 4L, FIG. 4M or FIG. 4N. This step may refer to the above description of forming the third color light-emitting layer 133*a*_3 on the substrate 11 on which the second material layer 30 is formed, and will not be repeated here. Forming the plurality of light-emitting devices 13 on the substrate 11 further includes S70 to S90.

In S70, the electron transport layer 133*c* or the hole transport layer 133*b* is formed on the substrate 11 on which the third color light-emitting layer 133*a*_3 is formed.

In the case where the first electrode 131 is the anode, the electron transport layer 133*c* is formed. In the case where the first electrode 131 is the cathode, the hole transport layer 133*b* is formed.

In S80, the electron injection layer 133*e* or the hole injection layer 133*d* is formed on the substrate 11 on which the electron transport layer 133*c* or the hole transport layer 133*b* is formed.

In the case where the first electrode 131 is the anode, the electron injection layer 133*e* is formed. In the case where the first electrode is the cathode, the hole injection layer 133*d* is formed.

In S90, the second electrodes 132 are formed on the substrate 11 on which the electron injection layer 133*e* or the hole injection layer 133*d* is formed. The second electrodes 132 are arranged as a whole layer.

In the case where the first electrode 131 is the anode, the second electrode 132 is the cathode. In the case where the first electrode 131 is the cathode, the second electrode 132 is the anode.

Of course, the manufacturing method may further include: forming an encapsulation layer. The encapsulation layer may be made of ultraviolet curing glue, and the ultraviolet curing glue is cured to encapsulate the light-emitting devices due to an excitation of ultraviolet light.

The above is only an example of forming the quantum dot light-emitting materials on the substrate 11 on which the hole injection layer 133*d* or the electron injection layer 133*e* is formed. It will be understood by those skilled in the art that after the hole injection layer 133*d* or the electron injection layer 133*e* is formed, and before the quantum dot light-emitting materials are formed, the hole transport layer 133*b* or the electron transport layer 133*c* may be formed. The same technical effects may be achieved by selecting suitable material(s) as the first material layer 10 and the second material layer 30, which will not be repeated here.

The material of the hole transport layer 133*b* may be selected from one or more of poly(9,9-dioctylfluorene-co-N-(4-butylphenyl)diphenylamine) (TFB), N,N'-bis(naphthalen-1-yl)-N,N'-bis(phenyl) benzidine (NPB), 2,4,6-tris[3-(diphenylphosphinyl)phenyl]-1,3,5-triazine, 4,4',4"-tris[N-(naphthalen-2-yl)-N-phenyl-amino]triphenylamine, tris(2,4,6-trimethyl-3-(pyridin-3-yl)phenyl)borane, and 4,6-bis(3,5-di(pyridin-3-yl)phenyl)-2-methylpyrimidine. The material of the electron transport layer 133*c* may be selected from any one of magnesium zinc oxide, gallium zinc oxide, and magnesium aluminum zinc oxide.

In addition, quantum dots in the quantum dot light-emitting material are typically semiconductor nanocrystals, and a semiconductor forming the semiconductor nanocrystals may include a group IV element, a group II-VI compound, a group II-V compound, a group IIII-VI compound, a group III-V compound, a group IV-VI compound, and a group III compound. A group II-IV-VI compound or a group II-IV-V compound includes an alloy of any one of the foregoing and/or includes a mixture of any one of the foregoing, e.g., includes ternary and quaternary mixtures or alloys. The quantum dot light-emitting material may have a core-shell structure.

Each coordination group M is selected from one of a sulfur-containing group, a nitrogen-containing group and an oxygen-containing group. For example, each coordinated group may be a sulfhydryl group, an amino group, or a hydroxyl group.

For example, the quantum dot in the quantum dot light-emitting material includes one or more of ZnS, ZnSe, ZnTe, CdS, CdSe, CdTe, HgTe, InP, CuInS, CulnSe, CuInSeS and AgInS.

The quantum dot in the quantum dot light-emitting material may have a core-shell structure. The core may include one or more of ZnS, ZnSe, ZnTe, CdS, CdSe, CdTe, HgTe, InP, CuInS, CulnSe, CuInSeS and AgInS. The shell may be made of a semiconductor material having a composition different from that of the core, and is wrapped around the core. For example, in this embodiment, the quantum dot having the core-shell structure includes CdS/ZnS, CdSe/ZnS, CdSe/ZnSeS, CdSe/CdS, ZnSe/ZnS, InP/ZnS, CuInS/ZnS, (Zn)CuinS/ZnS, (Mn)CulnS/ZnS, AgInS/ZnS, (Zn)AgInS/ZnS, CulnSe/ZnS, CulnSeS/ZnS or PbS/ZnS. Here, it will be noted that "/" is preceded by the core, and is followed by the shell.

In some embodiments, the quantum dot in the quantum dot light-emitting material may further have a ligand. In this case, the ligand is bound to the quantum dot.

In these embodiments, a surface of the quantum dot may have defect sites or regions that are uncovered by the ligand, so that the coordination group M is coordinated with the quantum dot.

Based on the above detailed description, in order to objectively evaluate the technical effects of the technical solutions provided in the embodiments of the present disclosure, the technical solutions provided in the embodiments of the present disclosure will be exemplarily described in detail below with reference to comparative examples and experimental examples.

In the following comparative examples and experimental examples, as an example, quantum dots in the red quantum dot light-emitting material, the green quantum dot light-emitting material and the blue quantum dot light-emitting material all have a cadmium selenide/zinc sulfide core-shell structure, and the ligand is A ligand (i.e., R-2-amino-3-(S-T-butylthio)propanoic acid). Each quantum dot light-emitting material is obtained by a ligand exchange reaction. 1 mL of an octane solution of a quantum dot light-emitting material (which had a concentration of 20 mg/ml) whose original ligand was oleic acid was taken, and was dissolved with chloroform after the solvent was dried, and 0.33 ml of A ligand (i.e., R-2-amino-3-(S-T-butylthio)propanoic acid) was added therein. The mixture was stirred for 4 hours at room temperature (25° C. to 35° C.) to complete the ligand exchange. Then, the quantum dot light-emitting material was precipitated with 8 ml of methanol, and the supernatant was discarded after centrifugation. The quantum dot light-emitting material was dissolved with 1 ml of chloroform, and was precipitated by adding 8 ml of methanol, the supernatant was discarded after centrifugation, and powders of the quantum dot light-emitting material were obtained after vacuum drying at 80° C. The powders of the quantum dot light-emitting material were dissolved in toluene to prepare a solution with a concentration of 5 mg/ml, and thus a solution of each quantum dot light-emitting material was obtained.

Comparative Example 1

An "upright" bottom-emission light-emitting substrate is manufactured in the comparative example 1, and a specific manufacturing method is as follows.

In Step 1), nickel oxide nanoparticles (having a concentration of 25 mg/ml) were spin-coated (at 2000 rpm for 30 s) in the air on an indium tin oxide (ITO) substrate (i.e., a substrate on which ITO electrodes (as the anodes) were formed), and were annealed at 120° C. for 5 min to form the hole injection layer on the ITO substrate.

In Step 2), a solution of the red quantum dot light-emitting material was spin-coated (at 3000 rpm for 30 s) in the air, and 5 wt % of 2,4-bis(trichloromethyl)-6-(4-methoxystyryl)-1,3,5-triazine was added into the solution as a photoacid generator. After the spin coating was completed, an ultraviolet (UV) exposure was performed on the solution at 150 mj (an energy used for exposure was 150 mj). After the exposure was completed, the film layer was developed by using chloroform, and was annealed at 120° C. for 20 min after the development was completed, so as to form a red quantum dot film layer (with an HOMO energy level of approximately −5.9 eV and an LUMO energy level of approximately −3.9 eV). A thickness of a portion of the red quantum dot film layer located in the region where the light-emitting device that emits red light is located is 20 nm, and a thickness of a portion of the red quantum dot film layer located in the region where the light-emitting device that emits green light is located and a thickness of a portion of the red quantum dot film layer located in the region where the light-emitting device that emits blue light is located are 10 nm.

In Step 3), a solution of the green quantum dot light-emitting material was spin-coated (at 3000 rpm for 30 s) in the air, and 5 wt % of 2,4-bis(trichloromethyl)-6-(4-methoxystyryl)-1,3,5-triazine was added into the solution as a photoacid generator. After the spin coating was completed, a UV exposure was performed on the solution at 150 mj. After the exposure was completed, the film layer was developed by using chloroform, and was annealed at 120° C. for 20 min after the development was completed, so as to form a patterned green quantum dot film layer (with an HOMO energy level of approximately −6.1 eV and an LUMO energy level of approximately −3.85 eV). A thickness of the green quantum dot film layer in the region where the light-emitting device that emits green light is located is approximately 25 nm, and the green quantum dot film layer has almost no residue in the region where the light-emitting device that emits red light is located and in the region where the light-emitting device that emits blue light is located.

In Step 4), a solution of the blue quantum dot light-emitting material was spin-coated (at 3000 rpm for 30 s) in the air, and 5 wt % of 2,4-bis(trichloromethyl)-6-(4-methoxystyryl)-1,3,5-triazine was added into the solution as a photoacid generator. After the spin coating was completed, a UV exposure was performed on the solution at 150 mj. After the exposure was completed, the film layer was developed by using chloroform, and was annealed at 120° C. for 20 min after the development was completed, so as to form a patterned blue quantum dot film layer (with an HOMO energy level of approximately −6.2 eV and an LUMO energy level of approximately −3.57 eV). A thickness of the blue quantum dot film layer in the region where the light-emitting device that emits blue light is located is 25 nm, and the blue quantum dot film layer has almost no residue in the region where the light-emitting device that emits red light is located and in the region where the light-emitting device that emits green light is located.

In Step 5), zinc oxide nanoparticles (having a concentration of 30 mg/ml) were spin-coated (at 3000 rpm for 30 s), and were annealed at 120° C. for 20 min to obtain the electron injection layer.

In Step 6), aluminum electrodes (i.e., cathodes) with a thickness of 120 nm were evaporated, and the light-emitting substrate was obtained after encapsulation.

Experimental Example 1

Manufacturing methods of steps in Experimental example 1 are basically the same as the manufacturing methods of the steps in Comparative example 1. Differences are that: a step of forming a hole transport pattern 1 in the region where the light-emitting device that emits green light is located is added between Step 2) and Step 3), so as to form the first material layer 10; and a step of forming a hole transport pattern 2 in the region where the light-emitting device that emits blue light is located is added between Step 3) and Step 4), so as to form the second material layer 30.

After Step 2), a chlorobenzene solution of a hole transport material B1 was spin-coated. The hole transport material B1 had a concentration of 15 mg/ml, a rotation speed of the spin coating was 2500 rpm, and the hole transport material B1 had an HOMO energy level of approximately −5.8 eV. After the spin coating was completed, an exposure was performed on the hole transport material by using 365 nm UV light (an energy used for exposure was 50 mj). After the exposure was completed, the film layer was developed by using chlorobenzene. After the development was completed, the hole transport pattern 1 disposed in the region where the light-emitting device that emits green light was located was obtained.

After Step 3), a chlorobenzene solution of a hole transport material B2 was spin-coated. The hole transport material B2 had a concentration of 15 mg/ml, a rotation speed of the spin coating was 2500 rpm, and the hole transport material B2 had an HOMO energy level of approximately −5.9 eV. After the spin coating was completed, an exposure was performed by using 365 nm UV light (an energy used for exposure was 50 mj). After the exposure was completed, the film layer was developed by using chlorobenzene. After the development was completed, the hole transport pattern 2 disposed in the region where the light-emitting device that emits blue light was located was obtained.

Structures of B1 and B2 are as follows:

B1

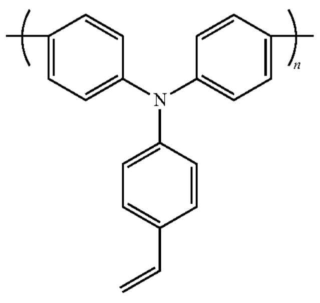

B2

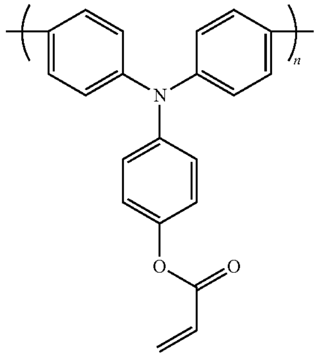

Experimental Example 2

Manufacturing methods of steps in Experimental example 2 are basically the same as the manufacturing methods of the steps in Experimental example 1. Differences are that: the hole transport pattern 1 is manufactured by using a chlorobenzene solution of a hole transport material C1, and the hole transport material C1 has an HOMO energy level of approximately −5.8 eV; and the hole transport pattern 2 is manufactured by using a chlorobenzene solution of a hole transport material C2, and the hole transport material C2 has an HOMO energy level of approximately −5.95 eV.

Structures of C1 and C2 are as follows:

C1

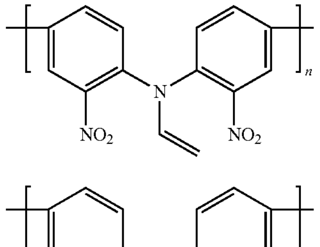

C2

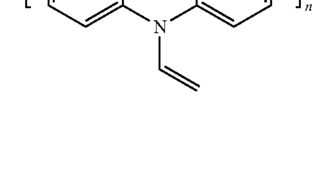

Comparative Example 2

Manufacturing methods of steps in Comparative example 2 are basically the same as the manufacturing methods of the steps in Comparative example 1. Differences are that: an “upright” top-emission light-emitting substrate is manufactured in Comparative example 2; the anode has a stacked structure of ITO/Ag/ITO in Step 1); and indium gallium zinc oxide (IGZO) is sputtered as cathodes with a thickness of 50 nm in Step 6).

Experimental Example 3

Manufacturing method of steps in Experimental example 3 are basically the same as the manufacturing methods of the steps in Comparative example 2. Differences are that: a step of forming a hole transport pattern 1 in the region where the light-emitting device that emits green light is located is added between Step 2) and Step 3), so as to form the first material layer 10; and a step of forming a hole transport pattern 2 in the region where the light-emitting device that emits blue light is located is added between Step 3) and Step 4), so as to form the second material layer 30.

Specific manufacturing methods of the hole transport pattern 1 and the hole transport pattern 2 may refer to the description in Experimental example 1, and will not be repeated here.

Comparative Example 3

Manufacturing methods of steps in Comparative example 3 are basically the same as the manufacturing methods of the steps in Comparative example 1. A difference is that a step of manufacturing the hole transport layer is added between Step 1) and Step 2) in Comparative example 3. After Step 1), a chlorobenzene solution (having a concentration of 10 mg/ml and containing 5% of cross-linking agent) of cross-linked TFB was spin-coated (at 2000 rpm for 30 s). After the spin-coating was completed, the solution was irradiated by 365 nm UV light at 300 mj to form the hole transport layer, and the hole transport layer was annealed at 170° C. for 15 min.

A structural formula of TFB is as follows:

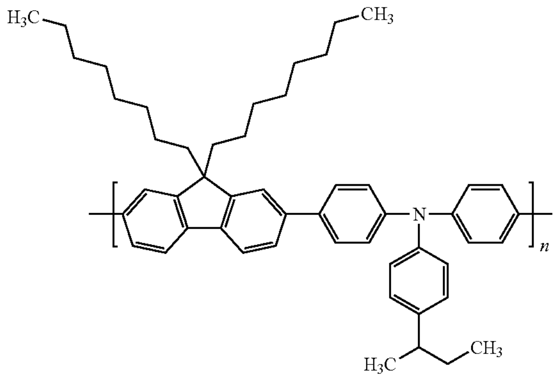

Experimental Example 4

Manufacturing methods of steps in Experimental example 4 are basically the same as the manufacturing methods of the steps in Comparative example 3. Differences are that: a step of forming a hole transport pattern 1 in the region where the light-emitting device that emits green light is located is added between Step 2) and Step 3), so as to form the first material layer 10; and a step of forming a hole transport pattern 2 in the region where the light-emitting device that emits blue light is located is added between Step 3) and Step 4), so as to form the second material layer 30.

Specific manufacturing methods of the hole transport pattern 1 and the hole transport pattern 2 may refer to the description in Experimental example 1, and will not be repeated here.

Comparative Example 4

An "inverted" bottom-emission light-emitting substrate is manufactured in Comparative example 4, and a specific manufacturing method is as follows.

In Step 1), zinc oxide nanoparticles (having a concentration of 25 mg/ml) were spin-coated (at 2000 rpm for 30 s) in the air on an ITO substrate (i.e., a substrate on which ITO electrodes as the cathodes were formed), and were annealed at 120° C. for 10 min to form the electron injection layer on the ITO substrate.

Step 2), Step 3) and Step 4) may respectively refer to Step 2), Step 3) and Step 4) in Comparative example 1, and will not be repeated here.

In Step 5), the hole transport layer and the hole injection layer were manufactured by evaporation.

In Step 6), silver electrodes were evaporated as the anodes with a thickness of 120 nm, and the light-emitting substrate was obtained after encapsulation.

Experimental Example 5

Manufacturing methods of steps in Experimental example 5 are basically the same as the manufacturing methods of steps in Comparative example 4. Differences are that: a step of forming an electron transport pattern 1 in the region where the light-emitting device that emits green light is located is added between Step 2) and Step 3), so as to form the first material layer 10; and a step of forming an electron transport pattern 2 in the region where the light-emitting device that emits blue light is located is added between Step 3) and Step 4), so as to form the second material layer 30.

After Step 2), a chlorobenzene solution of an electron transport material D1 was spin-coated. The electron transport material D1 had a concentration of 15 mg/ml, a rotation speed of the spin coating was 2500 rpm, and the electron transport material D1 had an LUMO energy level of approximately −3.4 eV. After the spin coating was completed, an exposure was performed on the electron transport material D1 by using 365 nm UV light (an energy used for exposure was 50 mj). After the exposure was completed, the film layer was developed by using chlorobenzene. After the development was completed, the electron transport pattern 1 disposed in the region where the light-emitting device that emits green light was located was obtained.

After Step 3), the chlorobenzene solution of the electron transport material D1 was spin coated. The electron transport material D1 had the concentration of 15 mg/ml, the rotation speed of the spin coating was 2500 rpm, and the electron transport material D1 had the LUMO energy level of approximately −3.4 eV. After the spin coating was completed, an exposure was performed by using 365 nm UV light (an energy used for exposure was 50 mj). After the exposure was completed, the film layer was developed by using chlorobenzene. After the development was completed, the electron transport pattern 2 disposed in the region where the light-emitting device that emits blue light was located was obtained.

A structure of D1 is as follows:

D1

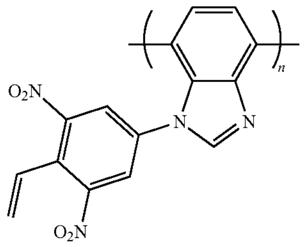

The above experimental examples and comparative examples were subjected to a chromaticity test, and it is found that after the first material layer 10 and the second material layer 30 are inserted, the color mixing may be reduced, so that the color purity and the color gamut may be improved.

Here, in order to fully describe the embodiments of the present disclosure, manufacturing methods of the electron transport material D1 and the hole transport materials 1, B2, C1 and C2 listed above will be exemplarily described.

1. A reaction equation and a manufacturing method of 1 are as follows.

The reaction equation of B1:

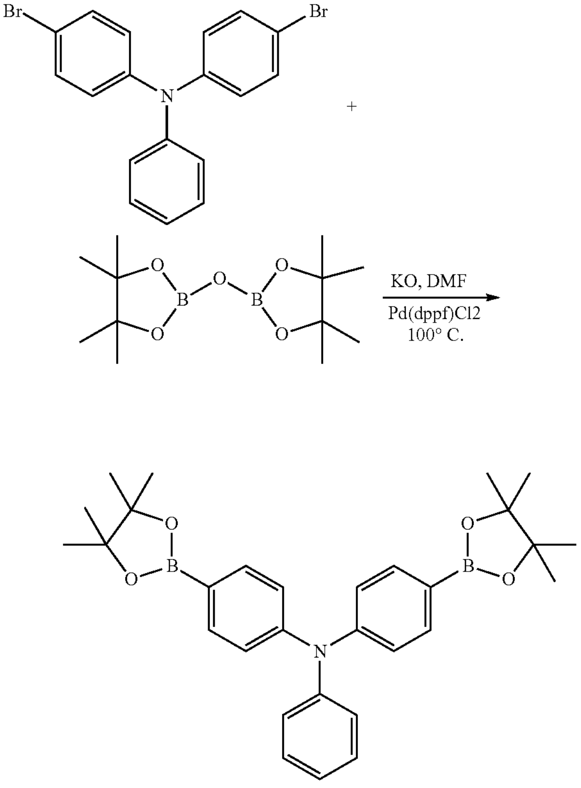

(1)

-continued

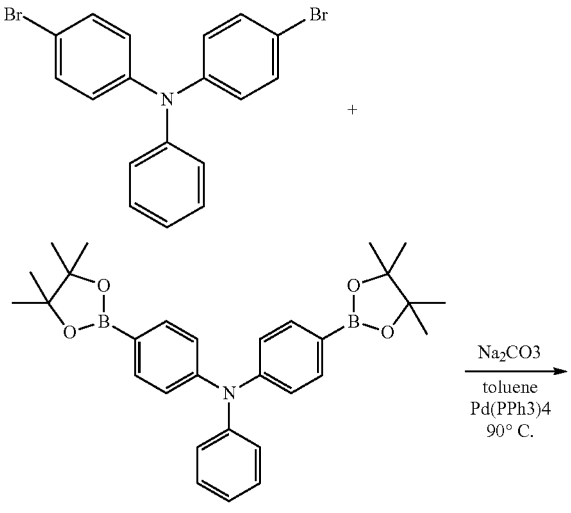

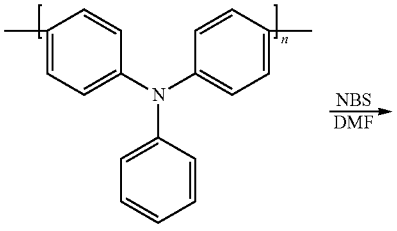

(2)

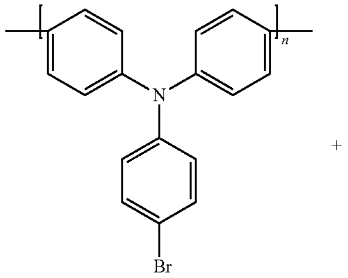

(3)

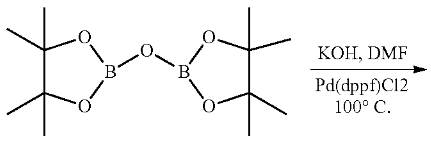

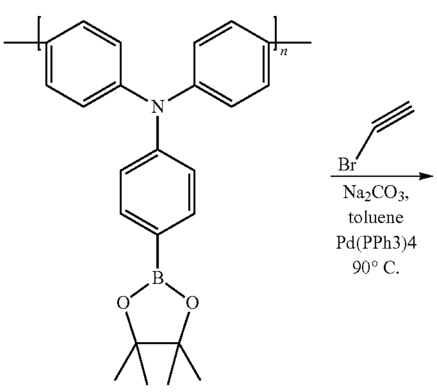

(4)

-continued

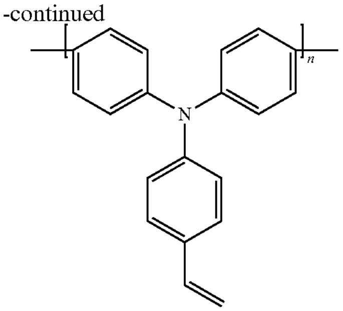

(5)

The manufacturing method of B1:

In Step 1), dibromotriphenylamine (1 mmol) and bis(pinacolato)diboron (1.05 mmol) were placed in a 250 ml three-neck flask, and 1.2 mmol potassium hydroxide, 100 ml N,N-dimethylformamide (DMF) and 0.1 g [1,1-bis(diphenylphosphino)ferrocene]dichloropalladium(II) were added therein. The mixture was heated to 100° C. and subjected to a reflux reaction for 12 hours under a protection of argon, and was poured into water to precipitate after the reaction was completed. After filtration, extraction was performed by using dichloromethane and water. After the extraction for three times, filtration was performed by using column chromatography to obtain the product (1).

In Step 2), dibromotriphenylamine (1 mmol) and the product (1) (1.05 mmol) were placed in a 250 ml three-neck flask, and sodium carbonate (1.05 mmol), 0.1 g tetrakis(triphenylphosphine)palladium and 100 ml toluene were added therein. The mixture reacted at 90° C. for 12 hours under the protection of argon, and was poured into water to precipitate after the reaction was completed. After filtration, extraction was performed by using dichloromethane and water. After the extraction for three times, filtration was performed by using the column chromatography to obtain the product (2).

In Step 3), the product (2) (1 mmol) and N-bromosuccinimide (NBS, 1.2 mmol) were placed in a three-neck flask, and 100 ml N,N-dimethylformamide was added therein. The mixture reacted at room temperature for 24 hours, and then was poured into water to precipitate. Excess NBS was removed by using a Soxhlet extractor and toluene, and the product (3) was obtained through polymer column chromatography.

In Step 4), the product (3) (1 mmol) and bis(pinacolato)diboron (1.1 mmol) were placed in a 250 ml three-neck flask, and 1.2 mmol potassium hydroxide, 100 ml N,N-dimethylformamide (DMF) and 0.1 g [1,1'-bis(diphenylphosphino)ferrocene]dichloropalladium(II) were added therein. The mixture was heated to 100° C. and subjected to a reflux reaction for 12 hours under the protection of argon, and was poured into water to precipitate after the reaction was completed. Excess bis(pinacolato)diboron was removed by using a Soxhlet extractor and toluene, and the product (4) was obtained through the polymer column chromatography.

In Step 5), the product (4) (1 mmol) and vinyl bromide (1.1 mmol) were placed in a 250 ml three-neck flask, and sodium carbonate (1.05 mmol), 0.1 g tetrakis(triphenylphosphine)palladium and 100 ml toluene were added therein. The mixture reacted at 90° C. for 12 hours under the protection of argon, and was poured into water to precipitate after the reaction was completed. Excess vinyl bromide was removed by using a Soxhlet extractor and toluene, and the product (5) was obtained through the polymer column chromatography.

2. A reaction equation and a manufacturing method of B2 are as follows.

The reaction equation of B2:

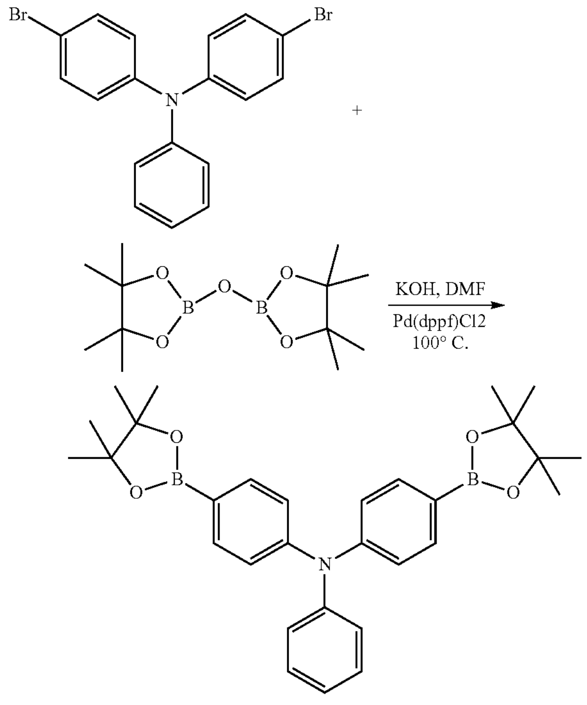

(1)

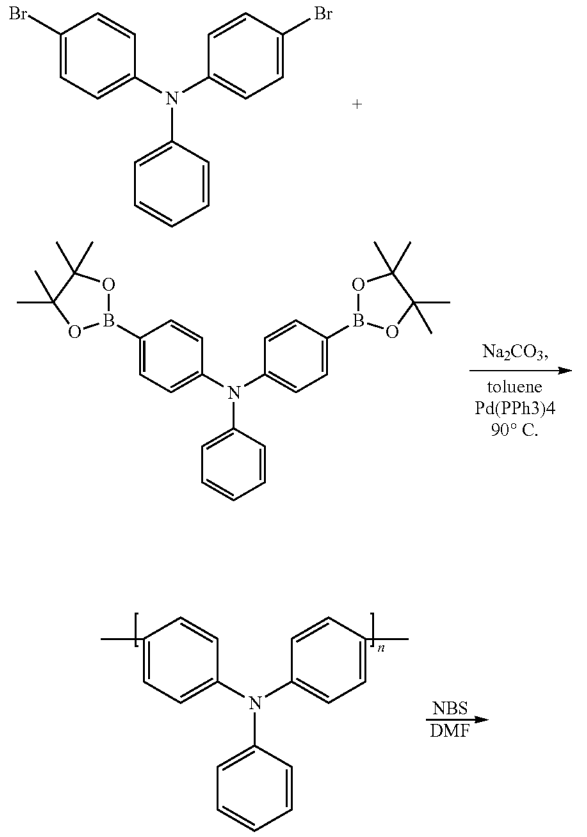

(2)

-continued

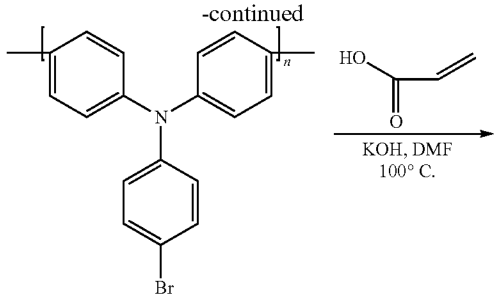

(3)

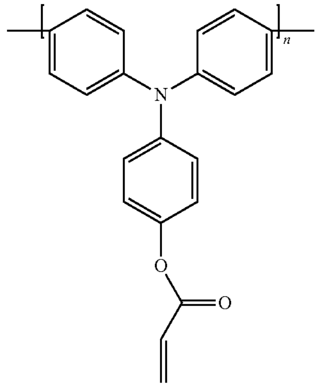

(4)

The manufacturing method of B2:

In Step 1), dibromotriphenylamine (1 mmol) and bis (pinacolato)diboron (1.05 mmol) were placed in a 250 ml three-neck flask, and 1.2 mmol potassium hydroxide, 100 ml N,N-dimethylformamide (DMF) and 0.1 g [1,1'-bis(diphenylphosphino)ferrocene]dichloropalladium(II) were added therein. The mixture was heated to 100° C. and subjected to a reflux reaction for 12 hours under the protection of argon, and was poured into water to precipitate after the reaction was completed. After filtration, extraction was performed by using dichloromethane and water. After the extraction for three times, filtration was performed by using the column chromatography to obtain the product (1).

In Step 2), dibromotriphenylamine (1 mmol) and the product (1) (1.05 mmol) were placed in a 250 ml three-neck flask, and sodium carbonate (1.05 mmol), 0.1 g tetrakis (triphenylphosphine)palladium and 100 ml toluene were added therein. The mixture reacted at 90° C. for 12 hours under the protection of argon, and was poured into water to precipitate after the reaction was completed. After filtration, extraction was performed by using dichloromethane and water. After the extraction for three times, filtration was performed by using the column chromatography to obtain the product (2).

In Step 3), the product (2) (1 mmol) and N-bromosuccinimide (NBS, 1.2 mmol) were placed in a three-neck flask, and 100 ml N,N-dimethylformamide was added therein. The mixture reacted at room temperature for 24 hours, and then was poured into water to precipitate. Excess NBS was removed by using a Soxhlet extractor and toluene, and the product (3) was obtained through the polymer column chromatography.

In Step 4), the product (3) (1 mmol) and acrylic acid (1.1 mmol) were placed in a 250 ml three-neck flask, and 1.2 mmol potassium hydroxide and 100 ml N,N-dimethylformamide (DMF) were added therein. The mixture was heated to 100° C. and subjected to a reflux reaction for 12 hours under the protection of argon, and was poured into water to precipitate after the reaction was completed. Excess acrylic acid was removed by using a Soxhlet extractor and toluene, and the product (4) was obtained through the polymer column chromatography.

3. A reaction equation and a manufacturing method of C1 are as follows.

The reaction equation of C1:

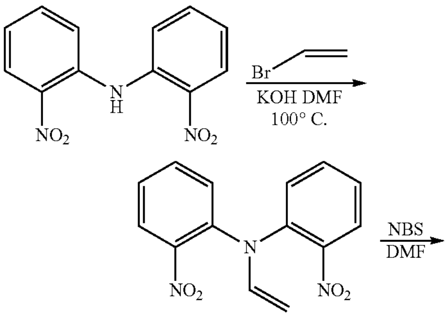

(1)

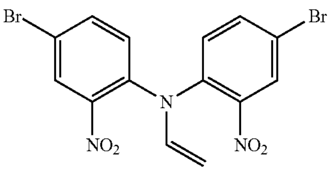

(2)

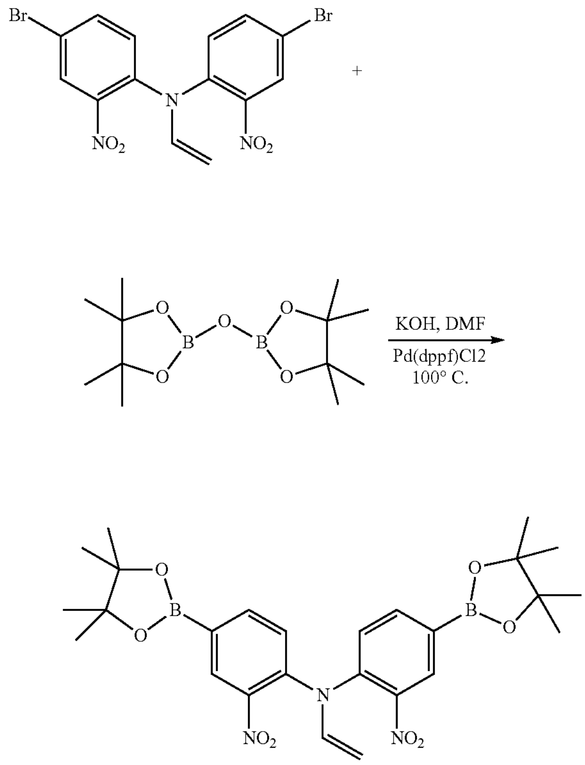

(3)

-continued

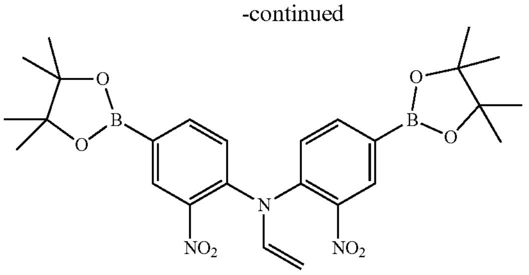

(3)

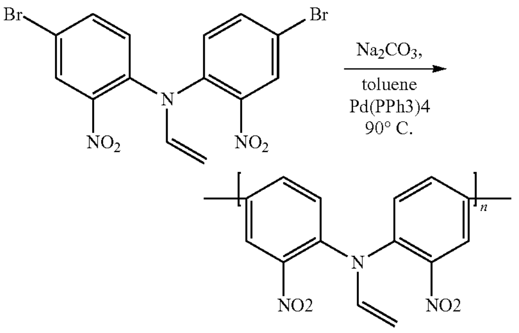

(4)

The manufacturing method of C1:

In Step 1), 2,2'-dinitrodiphenylamine (1 mmol) and vinyl bromide (1.1 mmol) were placed in a 250 ml three-neck flask, and 1.2 mmol potassium hydroxide and 100 ml N,N-dimethylformamide (DMF) were added therein. The mixture was heated to 100° C. and subjected to a reflux reaction for 12 hours under the protection of argon, and was poured into water to precipitate after the reaction was completed. After filtration, extraction was performed by using dichloromethane and water. After the extraction for three times, filtration was performed by using the column chromatography to obtain the product (1).

In Step 2), the product (1) (1 mmol) and N-bromosuccinimide (NBS, 1.2 mmol) were placed in a three-neck flask, and 100 ml N,N-dimethylformamide was added therein. The mixture reacted at room temperature for 24 hours, and then was poured into water to precipitate. After filtration, extraction was performed by using dichloromethane and water. After the extraction for three times, filtration was performed by using the column chromatography to obtain the product (2).

In Step 3), the product (2) (1 mmol) and bis(pinacolato) diboron (1.1 mmol) were placed in a 250 ml three-neck flask, and 1.2 mmol potassium hydroxide, 100 ml N,N-dimethylformamide (DMF) and 0.1 g [1,1-bis(diphenylphosphino)ferrocene]dichloropalladium(II) were added therein. The mixture was heated to 100° C. and subjected to a reflux reaction for 12 hours under the protection of argon, and was poured into water to precipitate after the reaction was completed. After filtration, extraction was performed by using dichloromethane and water. After the extraction for three times, filtration was performed by using the column chromatography to obtain the product (3).

In Step 4), the product (2) (1 mmol) and the product (3) (1.05 mmol) were placed in a 250 ml three-neck flask, and sodium carbonate (1.05 mmol), 0.1 g tetrakis(triphenylphosphine)palladium and 100 ml toluene were added therein. The mixture reacted at 90° C. for 12 hours under the protection of argon, and was poured into water to precipitate after the reaction was completed. After filtration, excess monomer reactants were removed by using a Soxhlet extractor and toluene, and the product (4) was obtained through the polymer column chromatography.

4. A reaction equation and a manufacturing method of C2 are as follows.

The reaction equation of C2:

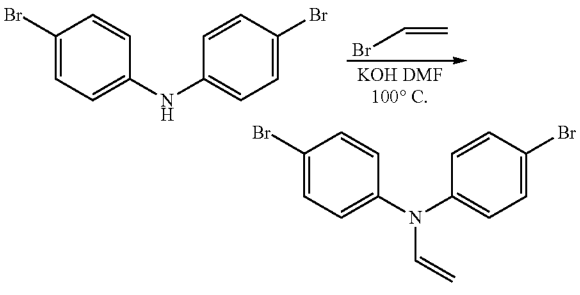

(1)

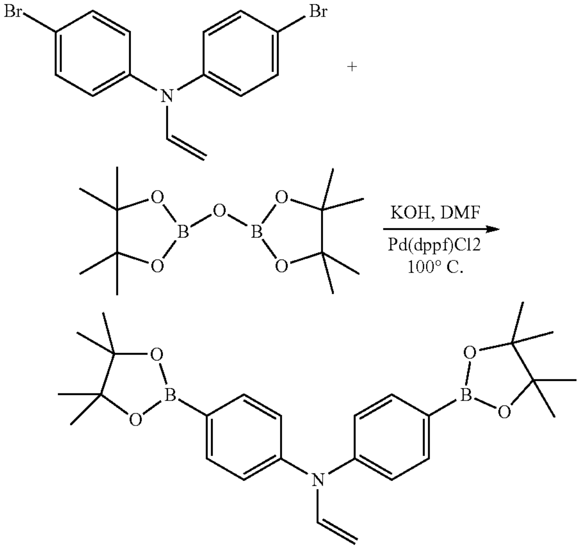

(2)

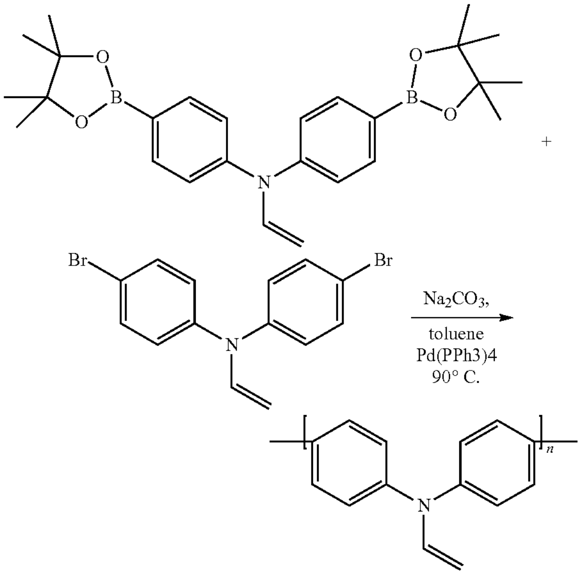

(3)

The manufacturing method of C2:

In Step 1), bis(4-bromophenyl)amine (1 mmol) and vinyl bromide (1.1 mmol) were placed in a 250 ml three-neck flask, and 1.2 mmol potassium hydroxide and 100 ml N,N-dimethylformamide (DMF) were added therein. The mixture was heated to 100° C. and subjected to a reflux reaction for 12 hours under the protection of argon, and was poured into water to precipitate after the reaction was completed. After filtration, extraction was performed by using dichloromethane and water. After the extraction for three times, filtration was performed by using the column chromatography to obtain the product (1).

In Step 2), the product (1) (1 mmol) and bis(pinacolato) diboron (1.1 mmol) were placed in a 250 ml three-neck flask, and 1.2 mmol potassium hydroxide, 100 ml N,N-dimethylformamide (DMF) and 0.1 g [1,1'-bis(diphenylphosphino)ferrocene]dichloropalladium(II) were added therein. The mixture was heated to 100° C. and subjected to a reflux reaction for 12 hours under the protection of argon, and was poured into water to precipitate after the reaction was completed. After filtration, extraction was performed by using dichloromethane and water. After the extraction for three times, filtration was performed by using the column chromatography to obtain the product (2).

In Step 3), the product (1) (1 mmol) and the product (2) (1.05 mmol) were placed in a 250 ml three-neck flask, and sodium carbonate (1.05 mmol), 0.1 g tetrakis(triphenylphosphine)palladium and 100 ml toluene were added therein. The mixture reacted at 90° C. for 12 hours under the protection of argon, and was poured into water to precipitate after the reaction was completed. After filtration, excess monomer reactants were removed by using a Soxhlet extractor and toluene, and the product (3) was obtained through the polymer column chromatography.

5. A reaction equation and a manufacturing method of D1 are as follows.

The reaction equation of D1:

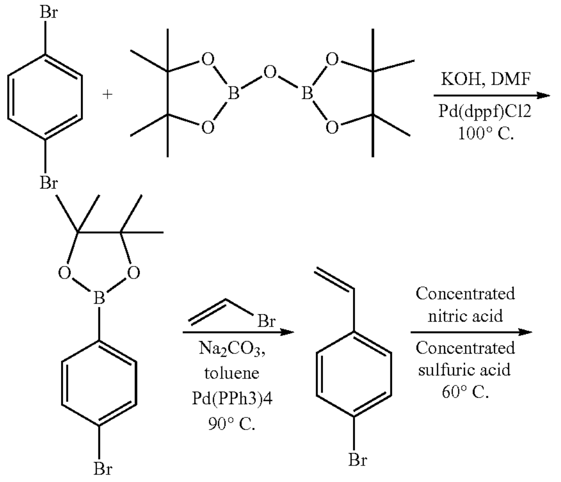

(1) (2)

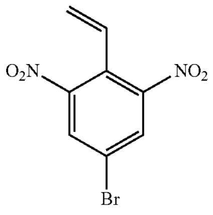

(3)

-continued

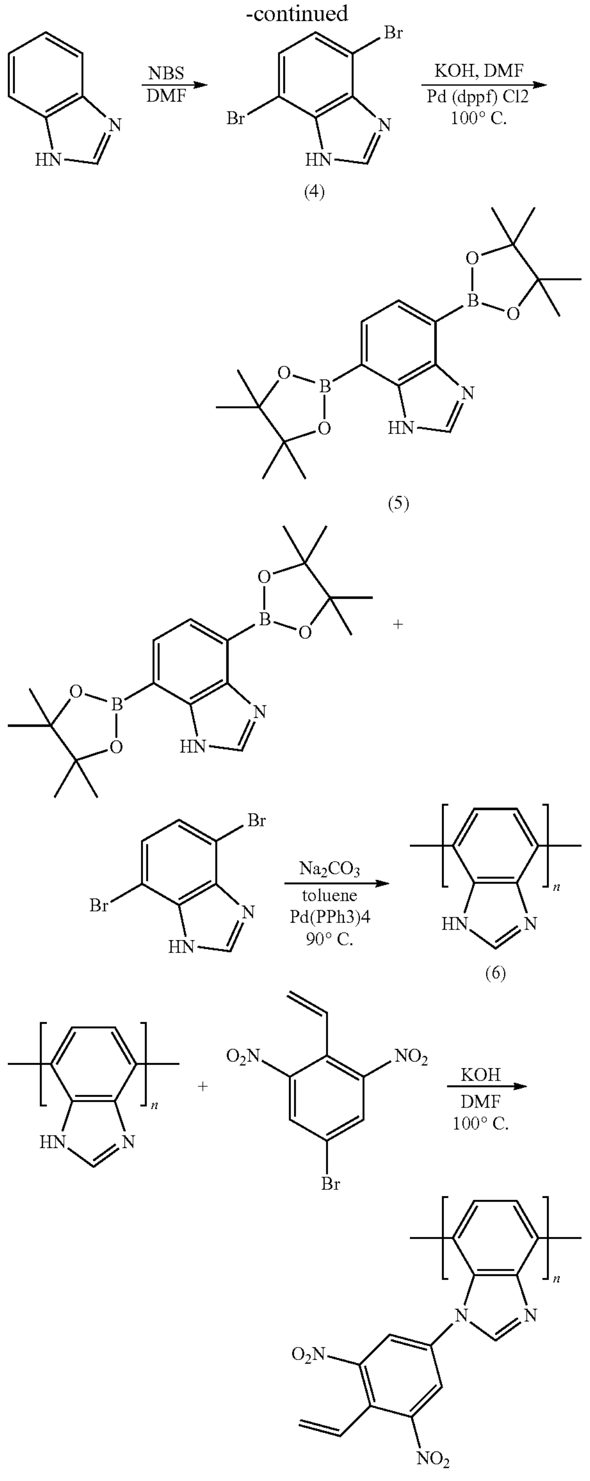

(4)

(5)

(6)

(7)

The manufacturing method of D1:

In Step 1), a product 1,4-dibromobenzene (1 mmol) and bis(pinacolato)diboron (1.1 mmol) were placed in a 250 ml three-neck flask, and 1.2 mmol potassium hydroxide, 100 ml N,N-dimethylformamide (DMF) and 0.1 g [1,1'-bis(diphenylphosphino)ferrocene]dichloropalladium(II) were added therein. The mixture was heated to 100° C. and subjected to a reflux reaction for 12 hours under the protection of argon, and was poured into water to precipitate after the reaction was completed. After filtration, extraction was performed by using dichloromethane and water. After the extraction for three times, filtration was performed by using the column chromatography to obtain the product (1).

In Step 2), the product (1) (1 mmol) and vinyl bromide (1.05 mmol) were placed in a 250 ml three-neck flask, and sodium carbonate (1.05 mmol), 0.1 g tetrakis(triphenylphosphine)palladium and 100 ml toluene were added therein. The mixture reacted at 90° C. for 12 hours under the protection of argon, and was poured into water to precipitate after the reaction was completed. After filtration, extraction was performed by using dichloromethane and water. After the extraction for three times, filtration was performed by using the column chromatography to obtain the product (2).

In Step 3), the product (2) (1 mmol) and concentrated nitric acid (4 mmol) were placed in a 250 ml three-neck flask, and concentrated sulfuric acid (2 mmol) was added therein. The mixture reacted at 60° C. for 12 hours under the protection of argon, and was poured into water to precipitate after the reaction was completed. After filtration, extraction was performed by using dichloromethane and water. After the extraction for three times, filtration was performed by using the column chromatography to obtain the product (3).

In Step 4), benzimidazole (1 mmol) and N-bromosuccinimide (NBS, 1.2 mmol) were placed in a three-neck flask, and 100 ml N,N-dimethylformamide was added therein. The mixture reacted at room temperature for 24 hours, and then was poured into water to precipitate. After filtration, extraction was performed by using dichloromethane and water. After the extraction for three times, filtration was performed by using the column chromatography to obtain the product (4).

In Step 5), the product (4) (1 mmol) and bis(pinacolato)diboron (1.1 mmol) were placed in a 250 ml three-neck flask, and 1.2 mmol potassium hydroxide, 100 ml N,N-dimethylformamide (DMF) and 0.1 g [1,1'-bis(diphenylphosphino)ferrocene]dichloropalladium(I) were added therein. The mixture was heated to 100° C. and subjected to a reflux reaction for 12 hours under the protection of argon, and was poured into water to precipitate after the reaction was completed. After filtration, extraction was performed by using dichloromethane and water. After the extraction for three times, filtration was performed by using the column chromatography to obtain the product (5).

In Step 6), the product (4) (1 mmol) and the product (5) (1.05 mmol) were placed in a 250 ml three-neck flask, and sodium carbonate (1.05 mmol), 0.1 g tetrakis(triphenylphosphine)palladium and 100 ml toluene were added therein. The mixture reacted at 90° C. for 12 hours under the protection of argon, and was poured into water to precipitate after the reaction was completed. After filtration, excess monomer reactants were removed by using a Soxhlet extractor and toluene, and the product (6) was obtained through the polymer column chromatography.

In Step 7), the product (6) (1 mmol) and the product (3) (1.1 mmol) were placed in a 250 ml three-neck flask, and 1.2 mmol potassium hydroxide and 100 ml N,N-dimethylformamide (DMF) were added therein. The mixture was heated to 100° C. and subjected to a reflux reaction for 12 hours under the protection of argon, and was poured into water to precipitate after the reaction was completed. Excess dinitro-4-bromostyrene, i.e., product (3), was removed by using a Soxhlet extractor and toluene, and the product (7) was obtained through the polymer column chromatography.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising a substrate; and a plurality of light-emitting devices disposed on the substrate; wherein the plurality of light-emitting devices include at least one first light-emitting device and at least one second light-emitting device; a first light-emitting device in the at least one first light-emitting device includes a first color light-emitting layer having a first thickness; a second light-emitting device in the at least one second light-emitting device includes a first color light-emitting layer having a second thickness, and a first material layer and a second color light-emitting layer that are sequentially stacked on the first color light-emitting layer included in the second light-emitting device in a direction away from the substrate;

wherein the second thickness is less than the first thickness; in the second light-emitting device, the first material layer is configured to transport holes transported from the first color light-emitting layer to the second color light-emitting layer, and to block electrons transported from the second color light-emitting layer; or the first material layer is configured to transport electrons transported from the first color light-emitting layer to the second color light-emitting layer, and to block holes transported from the second color light-emitting layer;

the first material layer is disposed only in a region where the second light-emitting device is located; and the second color light-emitting layer includes the first portion disposed in the region where the second light-emitting device is located and the second portion disposed in the region where the first light-emitting device is located; the second portion is located on and in contact with the first color light-emitting layer included in the first light-emitting device; the first portion has the third thickness, the second portion has the fourth thickness; the fourth thickness is less than the third thickness, and is less than the second thickness.

2. The light-emitting substrate according to claim 1, wherein in a case where the first material layer is configured to transport the electrons transported from the first color light-emitting layer to the second color light-emitting layer, and to block the holes transported from the second color light-emitting layer, the second light-emitting device further includes an electron transport layer disposed on a side, proximate to the substrate, of the first color light-emitting layer included in the second light-emitting device, and a material of the first material layer includes a material with an electron transport function; or the second light-emitting device further includes an electron transport layer disposed on a side, proximate to the substrate, of the first color light-emitting layer included in the second light-emitting device, a material of the first material layer includes a material with an electron transport function, and the material of the first material layer is different from a material of the electron transport layer;

or in a case where the first material layer is configured to transport the holes transported from the first color light-emitting layer to the second color light-emitting layer, and to block the electrons transported from the second color light-emitting layer, the second light-emitting device further includes a hole transport layer disposed on the side, proximate to the substrate, of the first color light-emitting layer included in the second light-emitting device, and the material of the first material layer includes a material with a hole transport function; or the second light-emitting device further includes a hole transport layer disposed on the side, proximate to the substrate, of the first color light-emitting layer included in the second light-emitting device, the material of the first material layer includes a material with a hole transport function, and the material of the first material layer is different from a material of the hole transport layer.

3. The light-emitting substrate according to claim 1, wherein a material of the first color light-emitting layer included in the first light-emitting device, a material of the first color light-emitting layer included in the second light-emitting device, and a material of the second color light-emitting layer each include a quantum dot light-emitting material.

4. The light-emitting substrate according to claim 1, wherein the plurality of light-emitting devices further include at least one third light-emitting device; wherein a third light-emitting device in the at least one third light-emitting device includes a first color light-emitting layer having a fifth thickness, and a second material layer and a third color light-emitting layer that are sequentially stacked on the first color light-emitting layer included in the third light-emitting device in the direction away from the substrate; wherein the fifth thickness is less than the first thickness; in the third light-emitting device, the second material layer is configured to transport holes transported from the first color light-emitting layer to the third color light-emitting layer, and to block electrons transported from the third color light-emitting layer; or the second material layer is configured to transport electrons transported from the first color light-emitting layer to the third color light-emitting layer, and to block holes transported from the third color light-emitting layer.

5. The light-emitting substrate according to claim 4, wherein the second material layer and the first material layer are connected into a continuous structure.

6. The light-emitting substrate according to claim 5, wherein the second color light-emitting layer includes a first portion disposed in a region where the second light-emitting device is located and a third portion disposed in a region where the third light-emitting device is located, and the third portion is located between the second material layer and the third color light-emitting layer;

or the second color light-emitting layer includes the first portion disposed in the region where the second light-emitting device is located and the third portion disposed in the region where the third light-emitting device is located, and the third portion is located between the second material layer and the third color light-emitting layer; and the third light-emitting device further includes a third material layer located between the third portion and the third color light-emitting layer; and the third material layer is configured to transport holes transported from the third portion to the third color light-emitting layer, and to block the electrons transported from the third color light-emitting layer; or the third material layer is configured to transport electrons transported from the third portion to the third color light-emitting layer, and to block the holes transported from the third color light-emitting layer.

7. The light-emitting substrate according to claim 4, wherein a material of the third color light-emitting layer includes a quantum dot light-emitting material.

8. The light-emitting substrate according to claim 4, wherein the third color light-emitting layer includes a fourth portion disposed in the region where the third light-emitting device is located, a fifth portion disposed in a region where the first light-emitting device is located and a sixth portion disposed in a region where the second light-emitting device is located; the fourth portion has a sixth thickness, the fifth portion and the sixth portion each have a seventh thickness, and the seventh thickness is less than the sixth thickness; wherein the second color light-emitting layer includes a first portion disposed in a region where the second light-emitting device is located and a second portion disposed in a region where the first light-emitting device is located, and the second portion is located on and in contact with the first color light-emitting layer included in the first light-emitting device; the fifth portion is located on and in contact with the second portion, and the sixth portion is located on and in contact with the first portion.

9. The light-emitting substrate according to claim 4, wherein a material of the second material layer is different from a material of the first material layer;

or a material of the second material layer is different from a material of the first material layer; and a material of the third color light-emitting layer includes a quantum dot light-emitting material.

10. The light-emitting substrate according to claim 4, wherein the third color light-emitting layer is disposed only in a region where the third light-emitting device is located;

or the third color light-emitting layer includes a fourth portion disposed in the region where the third light-emitting device is located, a fifth portion disposed in a region where the first light-emitting device is located and a sixth portion disposed in a region where the second light-emitting device is located; the fourth portion has a sixth thickness, the fifth portion and the sixth portion each have a seventh thickness, and the seventh thickness is less than the sixth thickness; wherein the second color light-emitting layer is disposed only in a region where the second light-emitting device is located; the fifth portion is located on and in contact with the first color light-emitting layer included in the first light-emitting device, and the sixth portion is located on and in contact with the second color light-emitting layer.

11. A light-emitting apparatus, comprising the light-emitting substrate according to claim 1.

12. A manufacturing method of a light-emitting substrate, comprising:

forming a plurality of light-emitting devices on a substrate, the plurality of light-emitting devices including at least one first light-emitting device and at least one second light-emitting device; wherein a first light-emitting device in the at least one first light-emitting device includes a first color light-emitting layer with a first thickness; and a second light-emitting device in the at least one second light-emitting device includes a first color light-emitting layer with a second thickness, and a first material layer and a second color light-emitting layer that are sequentially stacked on the first color light-emitting layer included in the second light-emitting device in a direction away from the substrate;

wherein the second thickness is less than the first thickness; in the second light-emitting device, the first material layer is configured to transport holes transported from the first color light-emitting layer to the second color light-emitting layer, and to block electrons transported from the second color light-emitting layer; or the first material layer is configured to transport electrons transported from the first color light-emitting layer to the second color light-emitting layer, and to block holes transported from the second color light-emitting layer; and the first material layer is disposed only in a region where the second light-emitting device is located;

wherein forming the plurality of light-emitting devices on the substrate includes: forming the second color light-emitting layer; wherein forming the second color light-emitting layer includes:

forming a third film on the substrate on which the first material layer is formed, the third film including a second quantum dot light-emitting material;

performing electromagnetic radiation on a portion of the third film located in a region where the second light-emitting device is located, so as to change a solubility of the portion of the third film located in the region where the second light-emitting device is located; and dissolving a portion of the third film located outside the region where the second light-emitting device is located, so that the third film forms a second portion with a thickness of less than 5 nm in the region outside the region where the second light-emitting device is located, so as to obtain the second color light-emitting layer with a third thickness included in the second light-emitting device and the second color light-emitting layer with a fourth thickness included in the first light-emitting device;

wherein the fourth thickness is less than the third thickness, and is less than the second thickness.

13. The manufacturing method of the light-emitting substrate according to claim 12, wherein forming the plurality of light-emitting devices on the substrate includes: forming the first material layer; wherein forming the first material layer includes:

forming a first film on the substrate on which the first color light-emitting layers respectively included in the first light-emitting device and the second light-emitting device are formed; and patterning the first film to form the first material layer in a region where the second light-emitting device is located;

or forming the first material layer includes:

forming the first film on the substrate on which the first color light-emitting layers are formed;

performing electromagnetic radiation on a portion of the first film located in the region where the second light-emitting device is located, so as to change a solubility of the portion of the first film located in the region where the second light-emitting device is located; and dissolving a portion of the first film located outside the region where the second light-emitting device is located, so as to remove the portion of the first film located outside the region where the second light-emitting device is located;

wherein the first film is made of an electron transport material; a general structural formula of the electron transport material is shown in following Formula (I):

(I)

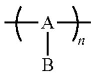

wherein A is selected from any one of trivalent substituted or unsubstituted electron-withdrawing groups, B is selected from groups capable of changing solubility under electromagnetic radiation, and n is an integer greater than or equal to 1; in A, a substituted substituent is selected from any one of a nitro group, a hydroxyl group and an alkyl group; or the first film is made of a hole transport material; a general structural formula of the hole transport material is shown in following Formula (II):

(II)

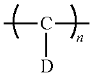

wherein C is selected from any one of trivalent substituted or unsubstituted electron-donating groups, D is selected from groups capable of changing solubility under the electromagnetic radiation, and n is an integer greater than or equal to 1; in C, a substituted substituent is selected from any one of a nitro group, a hydroxy group and an alkyl group.

14. The manufacturing method of the light-emitting substrate according to claim 12, wherein forming the plurality of light-emitting devices on the substrate includes: forming the first color light-emitting layers respectively included in the first light-emitting device and the second light-emitting device; wherein forming the first color light-emitting layers includes:

forming a second film on the substrate, the second film including a first quantum dot light-emitting material;

performing electromagnetic radiation on a portion of the second film located in a region where the first light-emitting device is located, so as to change a solubility of the portion of the second film located in the region where the first light-emitting device is located; and dissolving a portion of the second film located outside the region where the first light-emitting device is located, so as to obtain the first color light-emitting layer with the first thickness included in the first light-emitting device and the first color light-emitting layer with the second thickness included in the second light-emitting device.

15. The manufacturing method of the light-emitting substrate according to claim 12, wherein the plurality of light-emitting devices further include at least one third light-emitting device; a third light-emitting device in the at least one third light-emitting device includes a first color light-emitting layer with a fifth thickness, and a second material layer and a third color light-emitting layer that are sequentially staked on the first color light-emitting layer included in the third light-emitting device in the direction away from the substrate; forming the plurality of light-emitting devices on the substrate includes:

sequentially forming the second material layer and the third color light-emitting layer on the substrate.

16. The manufacturing method of the light-emitting substrate according to claim 15, wherein a material of the second material layer is different from a material of the first material layer; wherein forming the second material layer on the substrate includes:

forming a fourth film on the substrate on which the second color light-emitting layer is formed; and patterning the fourth film to form the second material layer in a region where the third light-emitting device is located;

or forming the second material layer on the substrate includes:

forming the fourth film on the substrate on which the second color light-emitting layer is formed;

performing electromagnetic radiation on a portion of the fourth film located in the region where the third light-emitting device is located, so as to change a solubility of the portion of the fourth film located in the region where the third light-emitting device is located; and dissolving a portion of the fourth film located outside the region where the third light-emitting device is located, so as to remove the portion of the fourth film located outside the region where the third light-emitting device is located.

17. The manufacturing method of the light-emitting substrate according to claim 15, wherein the second material layer and the first material layer are connected into a continuous structure, forming the second material layer on the substrate includes:

forming a first film on the substrate on which the first color light-emitting layers respectively included in the first light-emitting device, the second light-emitting device and the third light-emitting device are formed;

performing electromagnetic radiation on a portion of the first film located in a region where the third light-emitting device is located while performing the electromagnetic radiation on a portion of the first film located in a region where the second light-emitting device is located, so as to change a solubility of the portion of the first film located in the region where the third light-emitting device is located;

and/or forming the third color light-emitting layer on the substrate includes:

forming a fifth film on the substrate on which the second material layer is formed, the fifth film including a third quantum dot light-emitting material;

performing electromagnetic radiation on a portion of the fifth film located in a region where the third light-emitting device is located, so as to change a solubility of the portion of the fifth film located in the region where the third light-emitting device is located; and dissolving a portion of the fifth film located outside the region where the third light-emitting device is located, so that the fifth film is non-overlapping with a region outside the region where the third light-emitting device is located, or the fifth film forms a fifth portion and a sixth portion with a thickness of less than 5 nm in the region outside the region where the third light-emitting device is located.

18. The manufacturing method of the light-emitting substrate according to claim 15, wherein the second color light-emitting layer includes a third portion formed in a region where the third light-emitting device is located, and the third portion is located between the second material layer and the third color light-emitting layer; the third light-emitting device further includes a third material layer disposed between the third portion and the third color light-emitting layer; forming the plurality of light-emitting devices on the substrate includes:

forming the third material layer before the third color light-emitting layer is formed;

wherein forming the third material layer includes:

forming a sixth film on the substrate on which the second color light-emitting layer is formed; and patterning the sixth film to form the third material layer in the region where the third light-emitting device is located;

or forming the third material layer includes:

forming the sixth film on the substrate on which the second color light-emitting layer is formed;

performing electromagnetic radiation on a portion of the sixth film located in the region where the third light-emitting device is located, so as to change a solubility of the portion of the sixth film located in the region where the third light-emitting device is located; and dissolving a portion of the sixth film located outside the region where the third light-emitting device is located, so as to remove the portion of the sixth film located outside the region where the third light-emitting device is located.

* * * * *